(12) United States Patent
Yoshikawa

(10) Patent No.: US 8,148,645 B2
(45) Date of Patent: Apr. 3, 2012

(54) WIRING SUBSTRATE AND METHOD OF MANUFACTURING THE SAME

(75) Inventor: Kazuhiro Yoshikawa, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 902 days.

(21) Appl. No.: 12/189,852

(22) Filed: Aug. 12, 2008

(65) Prior Publication Data
US 2009/0266594 A1    Oct. 29, 2009

Related U.S. Application Data

(60) Provisional application No. 60/980,969, filed on Oct. 18, 2007.

(51) Int. Cl.
 *H05K 1/16* (2006.01)
 *H05K 7/06* (2006.01)
(52) U.S. Cl. ......................................... 174/260; 361/763
(58) Field of Classification Search ................... None
See application file for complete search history.

(56) References Cited

U.S. PATENT DOCUMENTS

| | | | |
|---|---|---|---|
| 4,555,746 A | 11/1985 | Mochizuki et al. | |
| 6,979,890 B2 * | 12/2005 | Kambe et al. | 257/678 |
| 7,002,075 B2 * | 2/2006 | Kambe et al. | 174/565 |
| 7,405,366 B2 | 7/2008 | Shioga et al. | |
| 7,704,548 B2 * | 4/2010 | Kawabe et al. | 427/96.1 |
| 2005/0142852 A1 | 6/2005 | Asami et al. | |
| 2007/0121273 A1 | 5/2007 | Yamamoto et al. | |

FOREIGN PATENT DOCUMENTS

| | | |
|---|---|---|
| JP | 59-127829 | 7/1984 |
| JP | 2001-297944 | 10/2001 |
| JP | 2004-228190 | 8/2004 |
| JP | 2005-191559 | 7/2005 |
| JP | 2006-173494 | 6/2006 |
| JP | 2006-216767 | 8/2006 |
| JP | 2007-096232 | 4/2007 |
| JP | 2007-150123 | 6/2007 |
| WO | WO 02/101769 A1 | 12/2002 |

* cited by examiner

*Primary Examiner* — Gregory Thompson
(74) *Attorney, Agent, or Firm* — Oblon, Spivak, McClelland, Maier & Neustadt, L.L.P.

(57) ABSTRACT

A wiring substrate and method of forming a wiring substrate. The wiring substrate includes a base substrate, a first resin insulating layer provided on the base substrate and a laminated capacitor formed within the first resin insulating layer. The laminated capacitor includes a plurality of capacitors laminated to each other by adhesive, each capacitor including a first electrode, a second electrode opposing the first electrode and a dielectric layer interposed between the first and second electrodes. A first via conductor electrically connects the first electrodes of the plurality of capacitors to each other, and a second via conductor electrically connects the second electrodes of the plurality of capacitors to each other. A first external terminal electrically connects to the first via conductor, and a second external terminal electrically connects to the second via conductor.

18 Claims, 45 Drawing Sheets

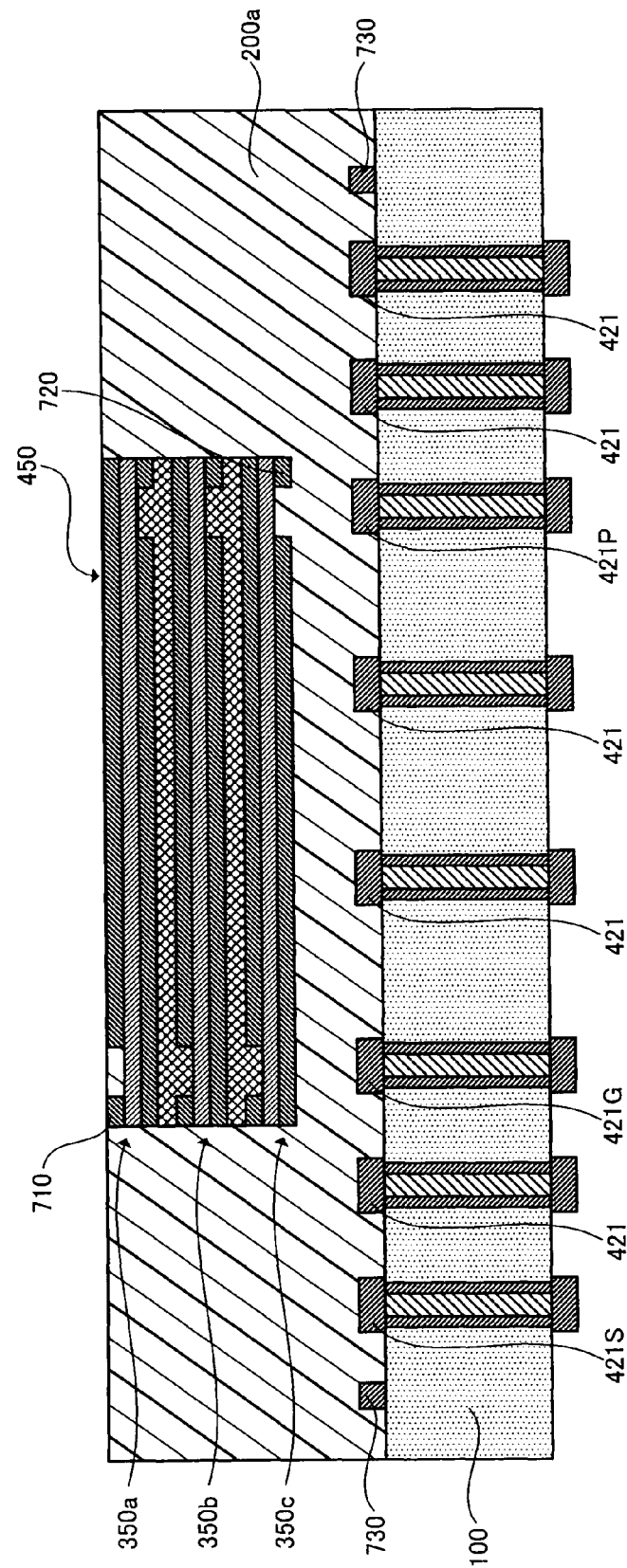

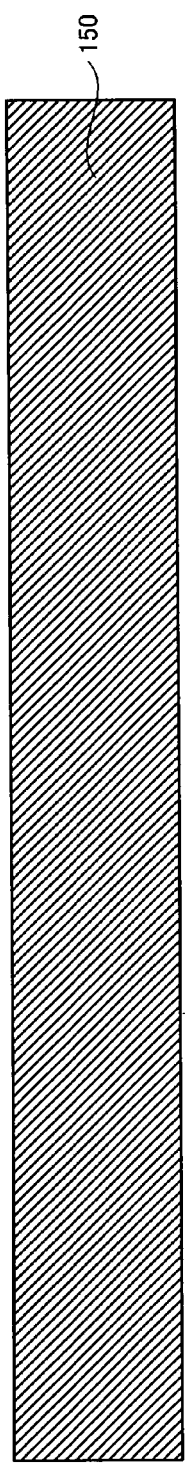
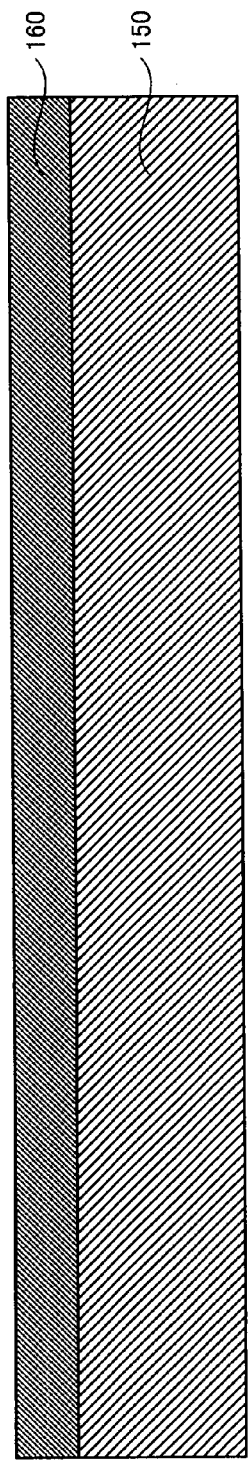
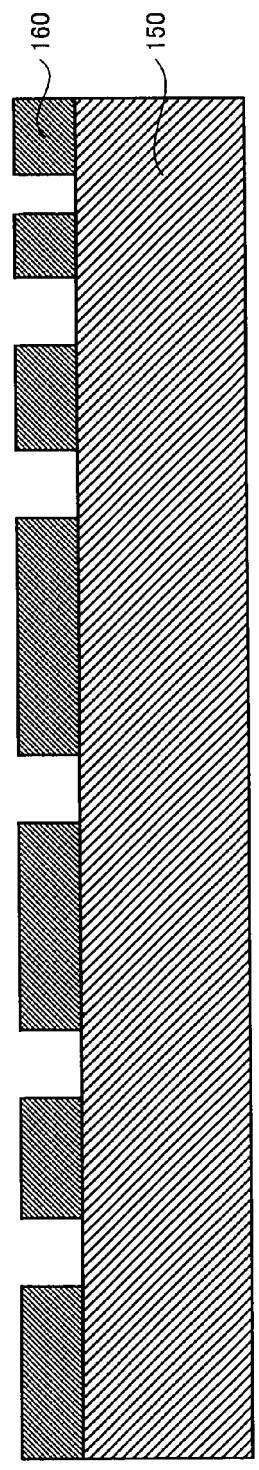
FIG. 9A
FIG. 9B
FIG. 9C

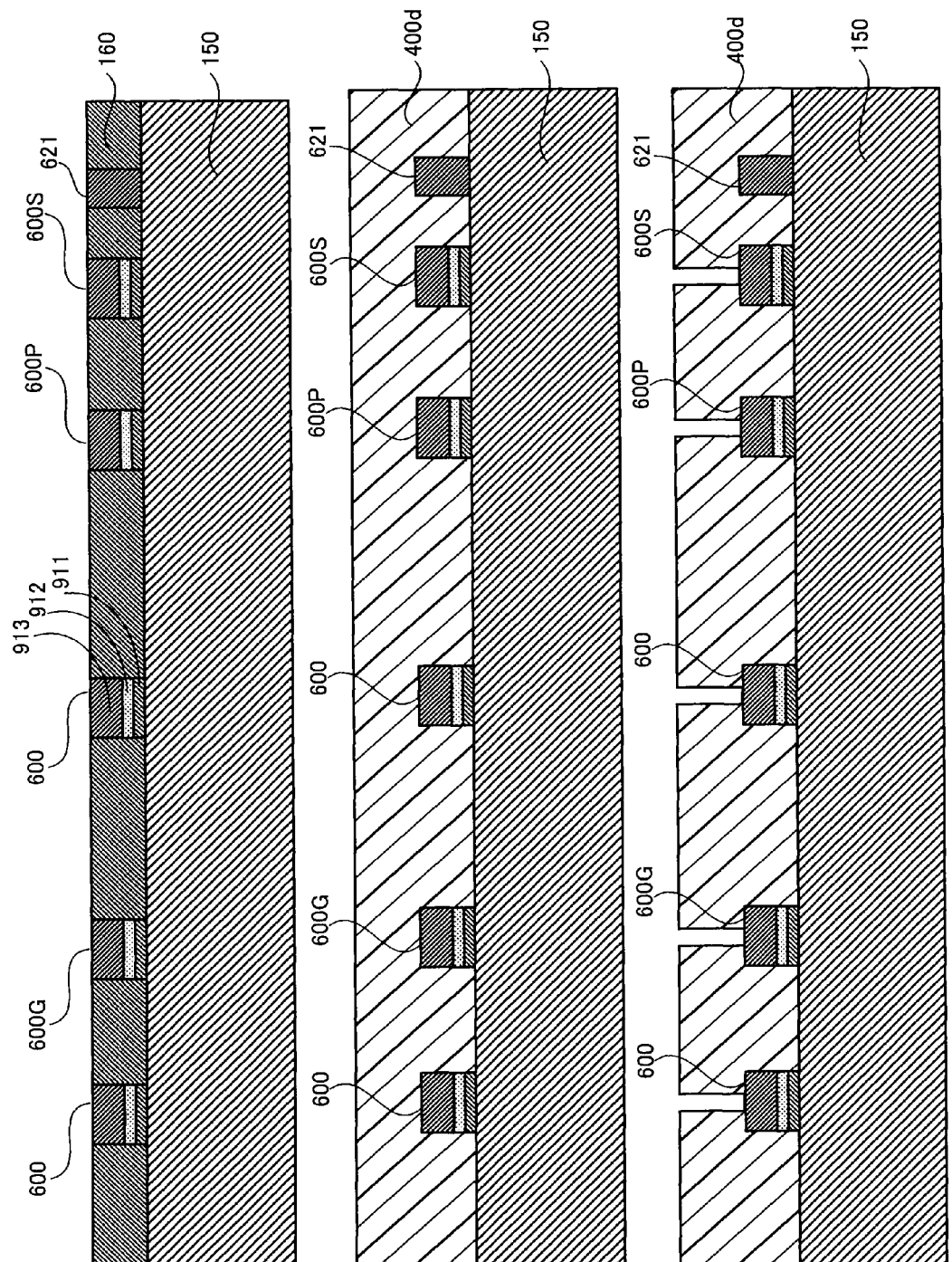

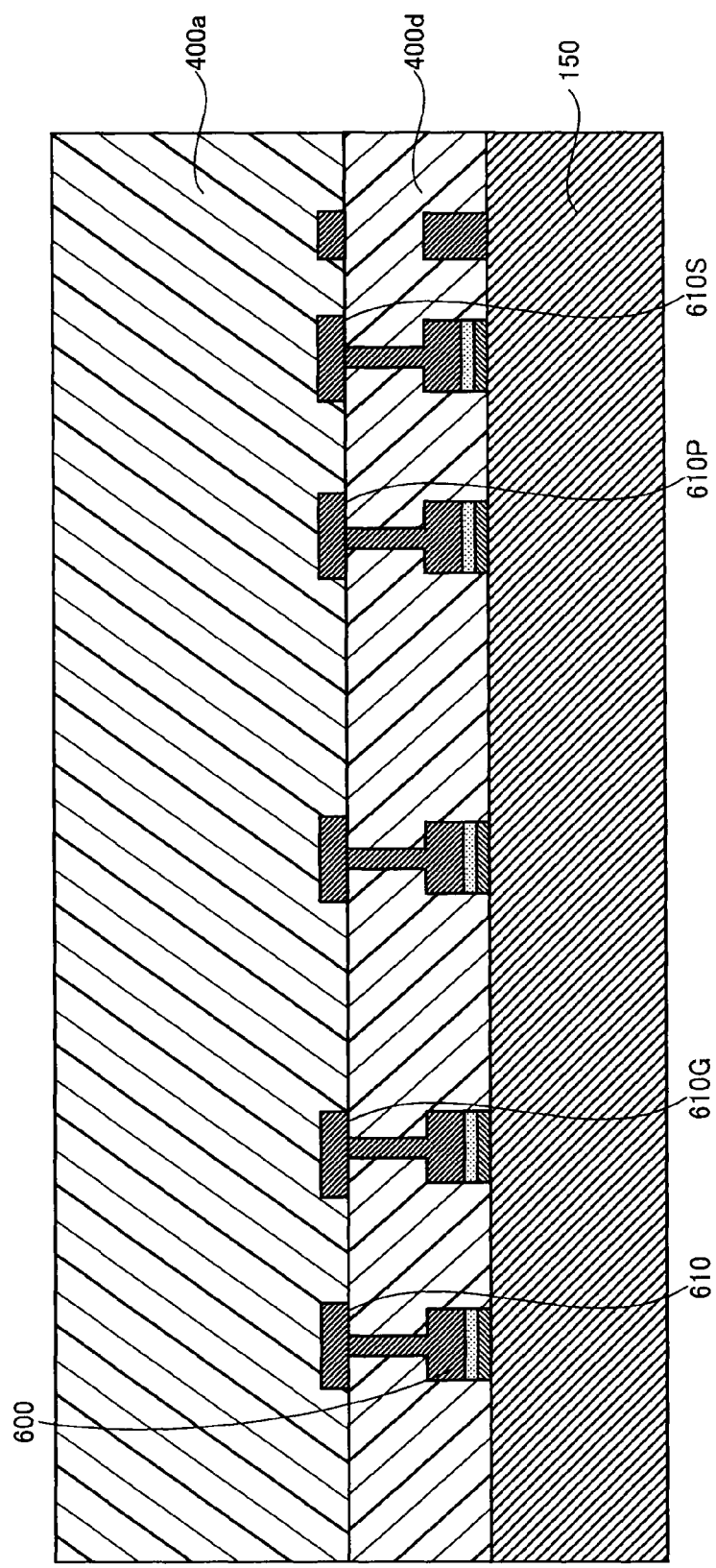

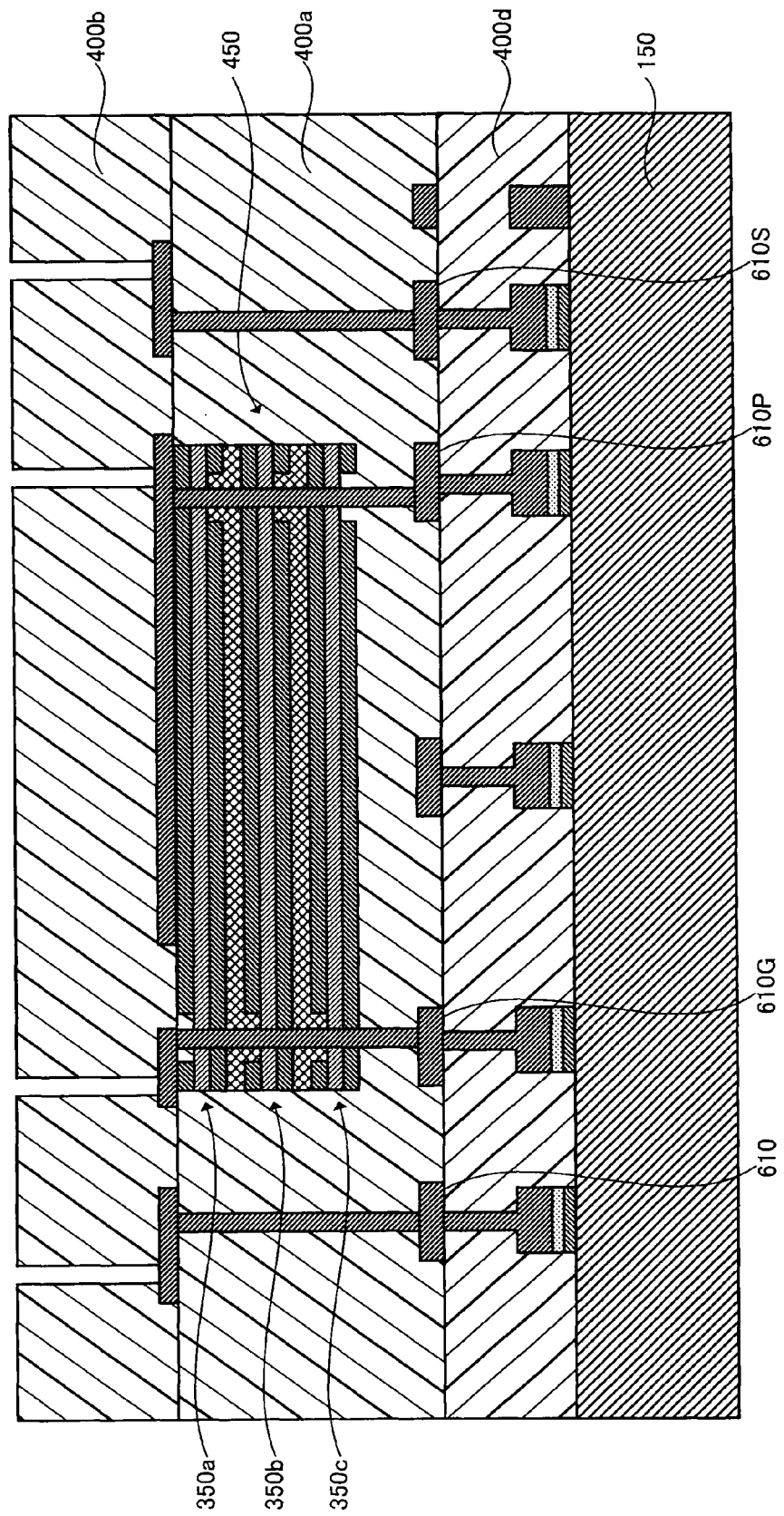

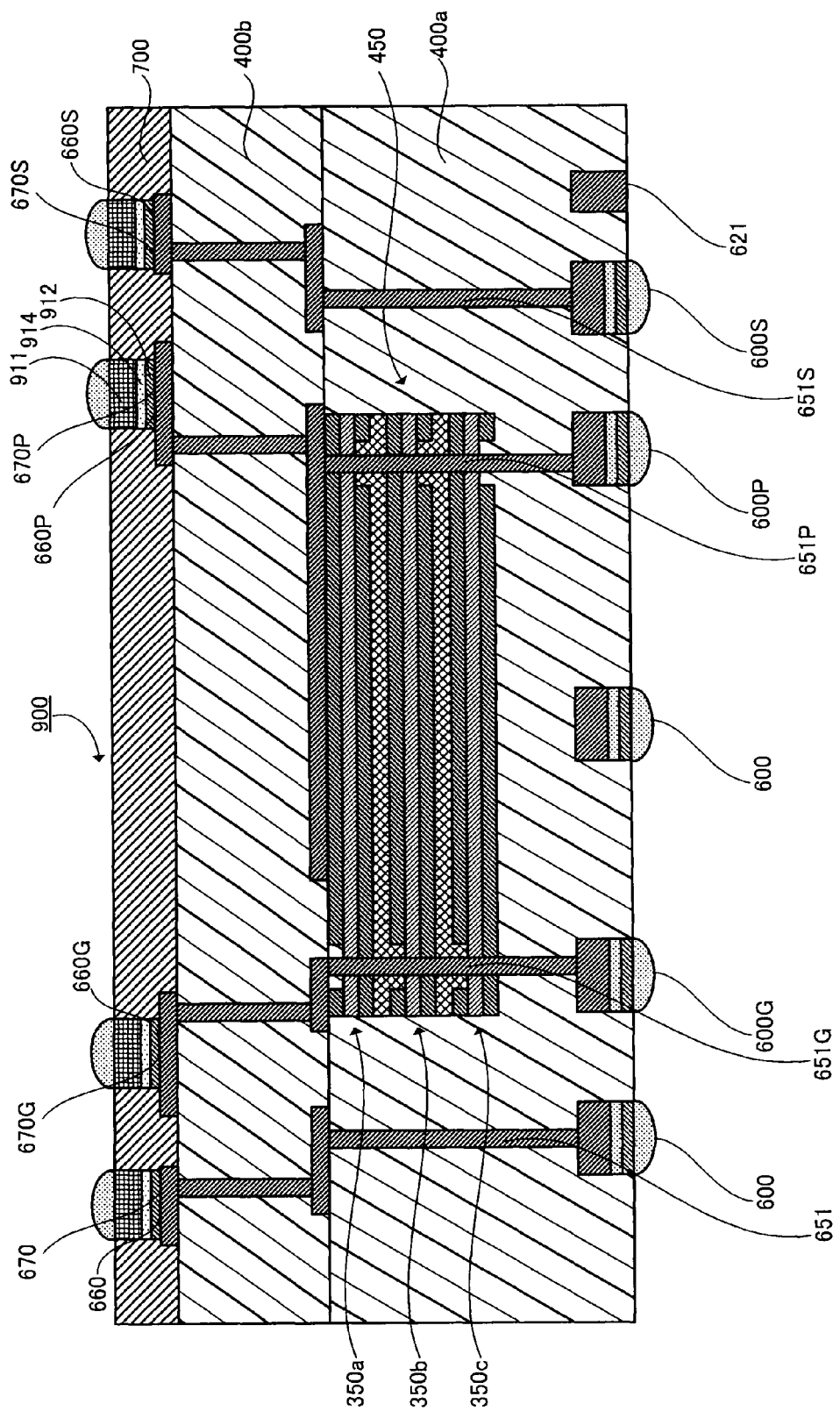

WIRING SUBSTRATE AND METHOD OF MANUFACTURING THE SAME

CROSS REFERENCE TO RELATED APPLICATIONS

This application claims the benefit of Provisional Application Ser. No. 60/980,969 filed Oct. 18, 2007, the entire content of this application is incorporated herein by reference.

TECHNICAL FIELD

The present invention relates to a wiring substrate with a built-in capacitor, and a method of manufacturing such a wiring substrate.

DESCRIPTION OF THE RELATED ART

Japanese Laid-Open Patent Publication No. 2005-191559 discloses a wiring substrate having a built-in capacitor with enhanced mounting efficiency. Japanese Laid-Open Patent Publication No. 2004-228190 discloses a wiring substrate with a plurality of built in capacitors formed such that dielectric layers and electrodes of the capacitors are alternately laminated. The wiring substrate disclosed in this publication is such that the thickness of the dielectric layers is set to a thickness necessary to obtain the insulation resistance of the capacitor, and the overall capacitance is made large by use of a plurality of capacitors. The entire content of each of 2005-191559 and 2004-228190 is incorporated herein by reference.

SUMMARY OF THE INVENTION

One aspect of the invention includes a wiring substrate having a base substrate, a first resin insulating layer provided on the base substrate and a laminated capacitor formed within the first resin insulating layer. The laminated capacitor includes a plurality of capacitors laminated to each other by adhesive, each capacitor including a first electrode, a second electrode opposing the first electrode and a dielectric layer interposed between the first and second electrodes. A first via conductor electrically connects the first electrodes of the plurality of capacitors to each other, and a second via conductor electrically connects the second electrodes of the plurality of capacitors to each other. A first external terminal electrically connects to the first via conductor, and a second external terminal electrically connects to the second via conductor.

Another aspect of the invention includes a wiring substrate having a plurality of resin insulating layers including at least a first end resin insulating layer and a second end resin insulating layer, and a plurality of conductor circuits interposed between the end resin insulating layers. A laminated capacitor is embedded in one of the resin insulating layers, the laminated capacitor including a plurality of capacitors laminated to each other by adhesive, each capacitor including a first electrode, a second electrode opposing the first electrode and a dielectric layer interposed between the first and second electrodes. A first via conductor electrically connects the first electrodes of the plurality of capacitors to each other, and a second via conductor electrically connects the second electrodes of the plurality of capacitors to each other. A plurality of first external connection terminals are formed on the first end resin insulating layer and include a first external terminal electrically connected to the first via conductor and a second external terminal electrically connected to the second via conductor, and a plurality of second external connection terminals are formed in the second end resin insulating layer and include a third external terminal electrically connected to the first via conductor and a fourth external terminal electrically connected to the second via conductor. The first external connection terminals are formed on the first end resin insulating layer and have external terminal faces positioned on nearly the same plane as a face of the first end resin insulating layer, and the second external connection terminals are embedded in the second end resin insulating layer.

Another aspect of the invention includes a method of manufacturing a wiring substrate, including forming a plurality of capacitors each comprising a first electrode, a second electrode opposing the first electrode and a dielectric layer interposed between the first and second electrodes. A laminated capacitor is formed by laminating the plurality of capacitors to each other with adhesive. A first resin insulating layer is laminated on a base substrate and the laminated capacitor is embedded in the first resin insulating layer. Also included is forming a first through hole penetrating the first electrodes of the plurality of capacitors, forming a second through hole penetrating the second electrodes of the plurality of capacitors, forming a first via conductor electrically connecting the first electrodes of the plurality of capacitors by filling the first through hole with metal and forming a second via conductor electronically connecting the second electrodes of the plurality of capacitors by filling the second through hole with metal. A first external terminal is formed electrically connected to the first via conductor, and a second external terminal is formed electrically connected to the second via conductor.

Still another aspect of the invention includes a method of manufacturing a wiring substrate. The method includes forming a plurality of capacitors each having a first electrode, a second electrode opposing the first electrode and a dielectric layer interposed between the first and second electrodes, and forming a laminated capacitor by laminating the plurality of the capacitors with adhesive. A plurality of first external connection terminals are formed on a support board, the first external connection terminals including a first external terminal and a second external terminal. Alternately laminated on the first external connection terminals and on the support board are a plurality of resin insulating layers and a plurality of conductor circuits, and the laminated capacitor is embedded in one of the plurality of resin insulating layers. A first through hole is formed penetrating the first electrodes of the plurality of capacitors, a second through hole is formed penetrating the second electrodes of the plurality of capacitors. A first via conductor is formed electrically connecting the first electrodes by filling the first through hole with metal, and a second via conductor is formed electrically connecting the second electrodes by filling the second through hole with metal. A plurality of second external connection terminals including a third external terminal and a fourth external terminal are formed on a first end resin insulting layer of the plurality of resin insulating layers and positioned on an opposite side from the support board. The support board is removed, and the first external terminal and the third external terminal are electrically connected to the first via conductor, and the second external terminal and the fourth external terminal are electrically connected to the second via conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2G is a view describing a step of manufacturing a wiring substrate pertaining to the embodiment of FIG. 1, illustrating the resin insulating layer in which a laminated capacitor is embedded.

Figure 5:
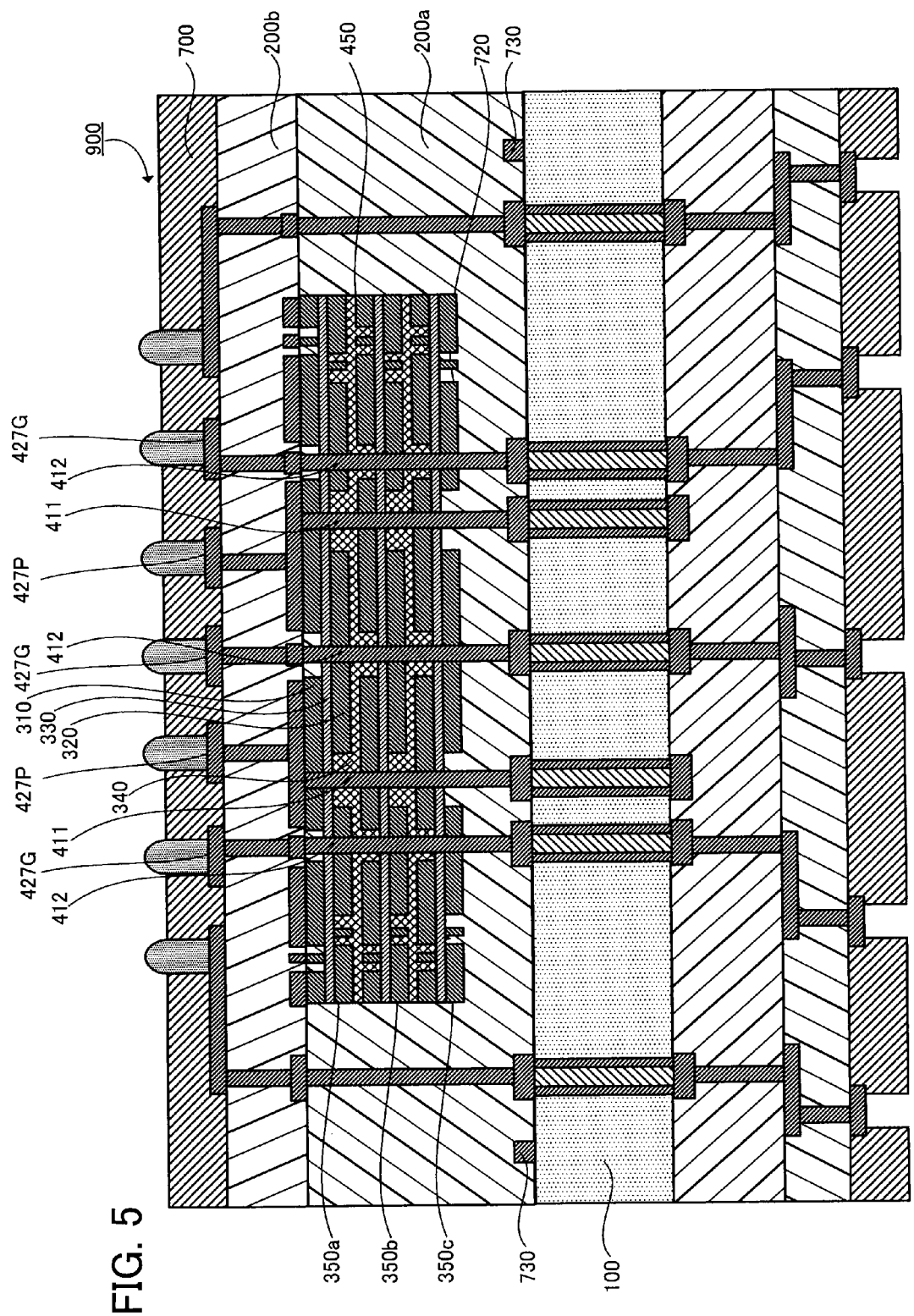
FIG. 5 is a sectional view of a wiring substrate pertaining to yet another embodiment illustrating a laminated capacitor wherein via conductors are formed in opening portions of the first electrodes and opening portions of the second electrodes.
Figure 7A:
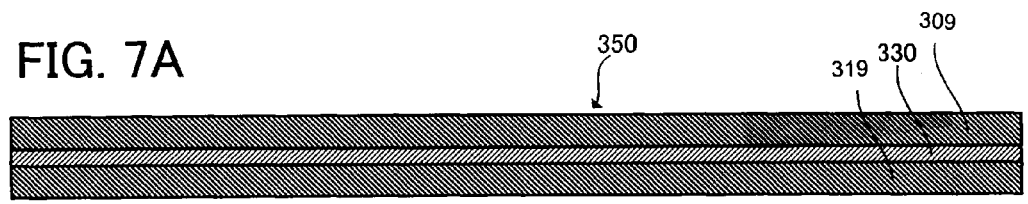
FIG. 7A is a view describing a discrete capacitor of the wiring substrate pertaining to the embodiment of FIG. 5 wherein the first electrode, a dielectric layer, and the second electrode are laminated.
Figure 7B:
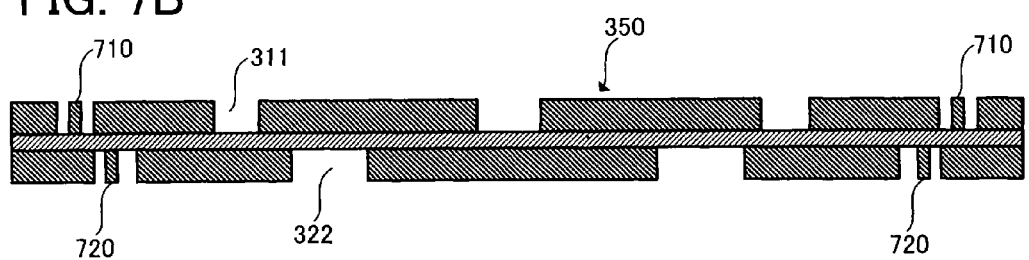
FIG. 7B is a view describing a discrete capacitor of the wiring substrate pertaining to the embodiment of FIG. 5 wherein the first electrode and the second electrode are patterned.
Figure 7C:
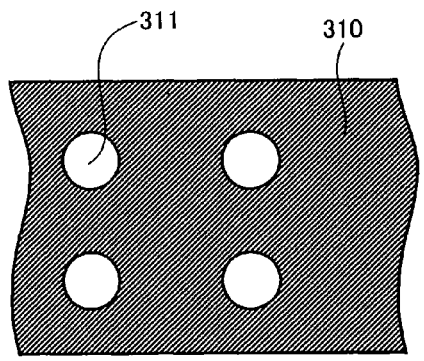
FIG. 7C is a plan view describing from the first electrode side the patterned capacitor of the wiring substrate pertaining to the embodiment of FIG. 5.
Figure 7D:
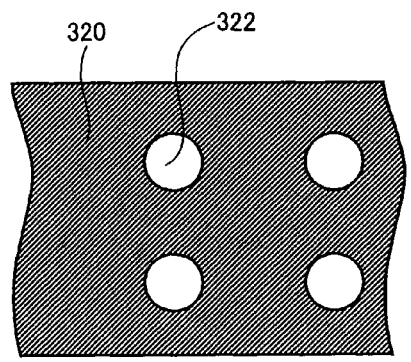
FIG. 7D is a plan view describing from the second electrode side the patterned capacitor of the wiring substrate pertaining to the embodiment of FIG. 5.
Figure 7E:
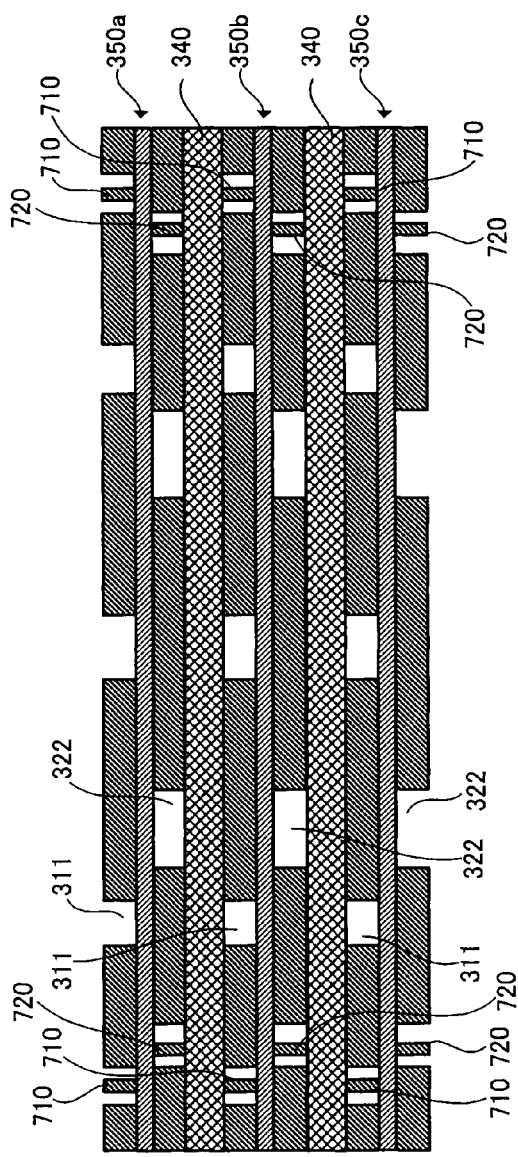
FIG. 7E is a view describing a step of manufacturing a wiring substrate pertaining to the embodiment of FIG. 5 whereby a laminated capacitor is formed such that patterned capacitors are laminated.
Figure 7F:
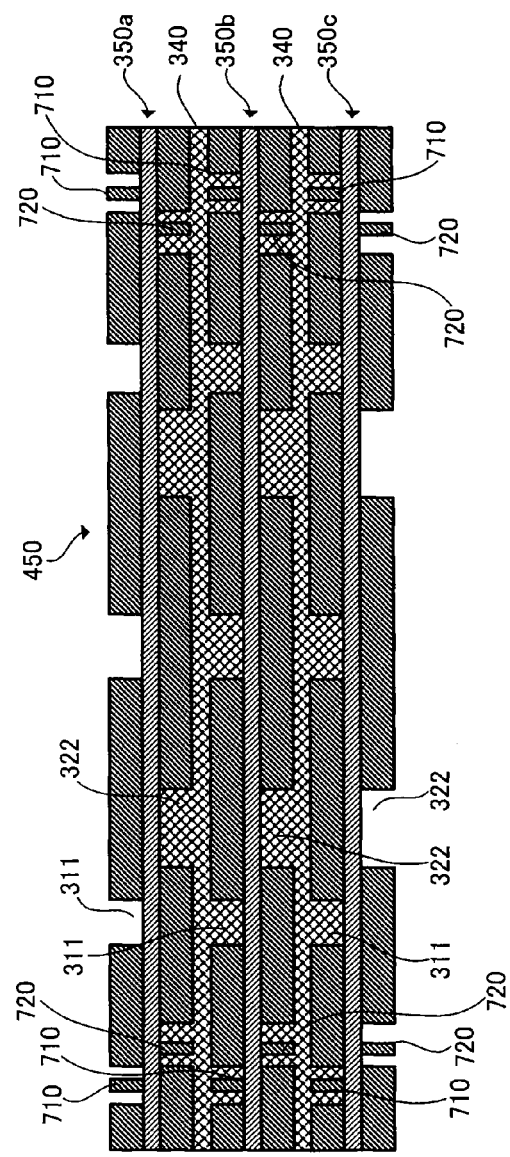
FIG. 7F is a view describing a step of manufacturing a wiring substrate pertaining to the embodiment of FIG. 5 and illustrating a laminated capacitor wherein patterned capacitors are laminated with an adhesive.
Figure 7G:
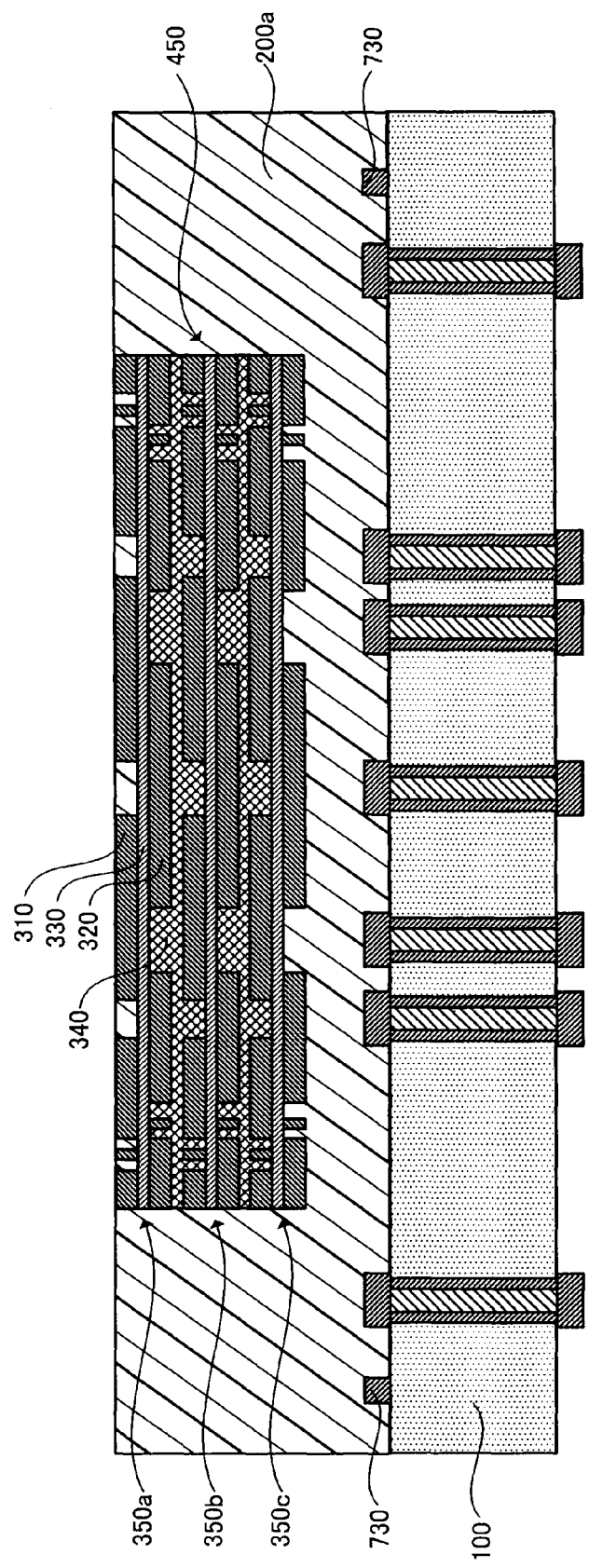
FIG. 7G is a view describing a step of manufacturing a wiring substrate pertaining to the embodiment of FIG. 5, whereby a laminated capacitor with patterned capacitors laminated, is embedded in a resin insulating layer.
Figure 7H:
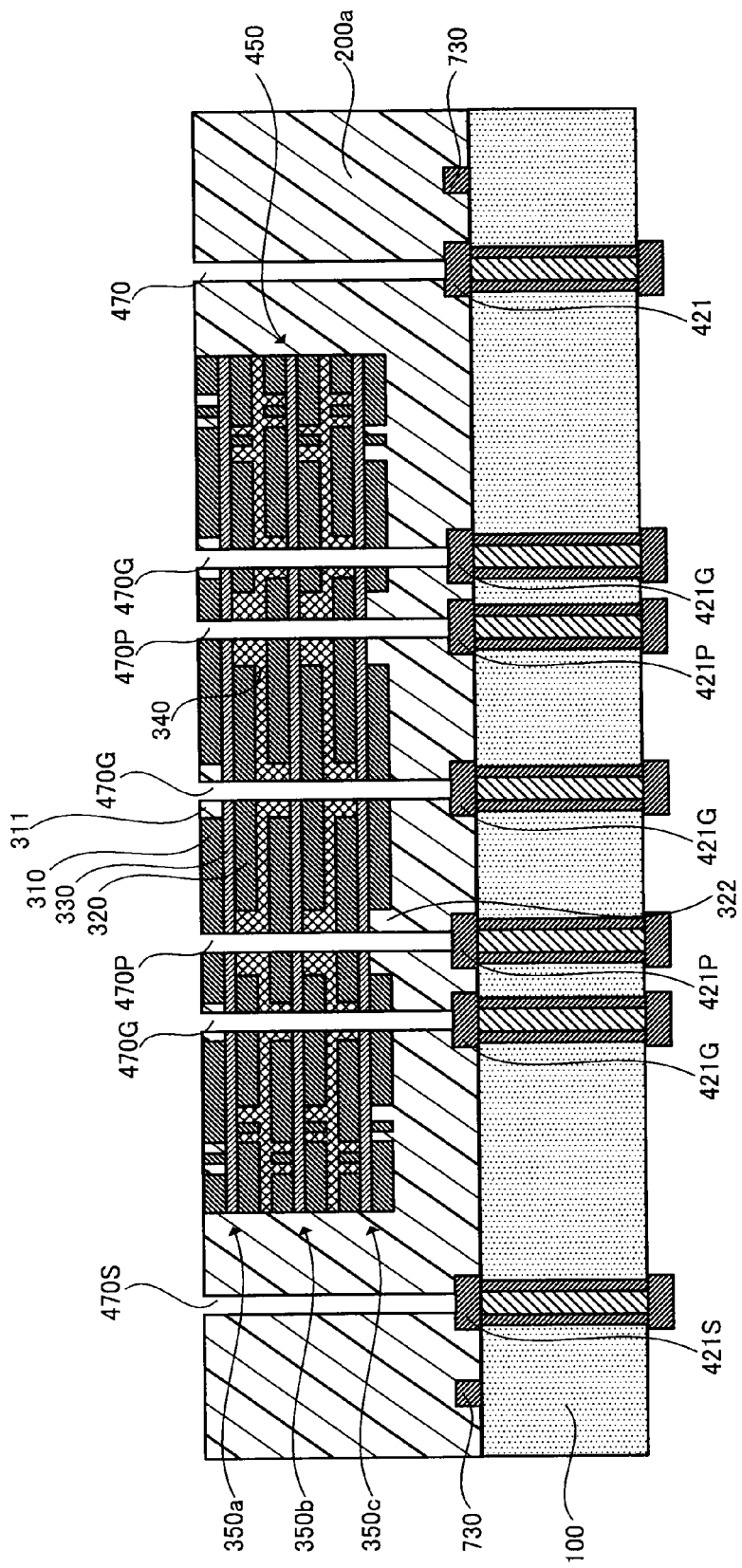
FIG. 7H is a view describing a step of manufacturing a wiring substrate pertaining to the embodiment of FIG. 5 whereby through holes are provided in the laminated capacitor having patterned capacitors.
Figure 7I:
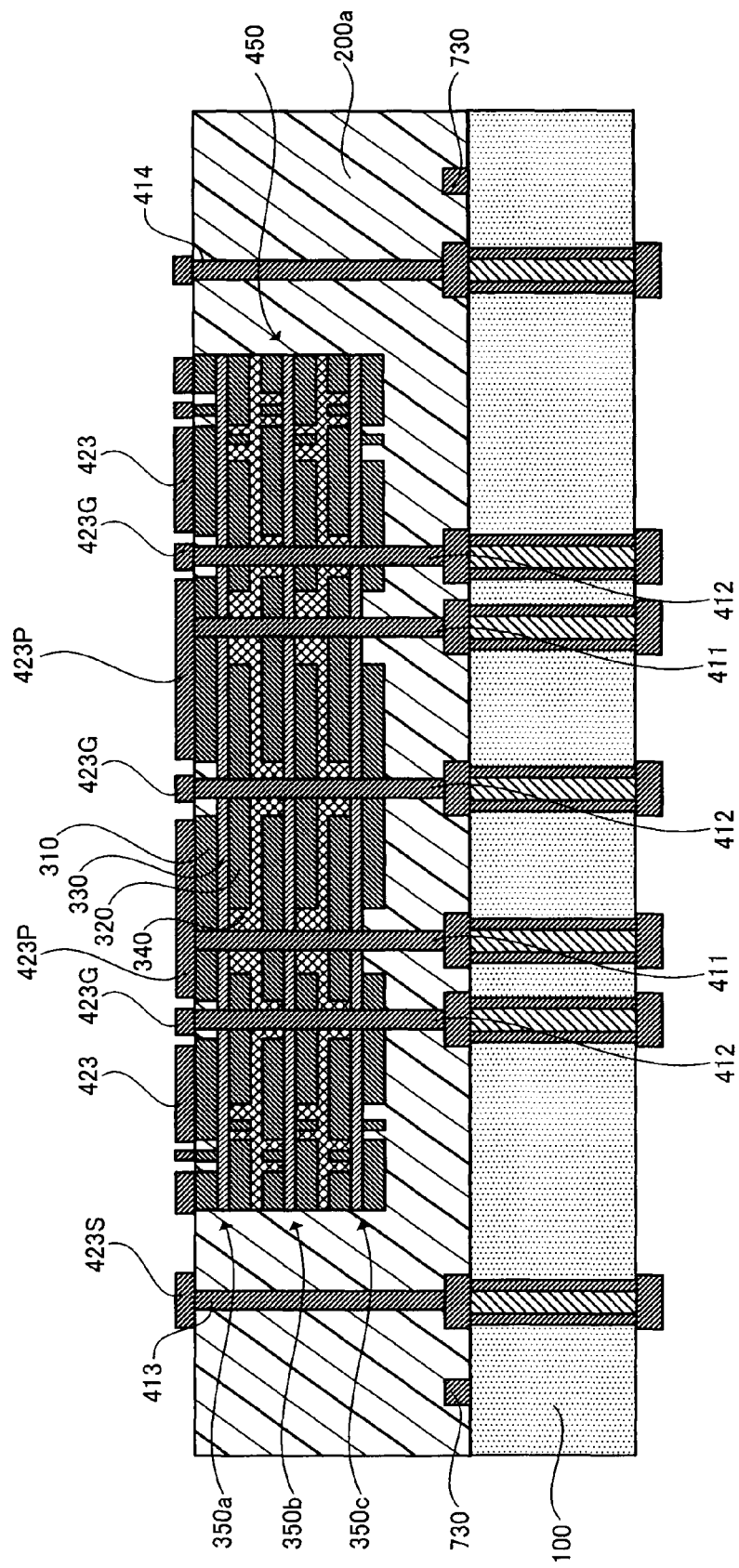

FIG. 7I is a view describing a step of manufacturing a wiring substrate pertaining to the embodiment of FIG. 5 whereby via conductors and conductor patterns are provided in and on the laminated capacitor having patterned capacitors.

Figure 8:
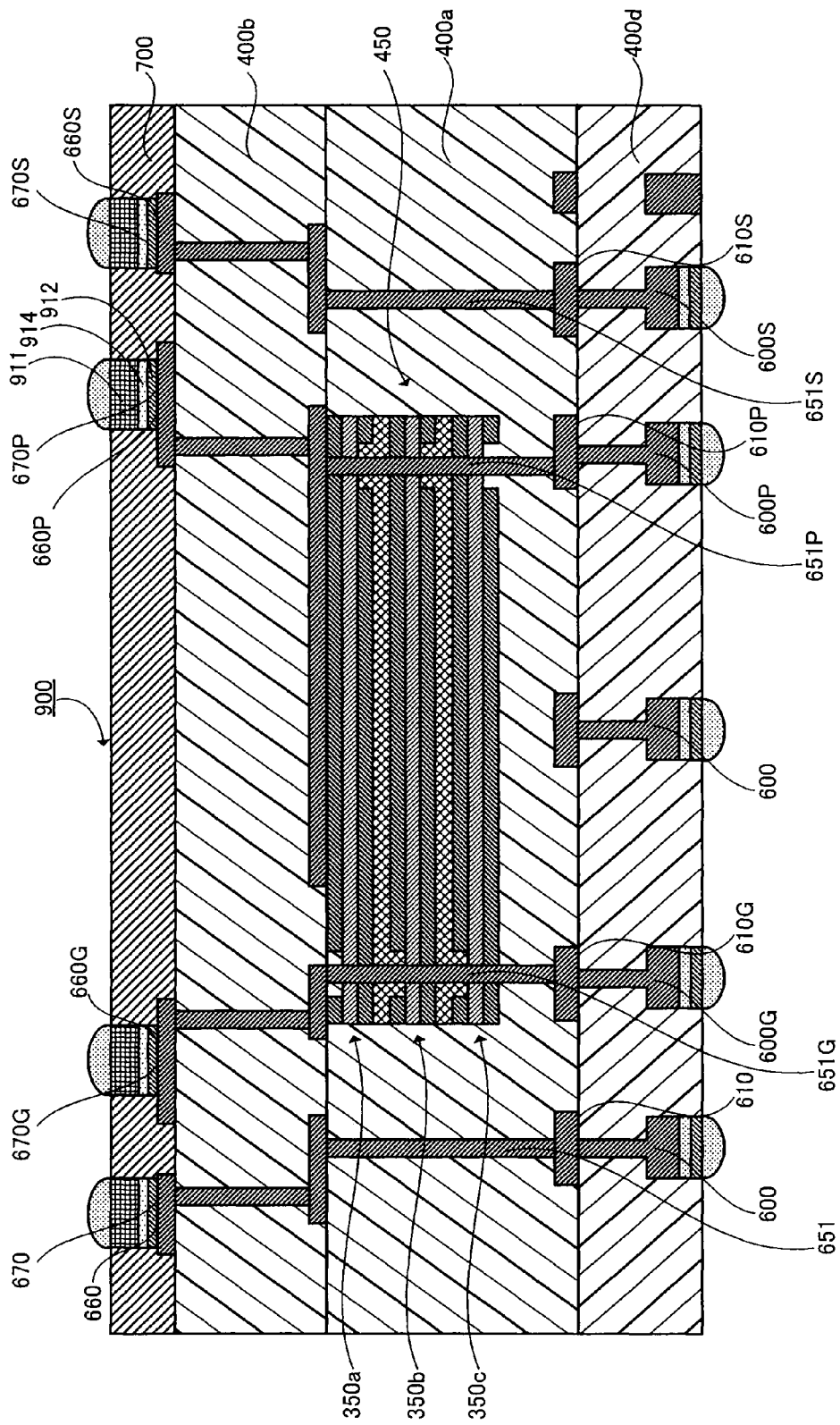

FIG. 8 is a sectional view of a wiring substrate pertaining to still another embodiment in accordance with the present invention.

FIG. 9A is a view describing a support board supporting the resin insulating layer of a wiring substrate pertaining to the embodiment of FIG. 8.

FIG. 9B is a view describing a step of forming a plating resist on the support board of a wiring substrate pertaining to the embodiment of FIG. 8.

FIG. 9C is a view describing a step of forming a plurality of opening portions in the plating resist formed on the support board of a wiring substrate pertaining to the embodiment of FIG. 8.

FIG. 9D is a view describing a step of manufacturing a wiring substrate pertaining to the embodiment of FIG. 8 whereby external terminals are formed in the opening portions of the plating resist.

FIG. 9E is a view describing a step of manufacturing a wiring substrate pertaining to the embodiment of FIG. 8 whereby the first resin insulating layer is formed on the support board.

FIG. 9F is a view describing a step of manufacturing a wiring substrate pertaining to the embodiment of FIG. 8 whereby through holes are formed in the first resin insulating layer formed on the support board.

Figure 9G:
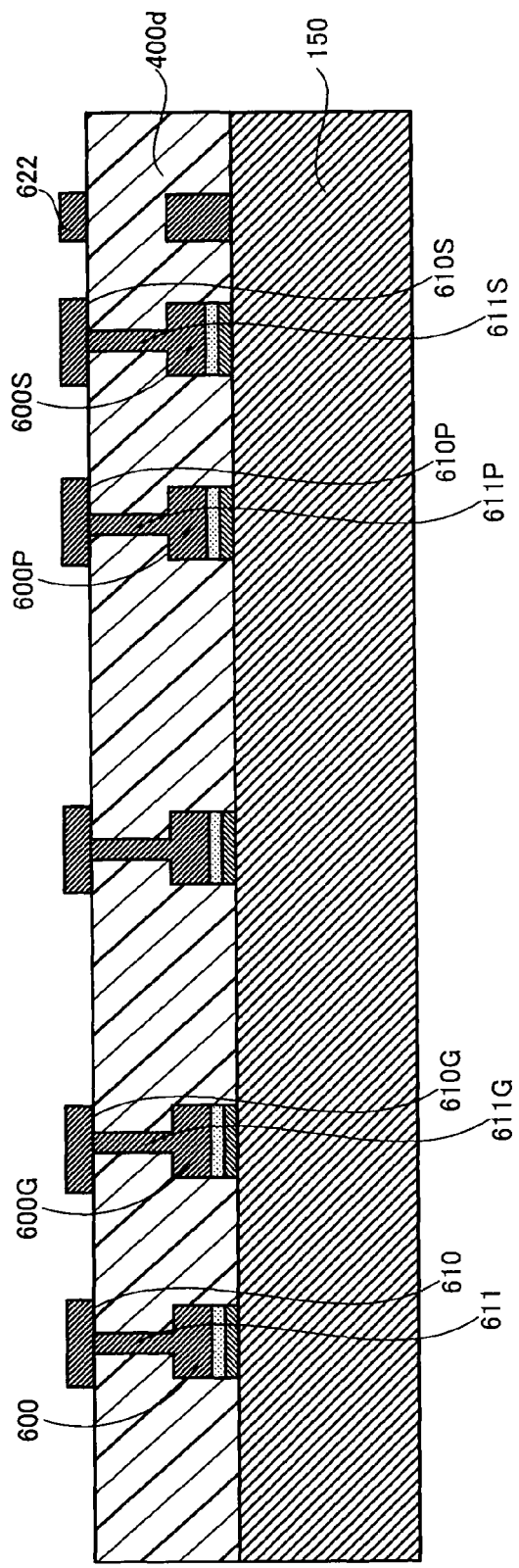

FIG. 9G is a view describing a step of manufacturing a wiring substrate pertaining to the embodiment of FIG. 8 whereby conductor patterns are formed on the upper face of the first resin insulating layer.

FIG. 9H is a view describing a step of manufacturing a wiring substrate pertaining to the embodiment of FIG. 8 whereby the second resin insulting layer is formed on the first resin insulating layer.

Figure 9I:
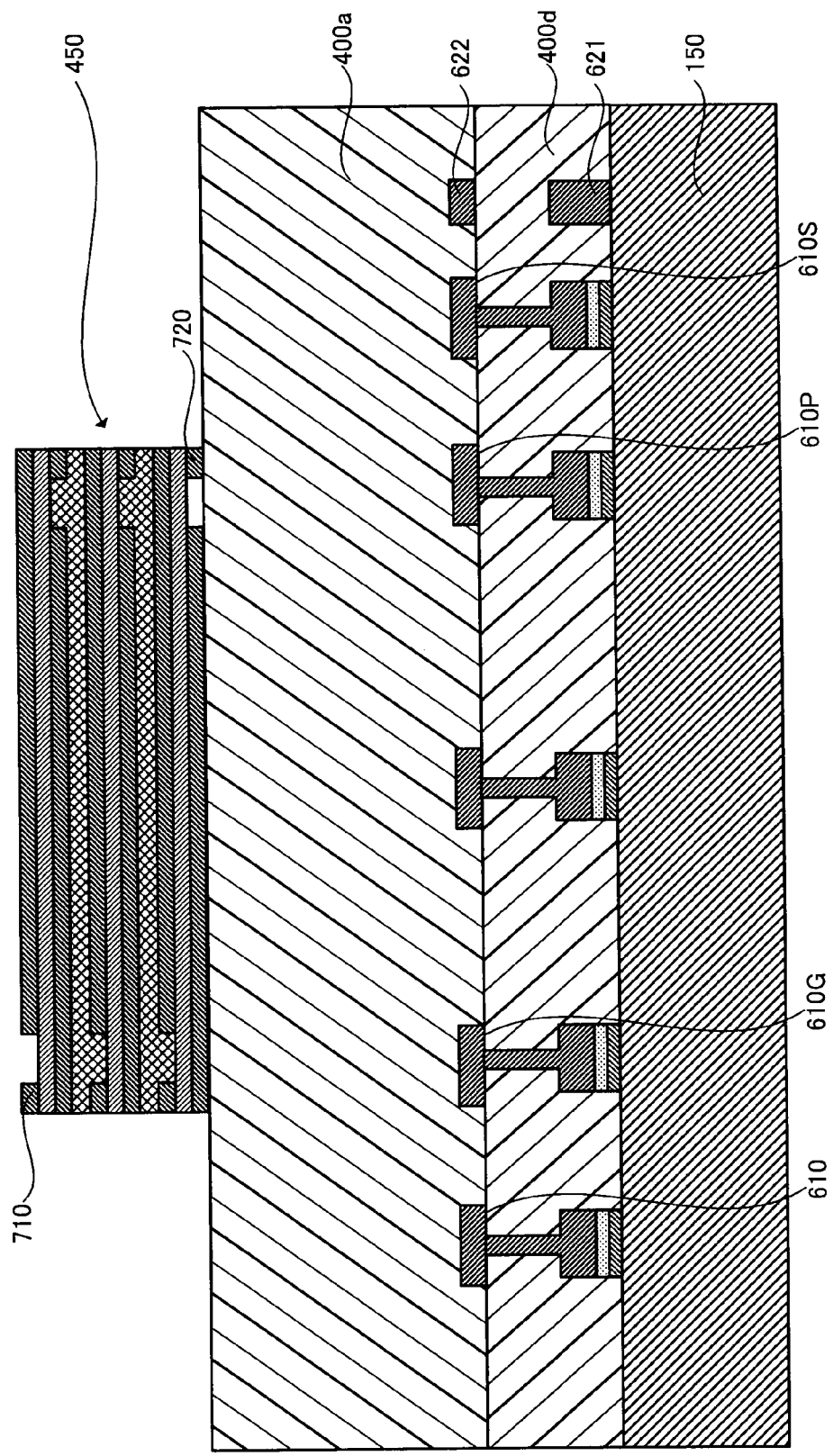

FIG. 9I is a view describing a step of manufacturing a wiring substrate pertaining to the embodiment of FIG. 8 whereby a laminated capacitor is to be embedded in the second resin insulating layer.

Figure 9J:
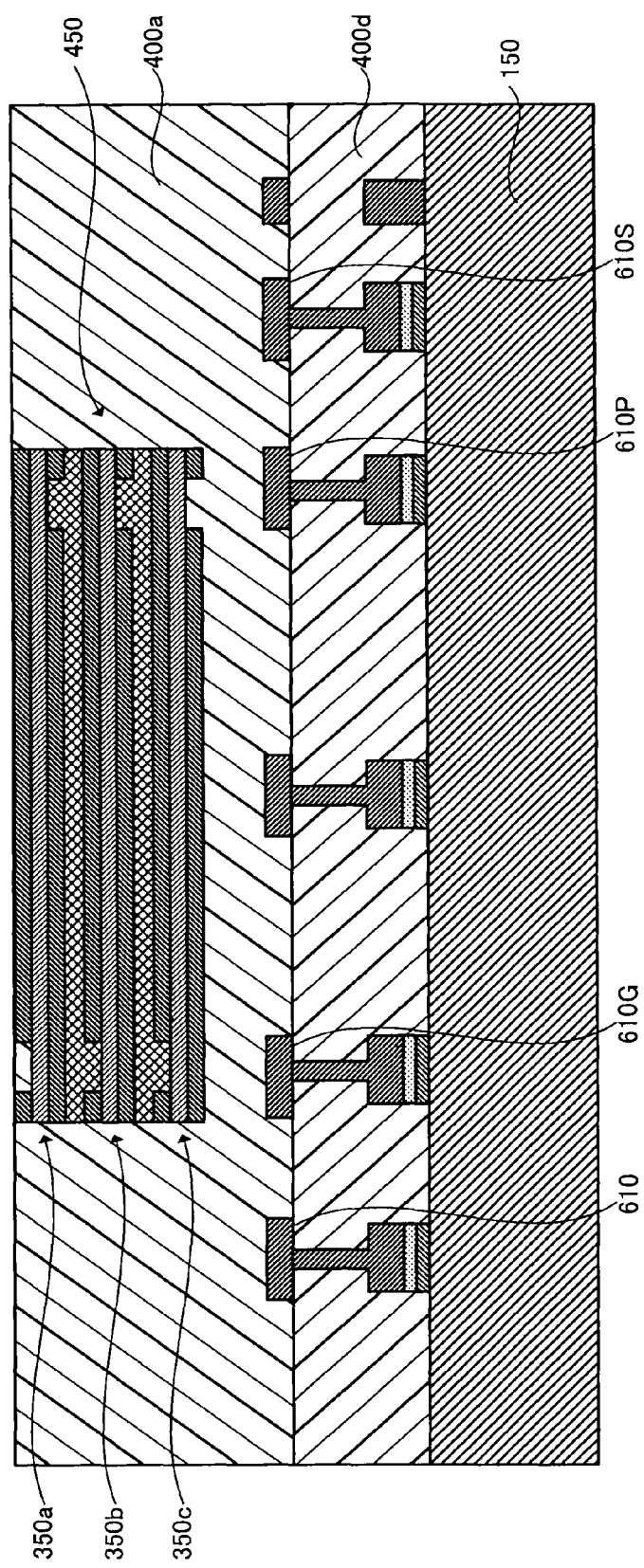

FIG. 9J is a view describing a step of manufacturing a wiring substrate pertaining to the embodiment of FIG. 8, describing the second resin insulating layer in which the laminated capacitor is embedded.

Figure 9K:
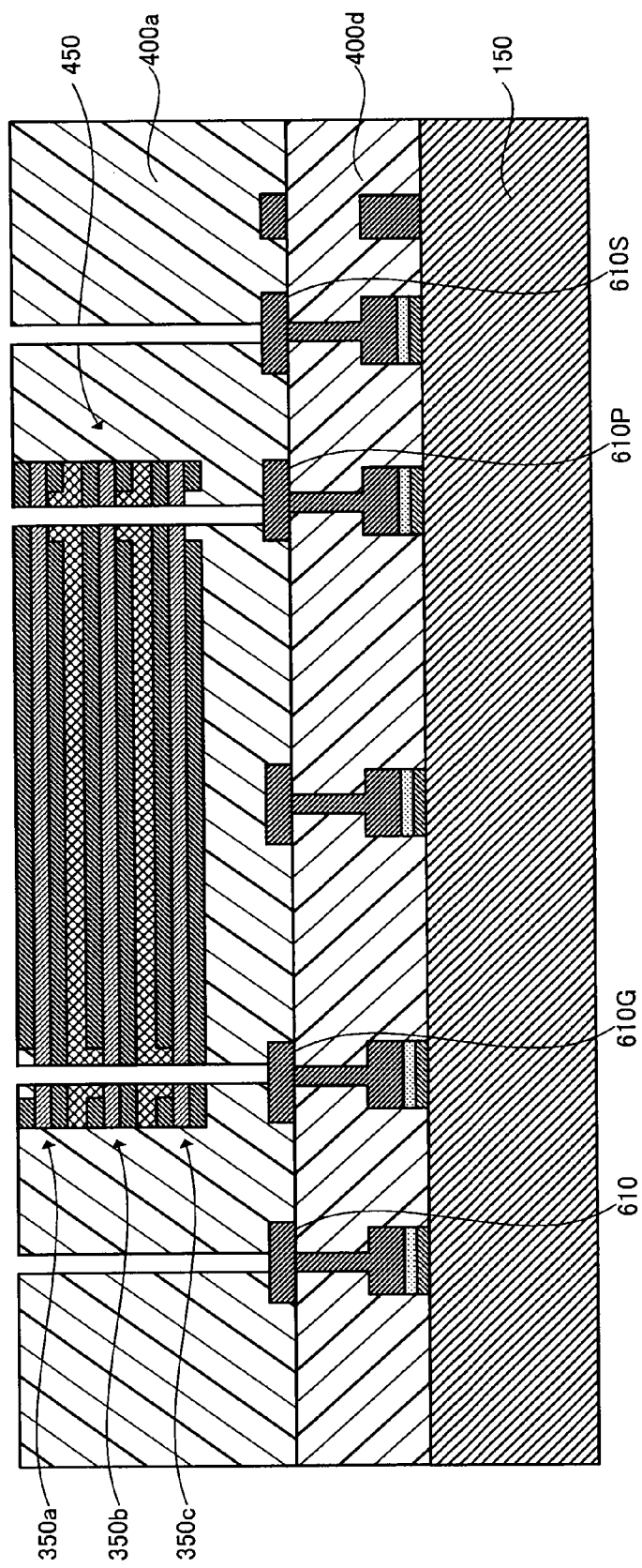

FIG. 9K is a view describing a step of manufacturing a wiring substrate pertaining to the embodiment of FIG. 8 whereby through holes are provided in the second resin insulating layer with the laminated capacitor being embedded therein.

Figure 9L:
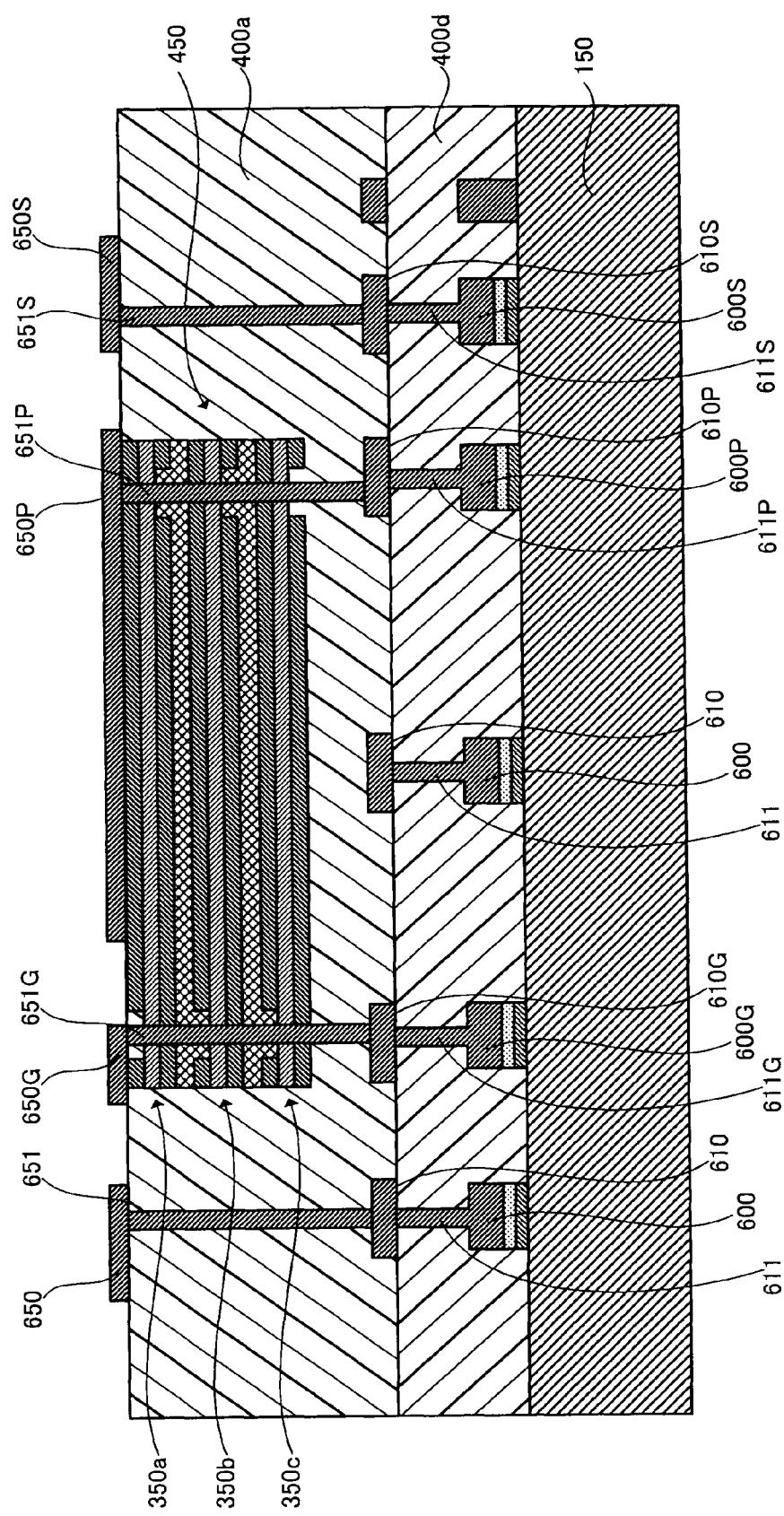

FIG. 9L is a view describing a step of manufacturing a wiring substrate pertaining to the embodiment of FIG. 8 whereby via conductors and conductor patterns are provided in and on the second resin insulting layer.

Figure 9M:
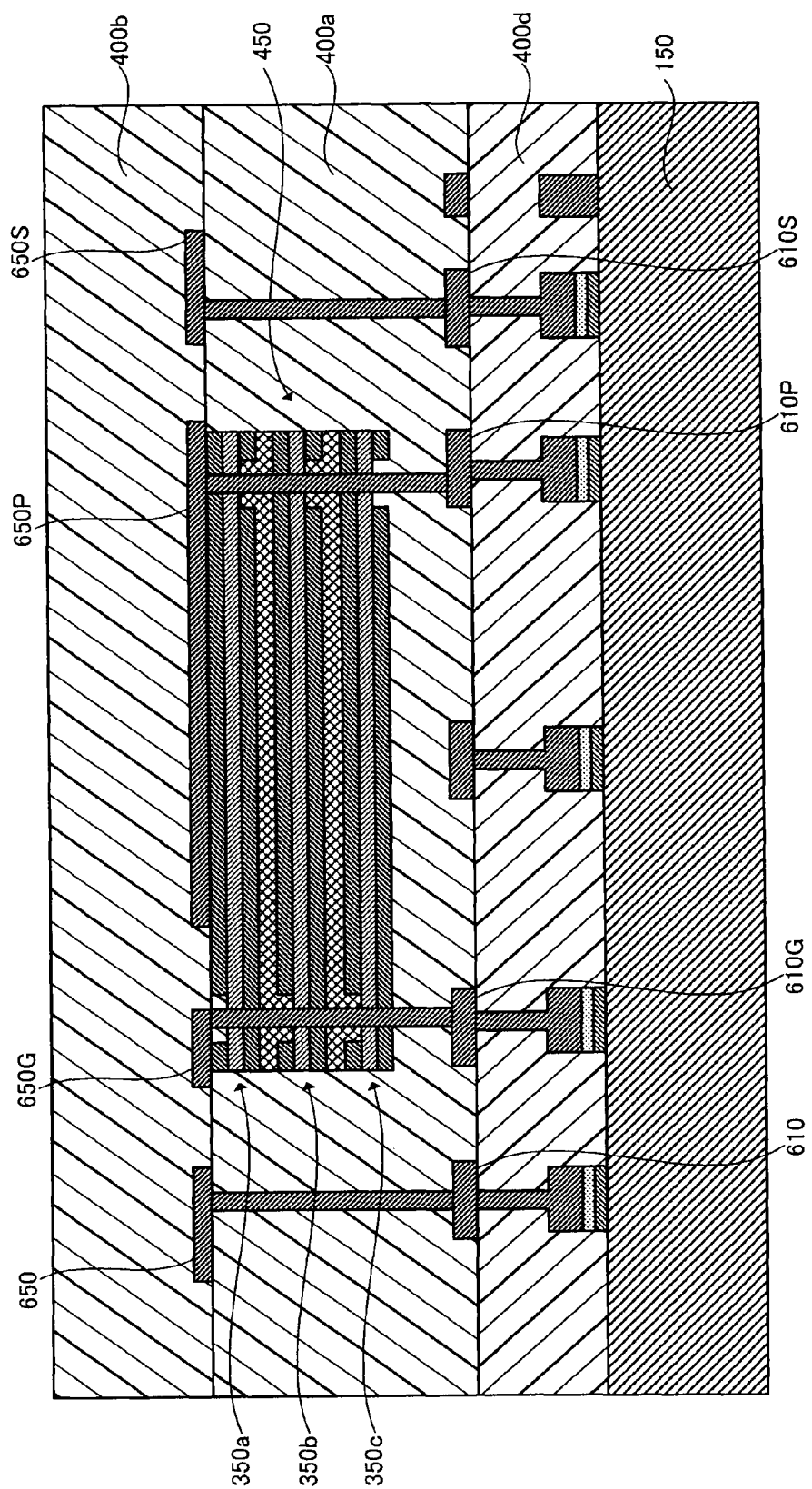

FIG. 9M is a view describing a step of manufacturing a wiring substrate pertaining to the embodiment of FIG. 8 whereby the third resin insulting layer is provided on the second resin insulating layer.

FIG. 9N is a view describing a step of manufacturing a wiring substrate pertaining to the embodiment of FIG. 8 whereby through holes are provided in the third resin insulating layer.

Figure 9O:
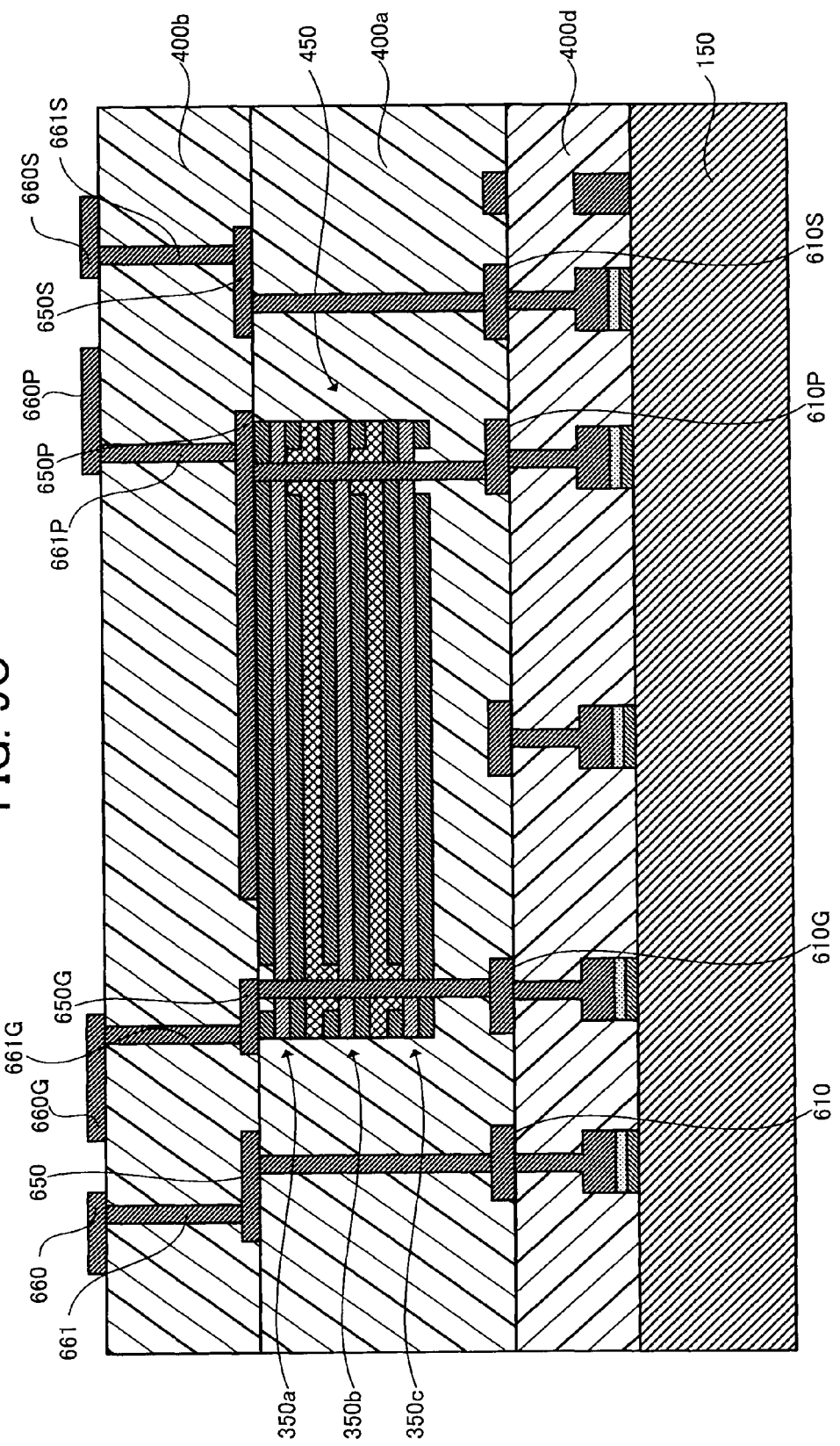

FIG. 9O is a view describing a step of manufacturing a wiring substrate pertaining to the embodiment of FIG. 8 whereby via conductors and conductor patterns are provided in and on the third resin insulting layer.

Figure 9P:
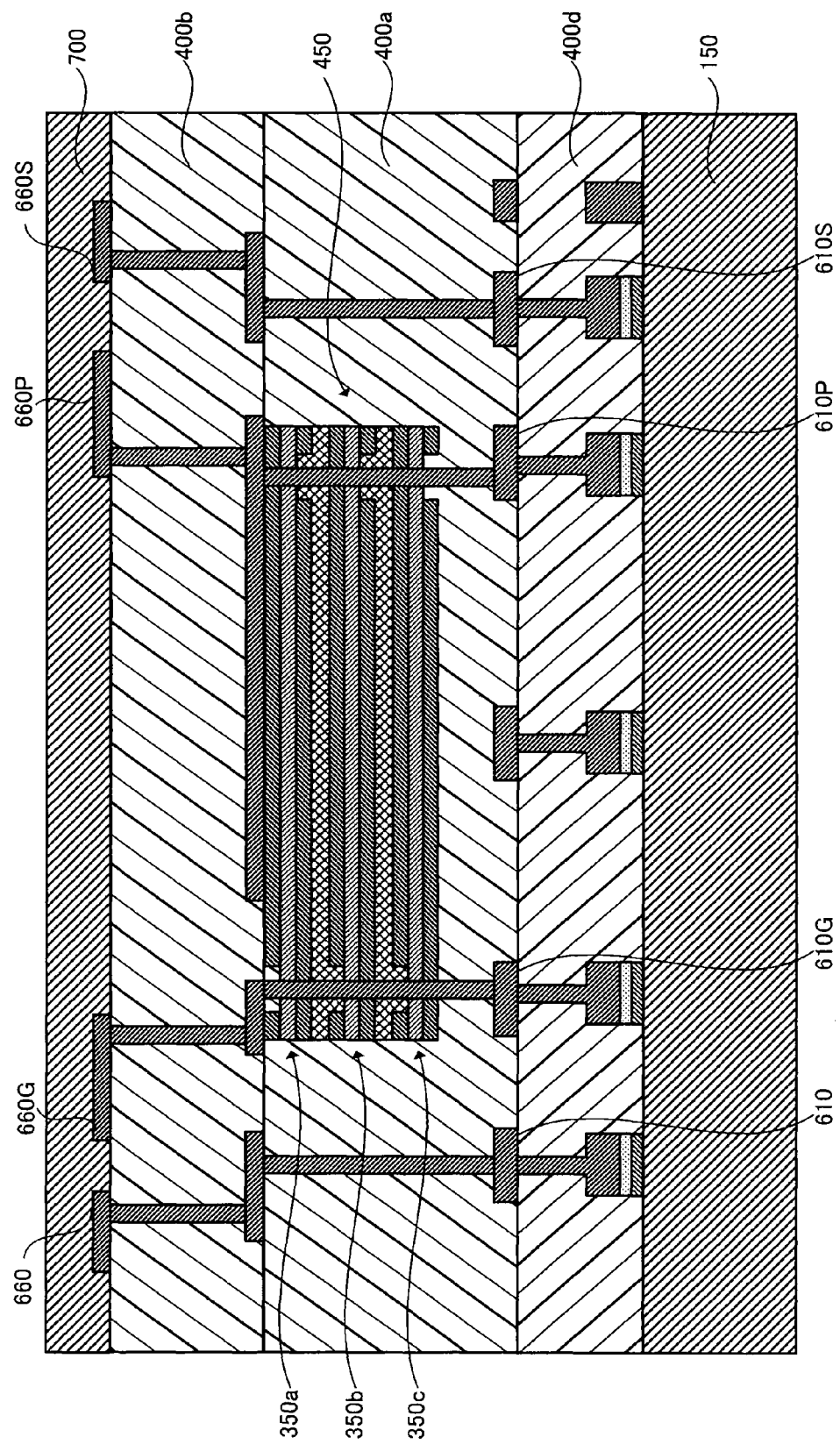

FIG. 9P is a view describing a step of manufacturing a wiring substrate pertaining to the embodiment of FIG. 8 whereby a solder resist is provided on the third resin insulting layer.

Figure 9Q:
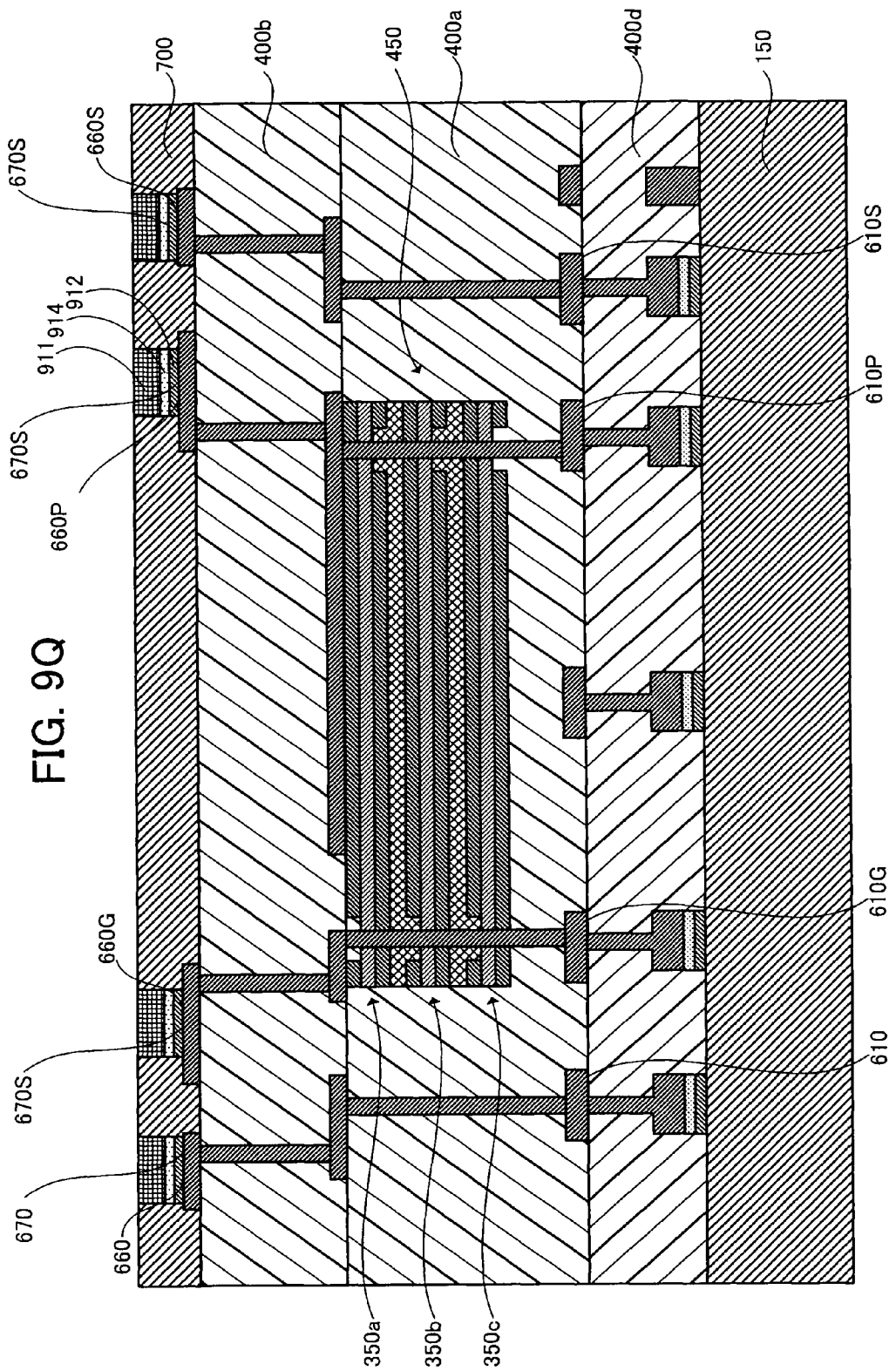

FIG. 9Q is a view describing a step of manufacturing a wiring substrate pertaining to the embodiment of FIG. 8 whereby external terminals are provided in a plurality of opening portions provided in the solder resist.

Figure 9R:
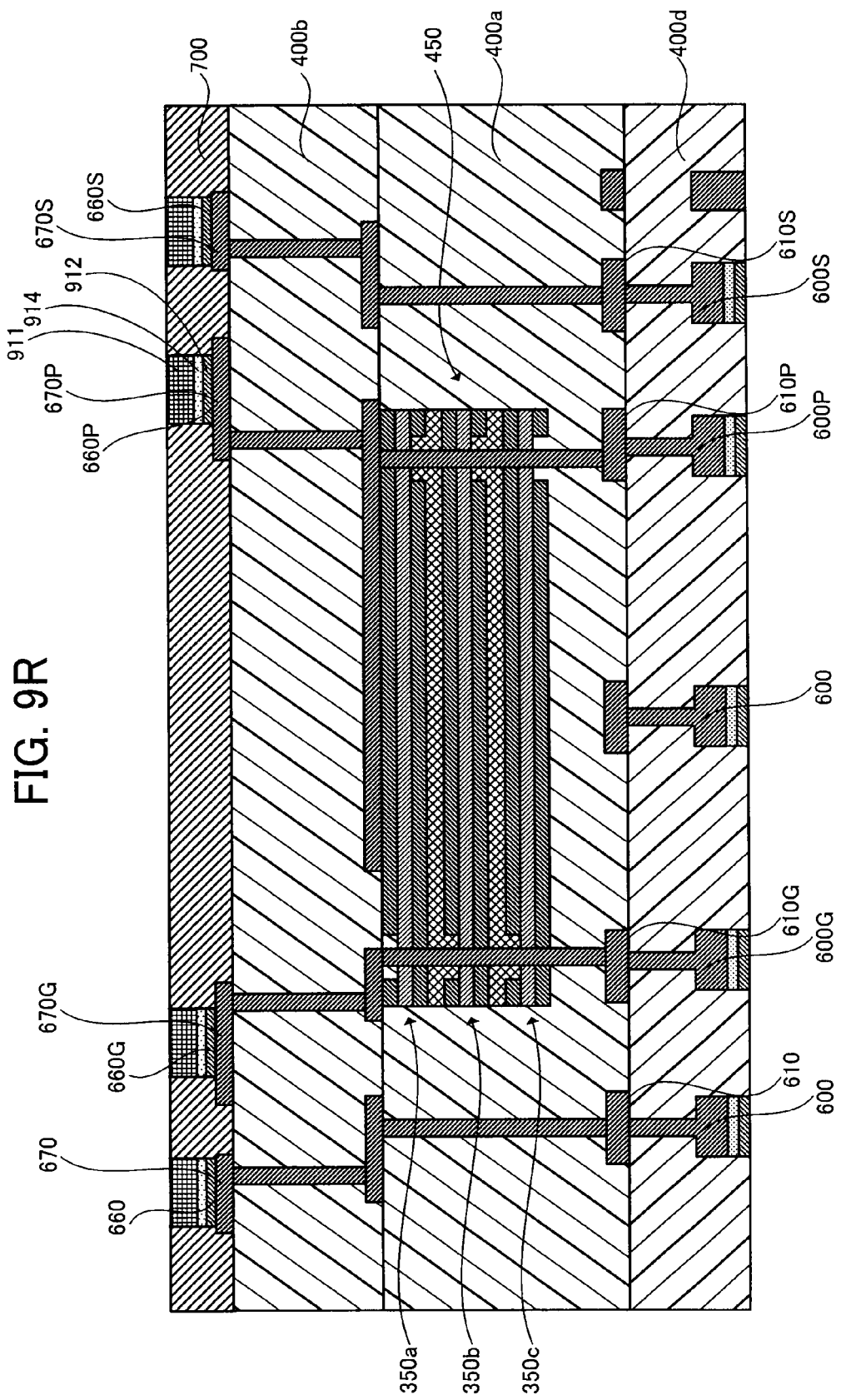

FIG. 9R is a view describing a step of manufacturing a wiring substrate pertaining to the embodiment of FIG. 8 whereby the support board is removed by etching.

FIG. 10 is a view illustrating a modified example of the wiring substrate pertaining to the embodiment of FIG. 8 in accordance with the present invention.

Figure 11:
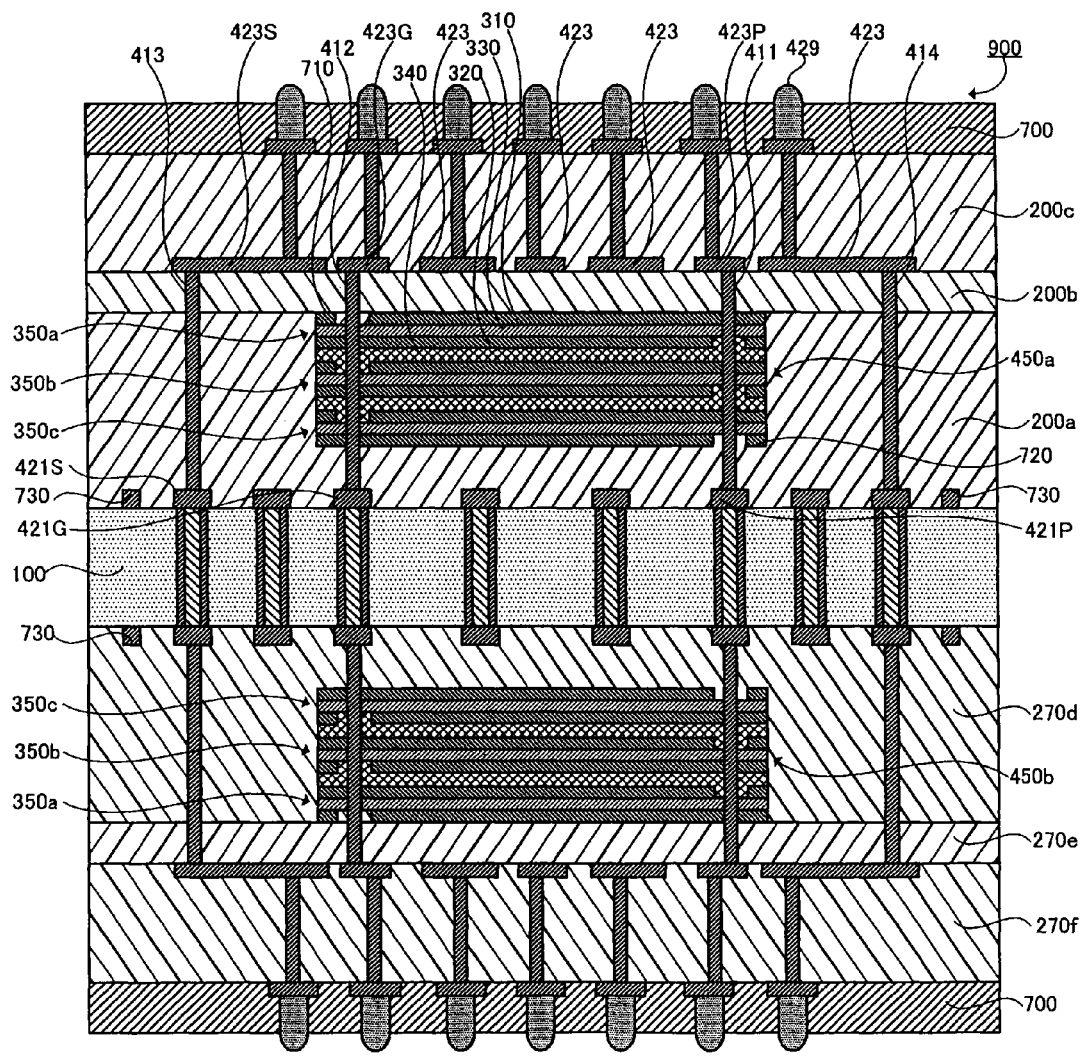

FIG. 11 is a sectional view of a wiring substrate pertaining to yet another embodiment, wherein a laminated capacitor is embedded also in the resin insulating layer provided below the base substrate.

DETAILED DESCRIPTION OF EMBODIMENTS

With the trend for miniaturization of electronic devices, there has been a demand for improving the mounting efficiency of electronic components constituting electronic devices. To that end, to enhance the mounting efficiency, a wiring substrate having a built-in capacitor is disclosed in the Japanese Laid-Open Patent Publication No. 2005-191559. However, with the wiring substrate disclosed in this publication, it is believed that it is difficult to achieve a capacitor built in the wiring substrate having both a high capacitance and high insulation resistance. This is because a capacitor being of a high capacitance generally means that the dielectric layer of the capacitor is thin, and a thin dielectric layer generally means a reduction in the insulation resistance of the capacitor. By contrast securing the insulation resistance of a capacitor generally means that the dielectric layer is thick, which does not allow the capacitor to be of a large capacitance.

A wiring substrate with a plurality of capacitors built in and formed such that dielectric layers and electrodes are alternately laminated in sequence to form the laminated capacitor is disclosed in the Japanese Laid-Open Patent Publication No. 2004-228190. The wiring substrate disclosed in this publication is set forth such that the thickness of the dielectric layers is of a thickness such to obtain the insulation resistance of the capacitor, and the overall capacitance is made large by using a plurality of capacitors. However, with the wiring substrate disclosed in this publication, it is believed that the presence of a defect in one capacitor leads to the presence of a defect in the laminated capacitor as a whole.

An objective of the present invention is to address the above-described problems and to provide a wiring substrate with built-in capacitors having both a high capacitance and a secure insulation resistance. Another objective of the present invention is to improve the yield of a wiring substrate with a built-in laminated capacitor wherein capacitors are laminated, and to provide a wiring board with built-in capacitors with a high capacitance and the insulation resistance that is secured. A further objective of the present invention is to provide a method of manufacturing a wiring substrate meeting the above objectives.

Figure 1:
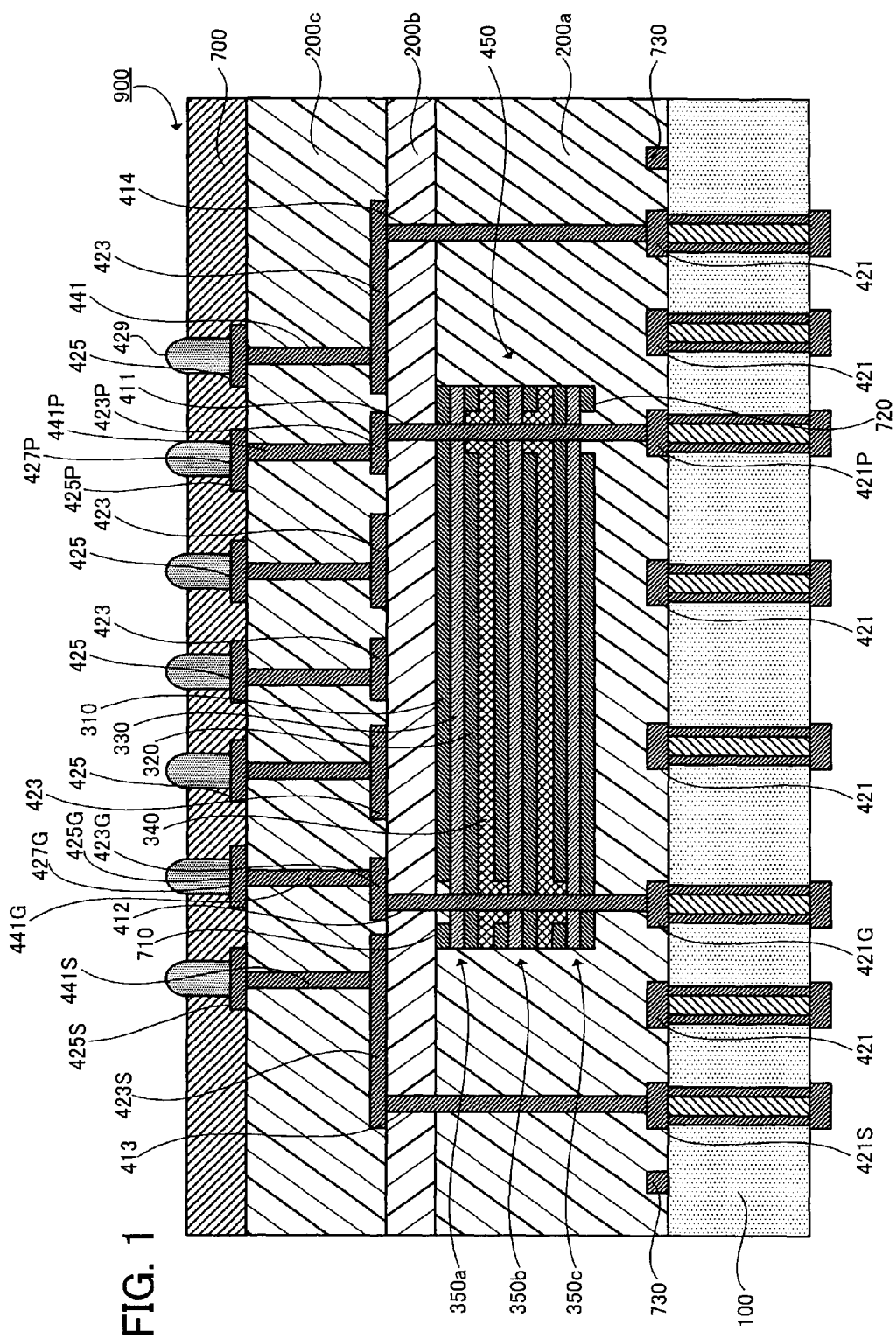
FIG. 1 is a sectional view of a wiring substrate pertaining to an embodiment in accordance with the present invention.

Embodiments of the present invention will now be described with reference to the drawings. As illustrated in FIG. 1, a wiring substrate 900 relating to a first embodiment has first resin insulating layer 200a supported by base substrate 100, and laminated capacitor 450 embedded in the first resin insulating layer 200a. On the first resin insulting layer 200a there is provided second resin insulating layer 200b, and on the second resin insulating layer 200b there is provided third resin insulating layer 200c. In the embodiment of FIG. 1, an upper face of the laminated capacitor 450 and an upper face of the resin insulating layer 200a are such that they sit at the same level (i.e. substantially coplanar).

The laminated capacitor 450 is such that the capacitors 350a, 350b, and 350c are laminated to each other by way of adhesive 340. The adhesive 340 is an insulating resin being, for example, an epoxy resin. The thickness of the laminated capacitor 450 is 30 μm to 100 μm, for example. Where the thickness is greater than 100 μm, it may be difficult for the laminated capacitor 450 to be embedded in the resin insulating layer 200a, and the thickness being less than 30 μm can make the structure of the laminated capacitor too fine such that the structure could possibly impede the production efficiency of the wiring substrate.

Each of the capacitors 350a, 350b, and 350c has dielectric layer 330, first electrode 310 and second electrode 320. In the embodiment of FIG. 1, the first electrode 310 and the second electrode 320 are formed of rectangular plate-shaped conductors that are identical in size. The first electrode 310 and the second electrode 320 are offset from each other by a predetermined distance in a direction of a plane of each of the electrodes such that the first and second electrodes are partially overlapped with one another. The first electrode 310 and the second electrode 320 are, for example, 2 mm to 8 mm in length, 0.1 mm to 8 mm in width, and 3 μm to 15 μm in thickness. In the embodiment of FIG. 1, the first electrode 310 and the second electrode 320 are formed of copper. The dielectric layer 330 is 0.5 μm to 10 μm in thickness, for example. Where the thickness of the dielectric layer 330 is less than 0.5 μm a poor insulation resistance of the capacitor may result. Where the thickness of the dielectric layer 330 is greater than 10 μm a capacitor of a large capacitance value may be difficult to achieve.

The distance between the capacitors 350, the distance between the second electrode 320 of the capacitor 350a and the first electrode 310 of the capacitor 350b (i.e., the thickness of the adhesive layer formed by the adhesive 340) is 2 μm to 12 μm, for example. When the thickness is less than 2 μm, the amount of the adhesive 340 to be filled between the capacitors 350 may be insufficient, leading to a possibility of the adhesion between the capacitors being weak. Further, the thickness of the adhesive 340 being thin could possibly lead to a low insulation resistance between the capacitors (between 350a and 350b and between 350b and 350c). There is a possibility that when the thickness is greater than 12 μm, an increase in the thickness of the laminated capacitor 450 could impede the fine wiring structure of the wiring substrate.

The dielectric layer 330 is a ceramic dielectric layer formed of, for example, barium titanate ($BaTiO_3$). In addition, a thermoplastic resin or thermosetting resin containing a dielectric filler may be used for the dielectric layer 330. For a thermoplastic resin, polyester may be used, and for a thermosetting resin, a phenol resin may be used. A dielectric filler is formed of strontium titanate ($SrTiO_3$), for example.

Via conductor 411 electrically connects the respective first electrodes 310 of the capacitors 350a, 350b, and 350c to each other, and via conductor 412 electrically connects the respective second electrodes 320 of the capacitors 350a, 350b, and 350c to each other. While not shown in FIG. 1, more than one via conductor 411 and more than one via conductor 412 may be used. On the base substrate 100 there is provided a plurality of conductor patterns (conductor circuits) 421 (421P, 421G, 421S), on the second resin insulating layer 200b there is provided a plurality of conductor patterns 423 (423P, 423G, 423S) and on the third resin insulating layer 200c there are provided a plurality of conductor patterns 425 (425P, 425G, 425S). The via conductors 411 electrically connect the conductor patterns 421P and the conductor patterns 423P and the via conductors 412 electrically connect the conductor patterns 421G and the conductor patterns 423G. The conductor patterns 423G connected to the via conductors 412 are connected to a ground line, and the conductor patterns 423P connected to the via conductors 411 are connected to a power supply line. The via conductors 441P electrically connect the conductor patterns 423P and the conductor patterns 425P, and the via conductors 441G electrically connect the conductor patterns 423G and the conductor patterns 425G.

The base substrate 100 is 200 μm to 800 μm in thickness, and is formed of glass epoxy resin, for example. A glass epoxy resin is an epoxy resin with a glass filler added thereto which is impregnated into a glass cloth (glass epoxy substrate).

The first resin insulating layer 200a, the second resin insulting layer 200b, and the third resin insulating layer 200c are each 40 μm to 120 μm in thickness, for example. The resin insulating layers 200a, 200b, and 200c are made of a thermosetting resin such as an epoxy resin, for example. A resin insulating layer may be of inorganic particulates such as glass, alumina, and barium carbonate and of a thermosetting resin. The glass epoxy substrate may be a glass epoxy substrate wherein two layers of glass cloths are overlapped.

The wiring substrate 900 is capable of performing various electrical signal processing, such as transmitting electrical signals through the conductor patterns 421S, etc. Further, the wiring substrate 900 is, by way of the laminated capacitor 450 provided in the resin insulating layer 200a, capable of decoupling noise while reducing the space to be used for the capacitor. Further, the capacitor can be formed near the IC chip to be mounted on the wiring substrate 900 so that a delay in the power supply to the IC can be prevented.

The laminated capacitor 450 built in the resin insulating layer 200a is such that capacitors 350 are laminated to each other. Accordingly, the insulation resistance value of each of the capacitors 350 is maintained approximately constant by maintaining the thickness of the dielectric layer 330 of each of the capacitors 350 in a predetermined thickness, and as the plurality of capacitors 350 are laminated in parallel, an increased capacitance of the laminated capacitor 450 as a whole can be achieved. Thus, a capacitor having both a large capacitance and a high insulating level can be achieved in accordance with the embodiment of FIG. 1.

The capacitors 350 are formed of the plate-shaped first electrode 310, the plate-shaped second electrode 320 offset from the first electrode in the direction of the face of the electrodes, and the dielectric layer 330. As these elements are alternately formed offsetting the first electrode 310 and the second electrode 320 of each of the capacitors 350, there can easily be provided the via conductors 411 electrically connecting the first electrodes 310 of each of the capacitors 350a, 350b, and 350c, and the via conductors 412 electrically connecting the second electrode 320 of each of the capacitors 350a, 350b, and 350c. Further, since the via conductors need not be formed in areas where the first electrodes 310 and the second electrodes 320 are opposing each other, the electrode areas can be made large, allowing the capacitors of a large capacitance to be achieved. Still further, since the number of via conductors penetrating the capacitor electrodes can be small, the occurrence of cracks in the dielectric layers due to the thermal expansion of the via conductors can be controlled thereby improving manufacturing yield.

Still further, the laminated capacitor 450 is formed such that capacitors 350 are laminated to each other. Accordingly, in forming the laminated capacitor 450, the insulation resistance value of each of the discrete capacitors 350 can be checked and only the capacitors 350 with a good insulation resistance can be selected in advance for lamination, which can improve manufacturing yield. Thus, a non-defective laminated capacitor 450 as a whole can be obtained as well, to secure the insulation reliability of the laminated capacitor 450. With a conventional laminated capacitor formed such that an electrode and a dielectric layer are alternately laminated, it is difficult to check in advance to see if the insulation resistance of each of the capacitor portions are good. Accordingly, it would be difficult to secure the insulation reliability of the laminated capacitor at the manufacturing stage, and reduced manufacturing yield can result.

In the laminated capacitor 450, the resin insulating layer 200*a* is such that the capacitors 350 are laminated with adhesive 340, such as a resin, interposed between the capacitors. It is also possible to use materials having a similar thermal expansion coefficient for the adhesive 340 and the resin insulating layer 200*a* and, accordingly, the thermal expansion coefficient of the laminated capacitor 450 as a whole can be brought close to the thermal expansion coefficient of the resin insulating layer 200*a*. Thus, if the laminated capacitor 450 were to heat up, the possibility of cracks occurring at the interface between the resin insulating layer 200*a* and the laminated capacitor 450 is low. Thus, it is difficult for cracks to occur in the dielectric layer 330.

Figure 2A:
FIG. 2A is a view describing a step of manufacturing a wiring substrate relating to the embodiment of FIG. 1, whereby the first electrode, the dielectric layer, and the second electrode are laminated.

A method of manufacturing a wiring substrate relating to the embodiment of FIG. 1 is now described. First, on a first electrode material 309 made of copper being 5 μm in thickness, a high dielectric material made of $BaTiO_3$ is printed in a thin film of 5 μm to 10 μm in thickness, with the use of a printer such as a doctor blade, to form a non-baked layer. To form a thinner dielectric layer (0.5 μm to 5 μm), a sol gel process, sputtering, etc., which will be described below may be used. The non-baked layer is then baked in vacuum in a non-oxidizing atmosphere such as $N_2$ gas at the temperature range of 600 to 950° C. to obtain the dielectric layer 330. Subsequently, a metal layer made of copper is formed on the dielectric layer 330 with the use of a vacuum evaporation apparatus such as a sputtering apparatus. Further, on this metal layer, copper of about 5 μm is added by electroplating, etc., to form the second electrode material 319. As such, as illustrated in FIG. 2A, a capacitor wherein the dielectric layer 330 formed of $BaTiO_3$ is sandwiched by the first electrode 310 and the second electrode 320 formed of copper is obtained.

Figure 2B:
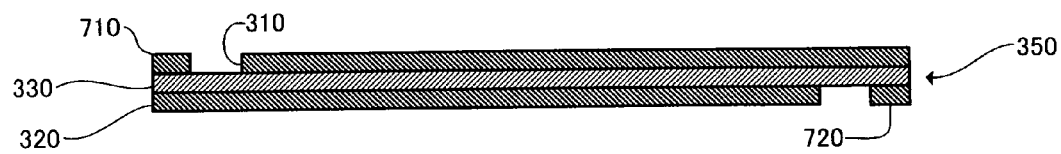
FIG. 2B is a view describing a step of manufacturing a wiring substrate pertaining to the embodiment of FIG. 1, whereby the first electrode and the second electrode are positioned offset from each other.

Next, as illustrated in FIG. 2B, the first electrode 310 and the second electrode 320 are formed such that they are offset in a direction of a face (i.e., the horizontal direction or a direction of a plane of each electrode) by stripping portions of the first electrode material 309 and the second electrode material 319 by an etching process using cupric chloride etching solution to provide the discrete capacitors 350. As used herein, the term "offset" means that the first and second electrodes only partially overlap one another. That is, at least one edge of the first electrode is not aligned with a corresponding edge of the second electrode. In the embodiment of FIG. 2B, the first electrode 310 and the second electrode 320 are offset in the horizontal direction such that the overlap of the first electrode 310 and the second electrode 320 present above and below the dielectric layer 330 is about 4 to 1.0 cm$^2$. Further, by the etch processing, alignment mark 710 is formed from the first electrode material 309, and alignment mark 720 is formed from the second electrode material 319.

Figure 2C:
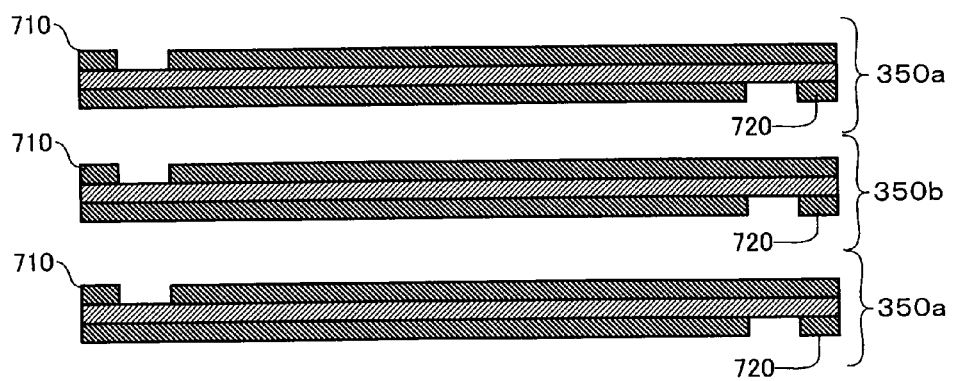
FIG. 2C is a view describing a step of manufacturing a wiring substrate pertaining to the embodiment of FIG. 1, whereby a laminated capacitor is formed such that capacitors are laminated to each other.
Figure 2D:
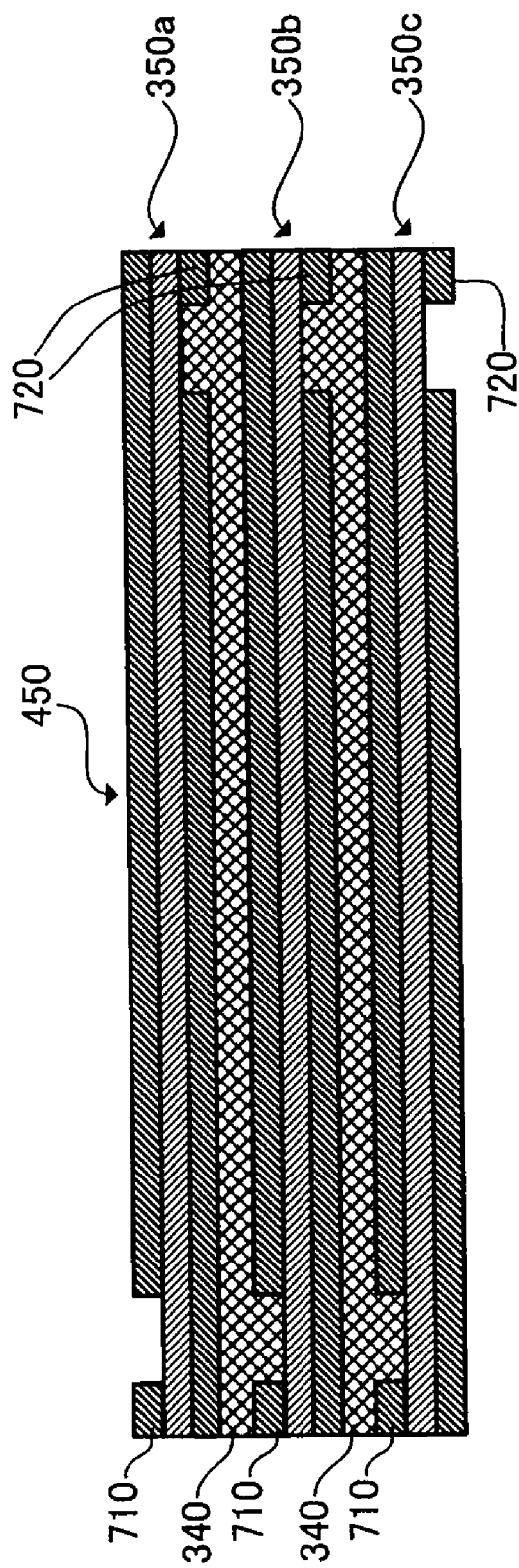
FIG. 2D is a view describing a step of manufacturing a wiring substrate pertaining to the embodiment of FIG. 1, illustrating a laminated capacitor wherein capacitors are laminated with an adhesive.

Next, as illustrated in FIG. 2C, three discrete capacitors 350*a*, 350*b*, and 350*c* are laminated in the vertical direction. When the capacitors 350*a*, 350*b*, and 350*c* are laminated, an epoxy resin as an adhesive is interposed in between the capacitors 350. The discrete capacitors 350*a*, 350*b*, and 350*c* are aligned with the alignment mark 710 and/or alignment mark 720 provided in each of the capacitors as references. And, as illustrated in FIG. 2D, the laminated capacitor 450 is obtained by the three capacitors 350*a*, 350*b*, and 350*c* laminated with the adhesive 340 interposed in between the capacitors.

Figure 2E:
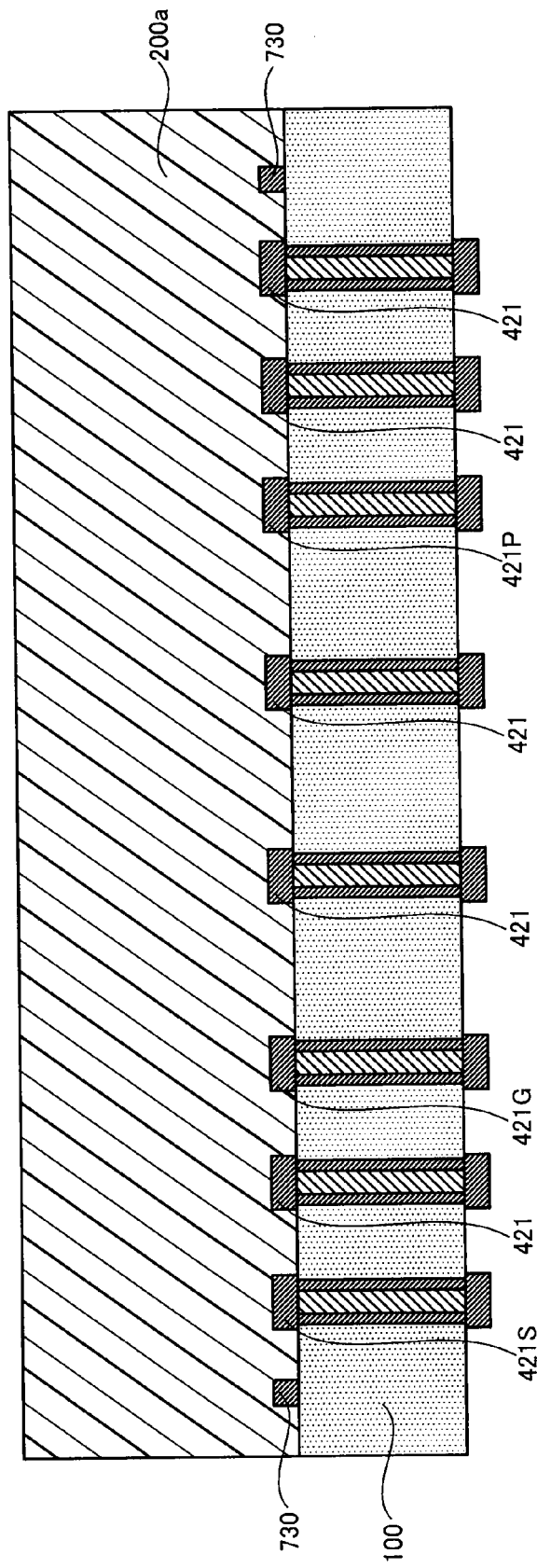
FIG. 2E is a view describing a step of manufacturing a wiring substrate pertaining to the embodiment of FIG. 1, whereby a resin insulating layer is laminated on a base substrate.

Next, as illustrated in FIG. 2E, on the base substrate (core substrate) 100 having alignment mark 730 formed thereon, a thermosetting resin film is attached with the use of a vacuum laminator under the lamination conditions of the temperature being 50 to 170° C., and the pressure being 0.4 to 1.5 MPa. On the base substrate there are formed conductor patterns 421 (421P, 421G, 421S). In the embodiment of FIG. 2E, the base substrate is a glass epoxy substrate having a thickness of 0.6 mm. While the thermosetting resin film is semi-cured when it is attached, it becomes the first resin insulating layer (the lower layer resin insulating layer) 200*a* as it hardens. As for a type resin film, two sheets of ABF-45SH made by Ajinomoto Co., Inc., can be used.

Figure 2F:
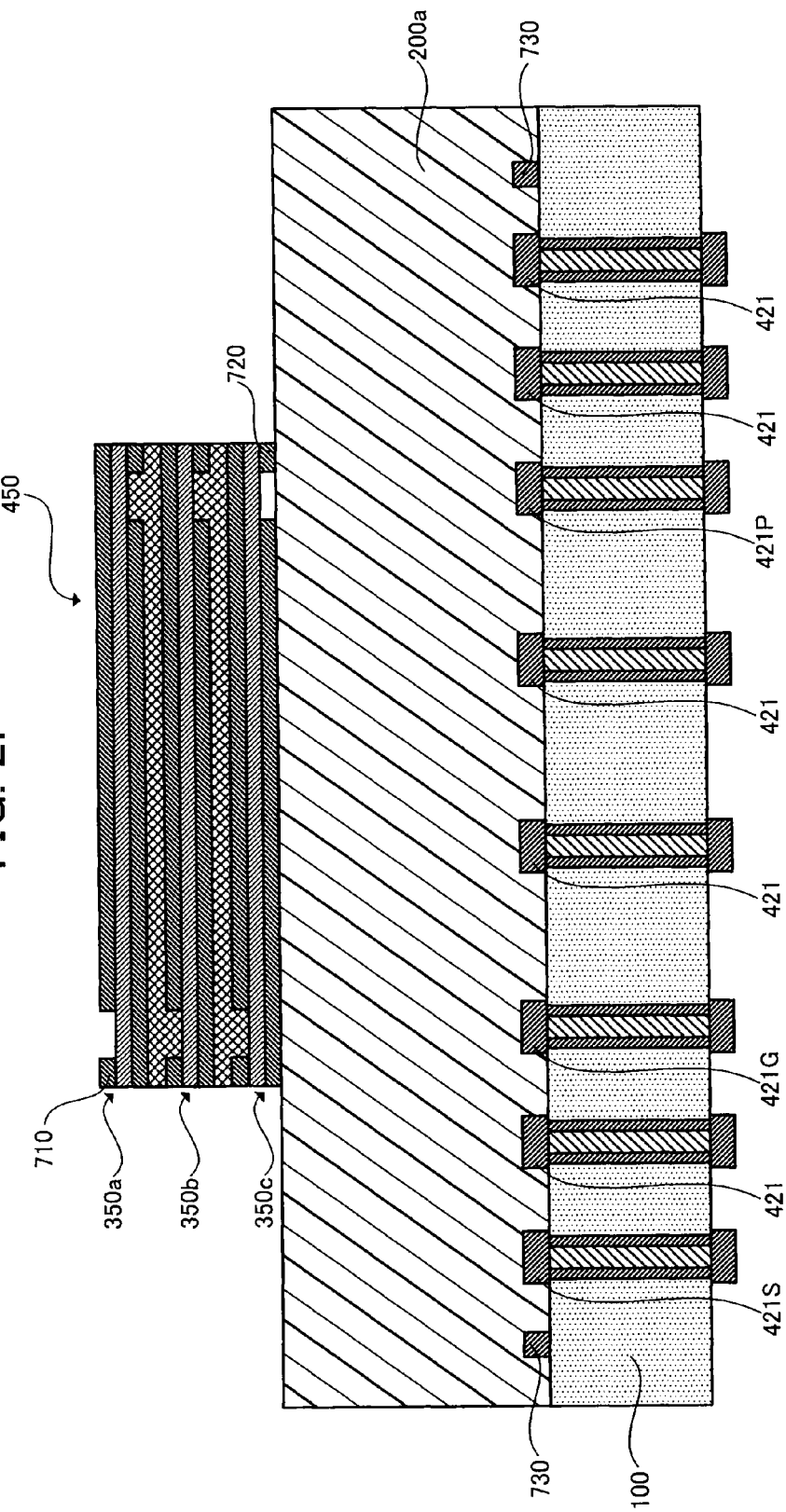
FIG. 2F is a view describing a step of manufacturing a wiring substrate pertaining to the embodiment of FIG. 1, whereby a laminated capacitor is embedded in a resin insulating layer.

Next, as illustrated in FIG. 2F, the laminated capacitor 450 is aligned on the first resin insulating layer 200*a*, which is semi-hardened and laminated. The alignment is performed such that the alignment mark 710 present in the capacitor 350*a*, from among the capacitors of the laminated capacitor 450, and the alignment mark 730 of the base substrate 100 are recognized by a camera. Alternatively, alignment may be performed such that the alignment mark 720 present in the capacitor 350*c*, from among the capacitors of the laminated capacitor 450, and the alignment mark 730 in the base substrate 100 are recognized by a camera. That is, either one of the alignment mark 710 or the alignment mark 720 may be provided, or both of these marks may be provided for alignment.

Subsequently, as illustrated in FIG. 2G, under the press conditions of 0.4 MPa, 170° C., and 2 hours, the laminated capacitor 450 and first resin insulating layer are vacuum-pressed such that the laminated capacitor 450 is embedded into the resin insulting layer 200*a*, and concurrently the first resin insulating layer 200*a* is cured. The laminated capacitor 450 is embedded in the first resin insulating layer 200*a* such that the upper face of the laminated capacitor 450 and the upper face of the first resin insulating layer 200*a* sit at the same level (i.e. they are coplanar).

Figure 2H:
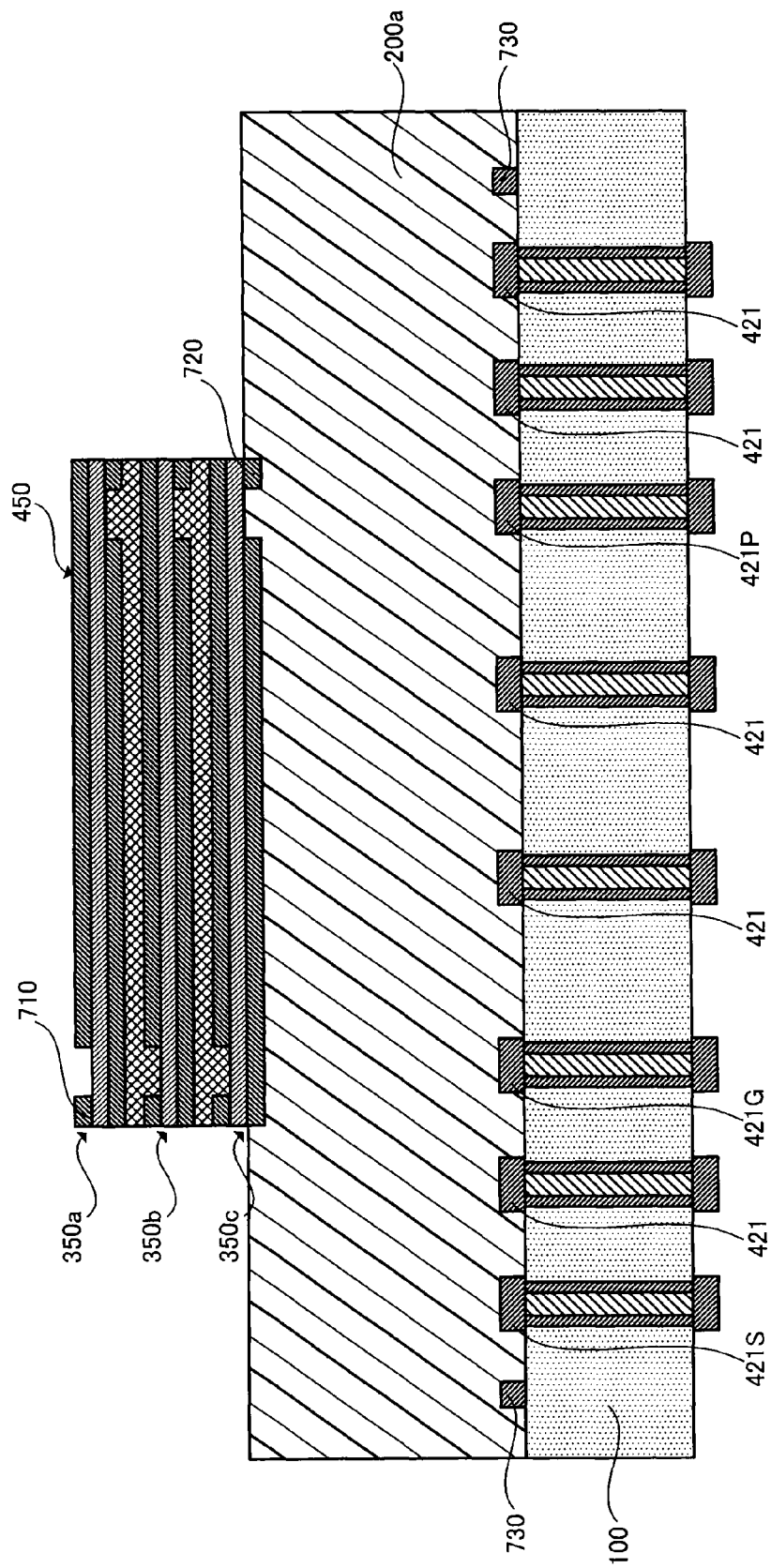
FIG. 2H is a view describing a step of manufacturing a wiring substrate pertaining to the embodiment of FIG. 1, whereby a laminated capacitor is laminated onto a resin insulating layer.

Alternatively, it is possible for the laminated capacitor to be laminated on the first resin insulating layer 200*a* such that as illustrated in FIG. 2H, a portion of the capacitor 350*c* is embedded (i.e. the faces are not coplanar). In such a case as well, the alignment mark 720 provided on the capacitor 350*c* or the alignment mark 710 provided in the capacitor 350*a* of the laminated capacitor 450 and the alignment mark 730 provided on the base substrate 100 are the reference marks for aligning the laminated capacitor 450 and the first resin insulating layer 200*a*.

Figure 2I:
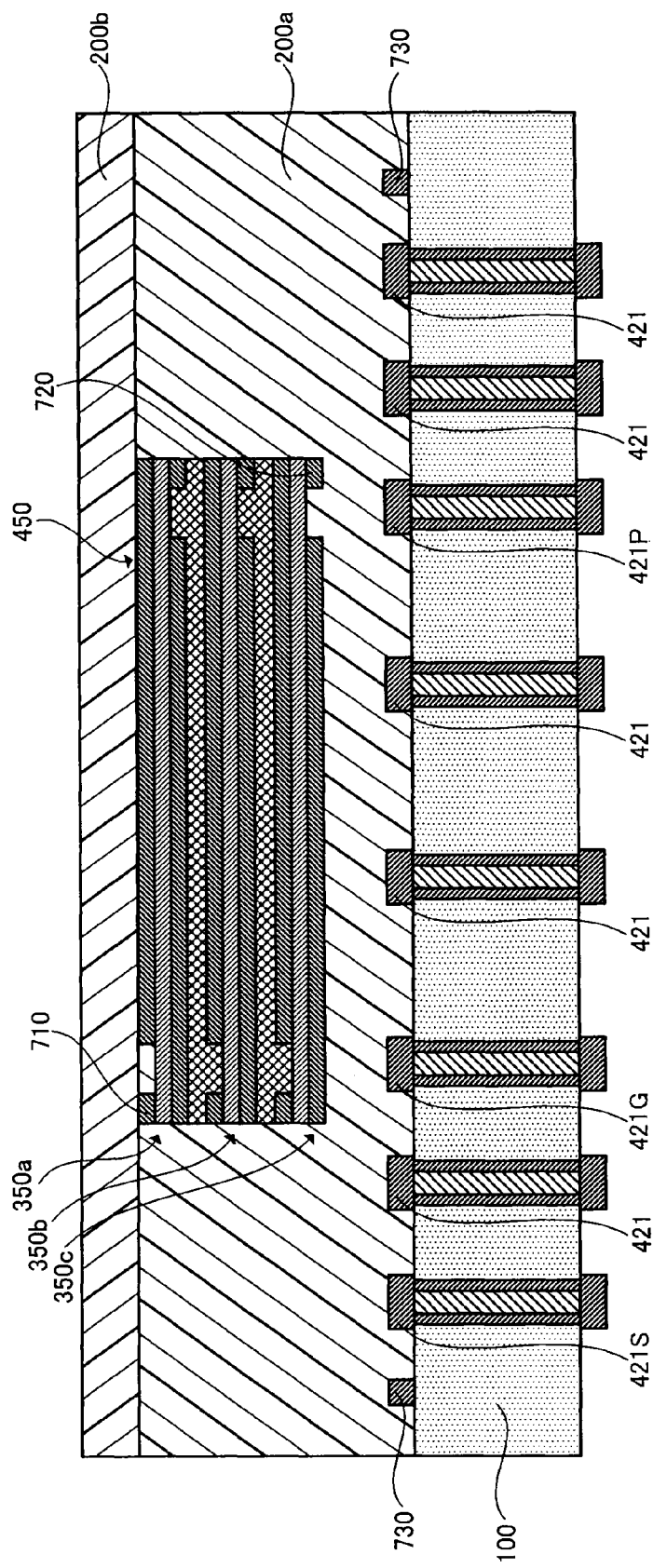
FIG. 2I is a view describing a step of manufacturing a wiring substrate pertaining to the embodiment of FIG. 1, whereby the second resin insulating layer is laminated onto the resin insulating layer.

Next, as illustrated in FIG. 2I, on the first resin insulating layer 200*a* and on the laminated capacitor 450 a resin film is attached with the use of a vacuum laminator under the lamination conditions of the temperature being 50-170° C. and the pressure being 0.4 to 1.5 MPa. For the resin film, ABF-45SH made by Ajinomoto Co., Inc., for example, can be used. Subsequently, the resin film is thermally treated at 170° C. for two hours such that it is cured to form the second resin insulating layer (the upper layer resin insulating layer) 200*b*.

Figure 2J:
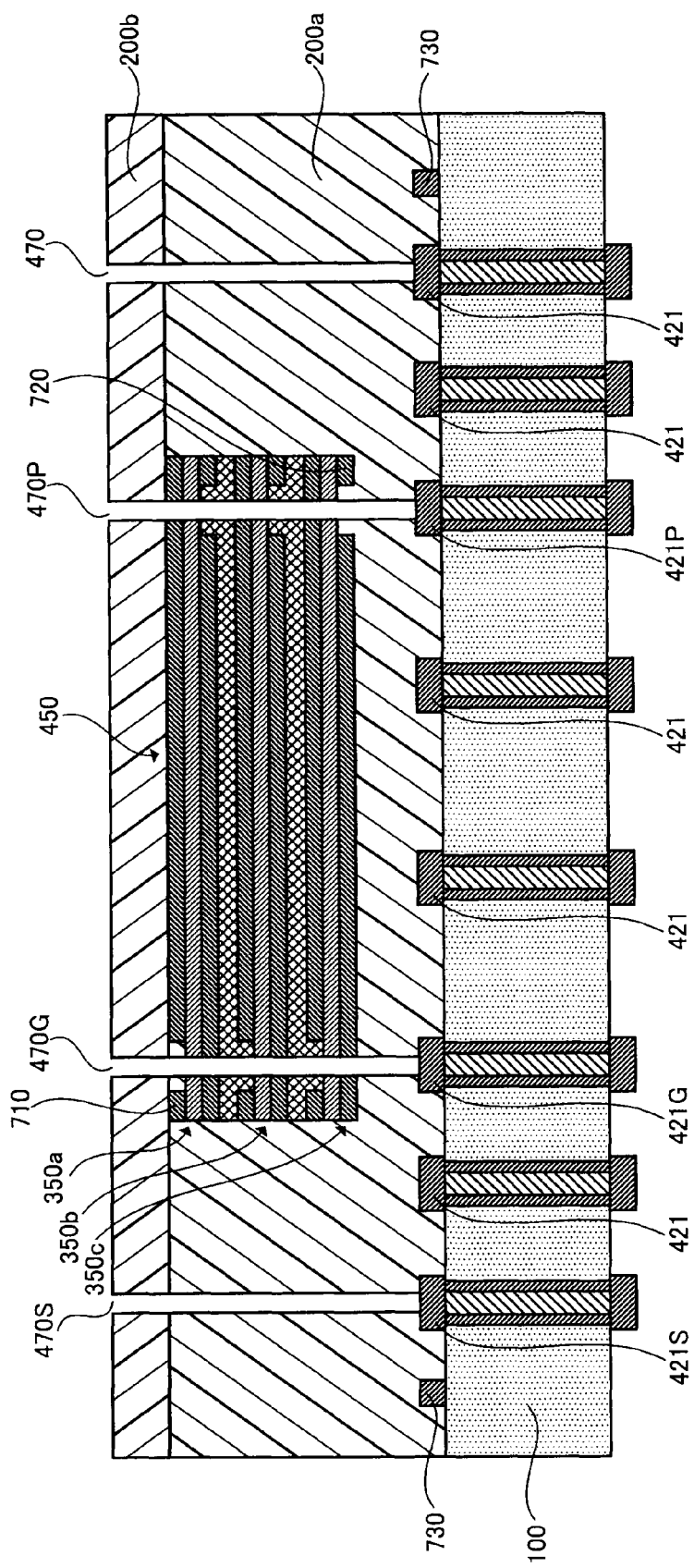
FIG. 2J is a view describing a step of manufacturing a wiring substrate pertaining to the embodiment of FIG. 1, whereby through holes are provided for via conductors in the laminated capacitor.

Next, as illustrated in FIG. 2J, with a carbon dioxide gas laser, the through holes 470 (470P, 470G, 470S) are provided penetrating the second resin insulating layer 200b, the first resin insulating layer 200a, and the laminated capacitor 450 to reach the conductor patterns 421 (the conductor patterns for power supply 421P, the conductor patterns for ground 421G, the conductor patterns for signal 421S) on the base substrate 100. Specifically the through holes 470P are through holes for power supply reaching the conductor patterns for power supply 421P, and the through holes 470G are through holes for ground reaching the conductor patterns for ground 421G. The diameters of the through holes (470P, 470G, 470) are 20 μm to 100 μm. Besides the through holes 470P and 470G, there are formed the through holes for signal 470S reaching the conductor patterns for a signal. The through holes for signal 470S are formed in the area where the laminated capacitor 450 is not present and may have a same or different diameter than the through holes 470, 470P and 470S. In addition, it is possible to provide the through holes 470 (470P, 470G, 470S) not with a carbon dioxide gas laser, but with a drill. Here, the positions of the through holes 470 (470P, 470G, 470) are determined by recognizing either of the alignment mark 730 of the base substrate 100, the alignment mark 710 of the capacitor 350a in the laminated capacitor 450, or the alignment mark 720 of the capacitor 350c (or two or more of these) in the laminated capacitor 450 with a camera or an X-ray.

Figure 2K:
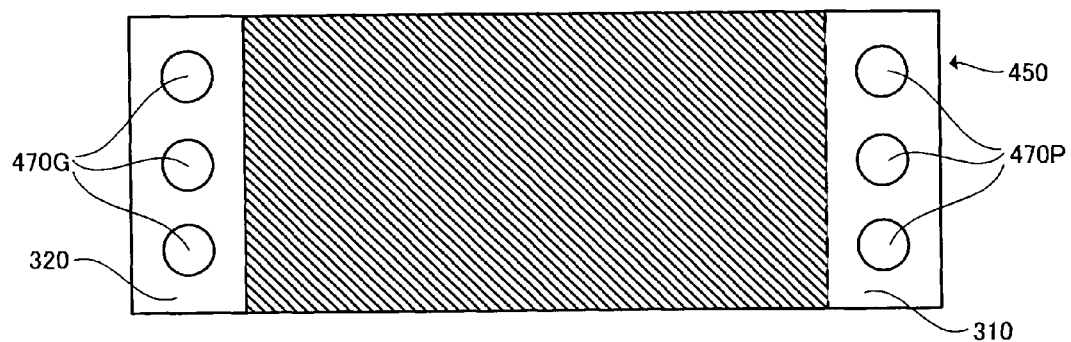
FIG. 2K is a view of an upper face of the laminated capacitor of the wiring substrate pertaining to the embodiment of FIG. 1.
Figure 2L:
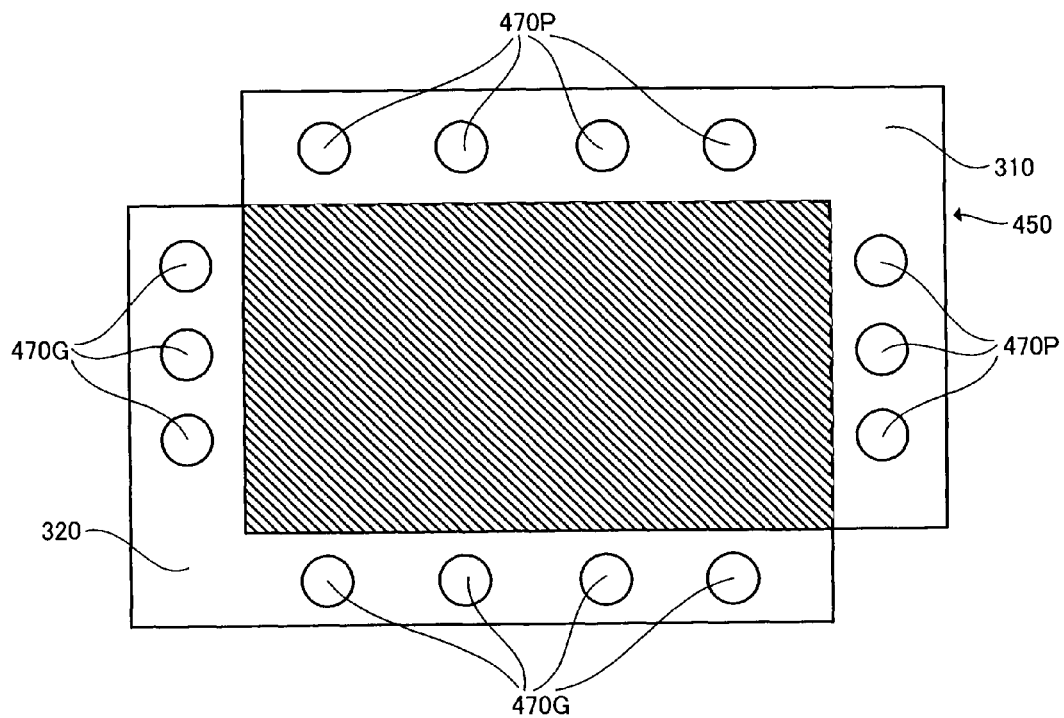
FIG. 2L is a view of an upper face of the laminated capacitor of the wiring substrate pertaining to the embodiment of FIG. 1.

As illustrated in plan views FIG. 2K and FIG. 2L, capacitors are formed where the first electrode 310 and the second electrode 320 overlap. As illustrated in FIG. 2K, it is possible for the first electrode 310 and the second electrode 320 to be offset only in the lateral direction. As illustrated in FIG. 2L, it is possible for the first electrode 310 and the second electrode 320 to be offset in the lateral direction and in the longitudinal direction. The portion where the first electrode 310 and the second electrode 320 overlap is illustrated by oblique lines. The first electrode 310 and the second electrode 320 are offset from each other in the direction of the face (or plane of the electrode) such that there are portions where they do not overlap. In the portions where they do not overlap, there are formed through holes 470P and 470G. When, the portion where the first electrode 310 and the second electrode 320 mutually oppose each other, there is not formed the through holes 470P and 470G, the area where the first electrode 310 and the second electrode 320 mutually oppose can be made large. While the through holes for power supply 470P are in contact with the first electrode 310 (the electrode for power supply), they are not in contact with the second electrode 320 (the electrode for ground). While the through holes for ground 470G are in contact with the second electrode 320, they are not in contact with the first electrode 310.

Next, a surface treatment is performed on the surface of the second resin insulating layer 200b by a catalyst.

Figure 2M:
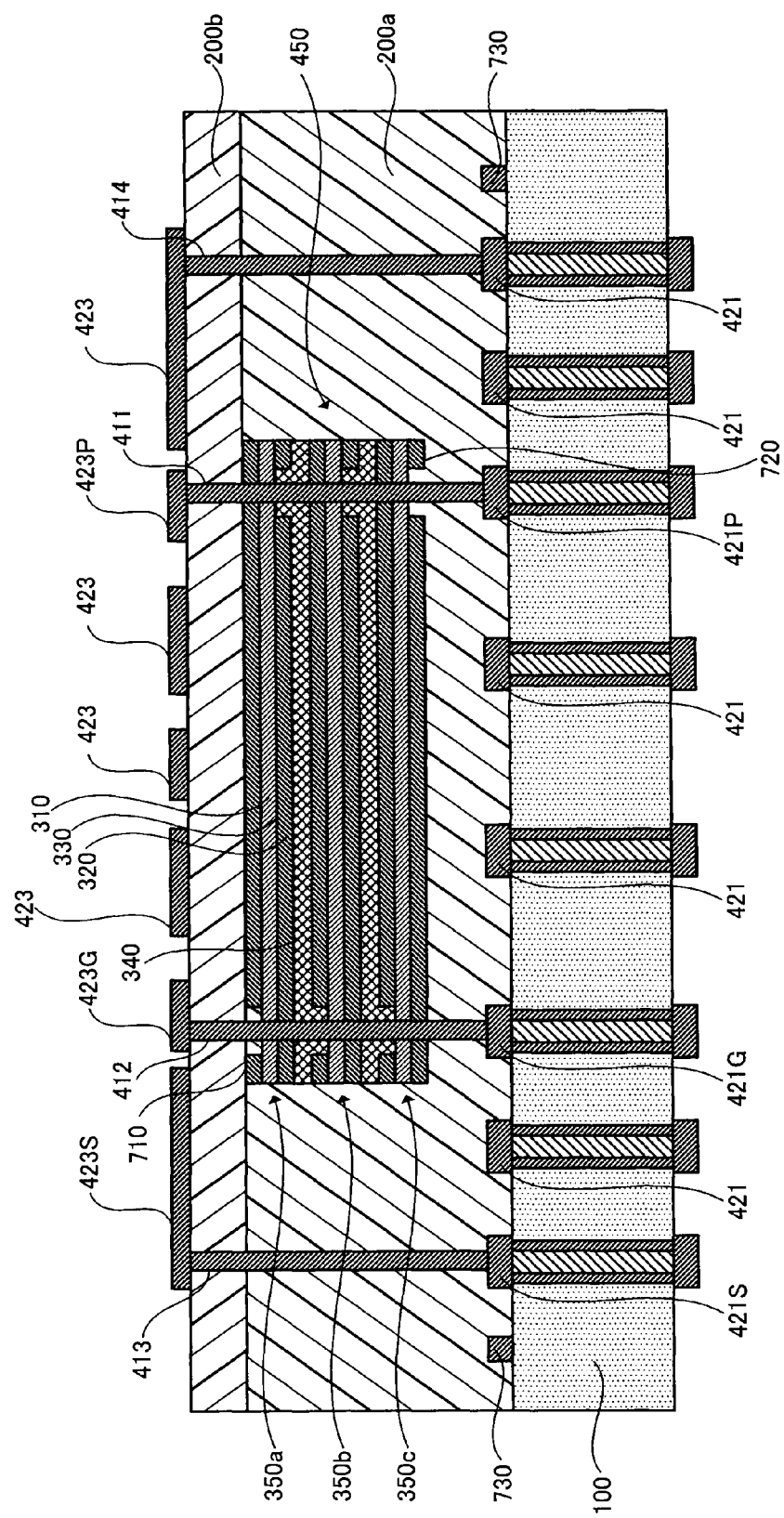
FIG. 2M is a view describing a step of manufacturing a wiring substrate pertaining to the embodiment of FIG. 1, whereby conductor patterns are provided on the second resin insulating layer.

Next, there are formed electroless plated films (electroless copper-plated films) on the surface of the second resin insulating layer 200b and on the inside wall faces of the through holes 470 (470P, 470G, 470S). Subsequently, on the electroless plated films there are formed electroplated films (electro-copper-plated films), and an etching resist is formed on the electroplated films. Through the exposure/development steps, the etching resist is patterned. In addition, a photolithography method whereby portions where patterns are formed on a resin layer and portions where the through-hole plating is protected are covered with resist in a tenting process. By etch-removing the electroplated films and the electroless plated films on the portions where etching resists are not formed, as illustrated in FIG. 2M, the conductor patterns 423 (the conductor pattern for power supply 423P, the conductor pattern for ground 423G, the conductor pattern for signal 423S) and the via conductors 411, 412, 413 are formed. The via conductors 411 are via conductors for power supply, electrically connecting, as illustrated in FIG. 2M, the first electrodes 310 of the capacitor 350a, the capacitor 350b, and the capacitor 350c to each other. The via conductors 412 are via conductors for ground, electrically connecting, as illustrated in FIG. 2M, the second electrodes 320 of the capacitor 350a, the capacitor 350b, and the capacitor 350c to each other. The via conductors for power supply 411 connect the conductor patterns for power supply 421P on the base substrate 100 and the conductor patterns for power supply 423P on the second resin insulating layer 200b. And, the via conductors for ground 412 connect the conductor patterns for ground 421G on the base substrate 100 and the conductor patterns for ground 423G on the second resin insulating layer 200b.

Figure 2N:
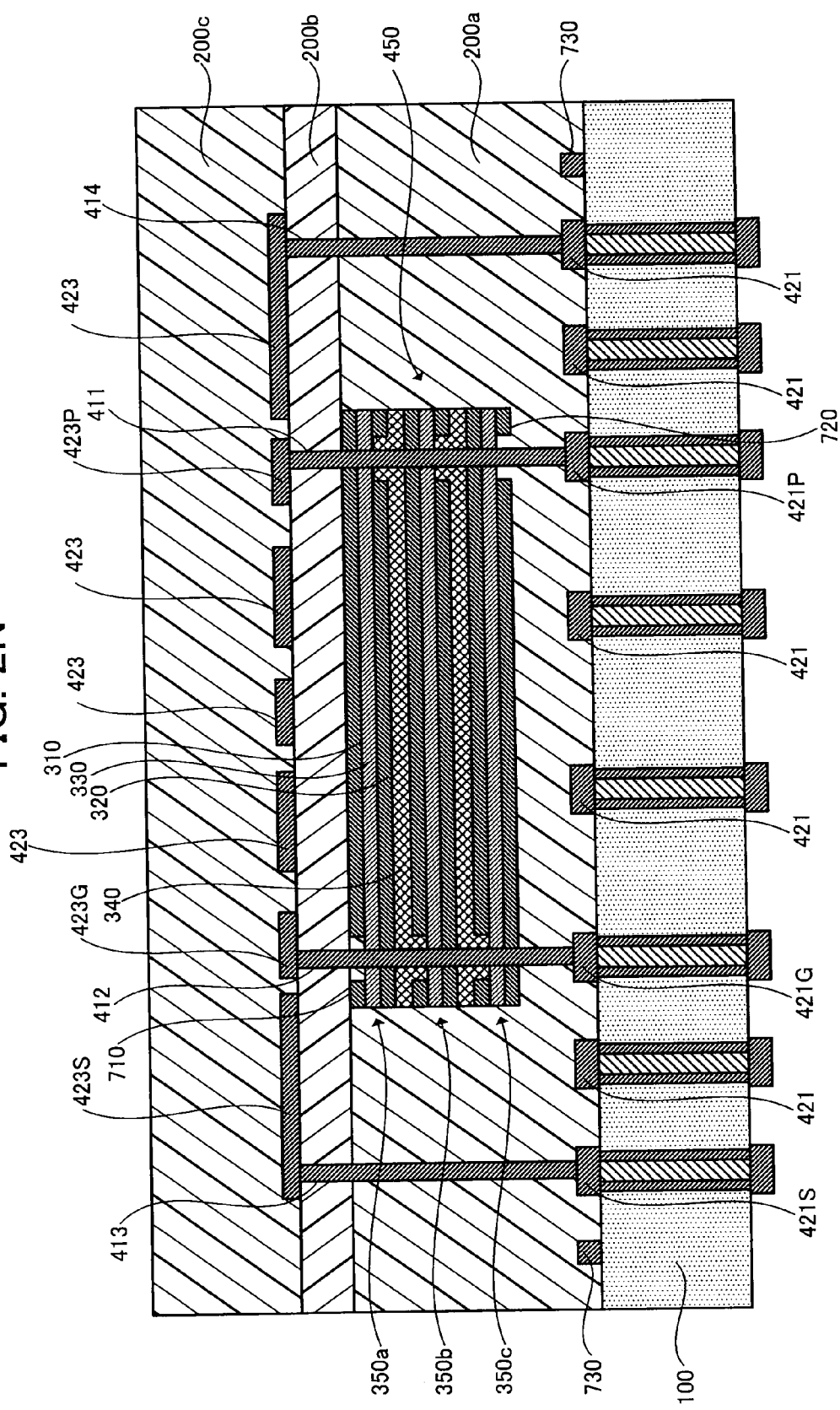
FIG. 2N is a view describing a step of manufacturing a wiring substrate pertaining to the embodiment of FIG. 1, whereby a third resin insulating layer is further laminated on the wiring substrate.

Next, as illustrated in FIG. 2N, on the second resin insulting layer 200b and on the conductor patterns 423 (423P, 423G, 423S), there is formed a third resin insulating layer 200c. For one embodiment the material for the third resin insulating layer 200c is the same as those of the second resin insulating layer 200b and the first resin insulating layer 200a.

Figure 2O:
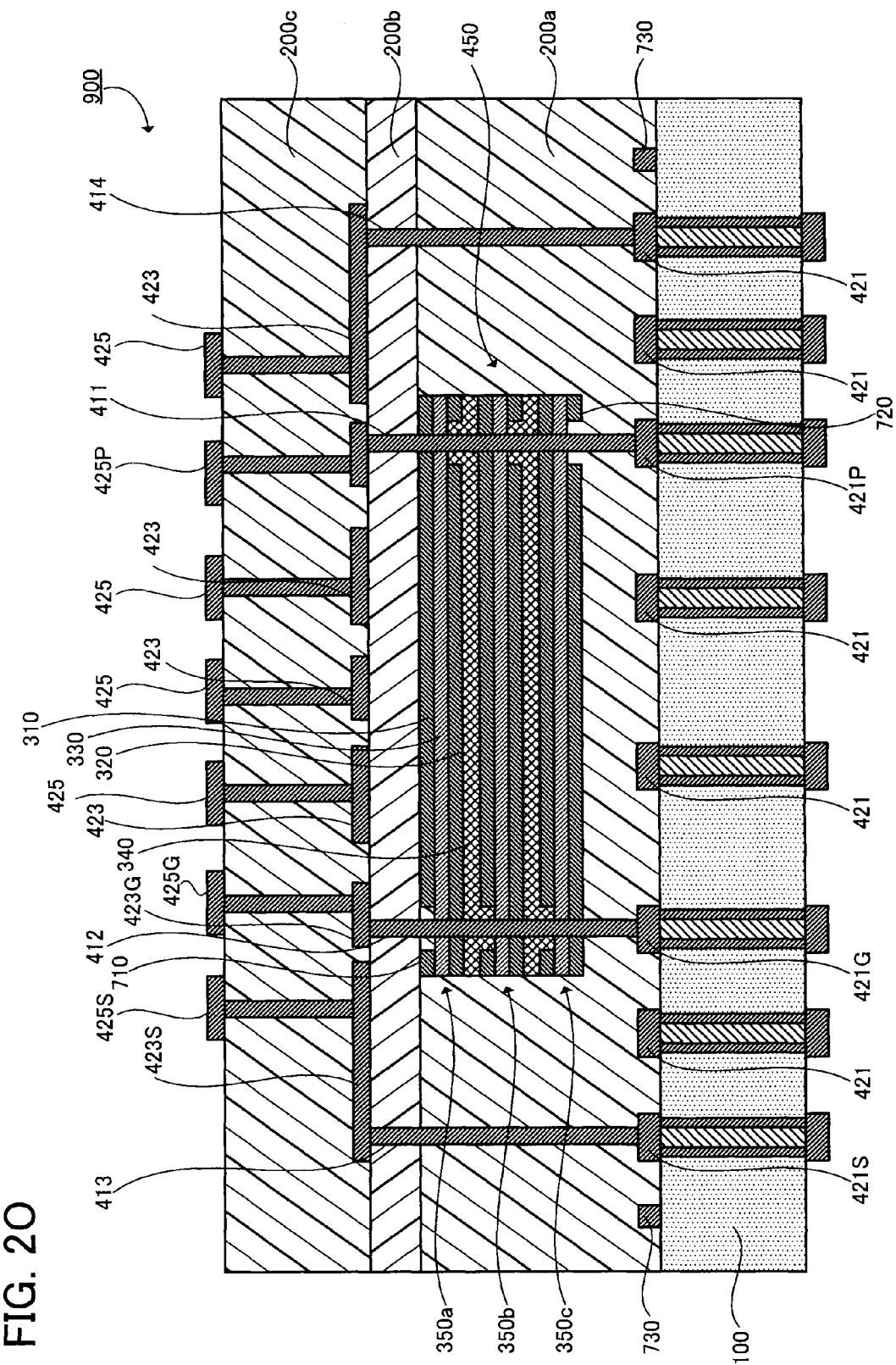
FIG. 2O is a view describing a step of manufacturing a wiring substrate pertaining to the embodiment of FIG. 1, whereby conductor patterns are provided on the third resin insulating layer.

Next, in the third resin insulating layer 200c there are formed through holes with a carbon dioxide gas laser. It is also possible to form through holes with a drill. A surface treatment is then performed on the surface of the third resin insulating layer 200c by a catalyst. Following the surface treatment by a catalyst, an electroless plated film is formed on the surface of the substrate, and a plated resist is formed on the electroless plated film. Following that, the plated resist is treated with exposure and development to pattern the plated resist and, on the areas where the plated resist is not formed there are formed electro-plated films. After the plated resist is stripped, there are provided, as illustrated in FIG. 2O, the outermost conductor patterns 425 (the outermost conductor patterns for power supply 425P, the outermost conductor patterns for ground 425G, the outermost conductor patterns for signal 425S). These conductor patterns are made of electroless plated film and electro-plated film provided on said electroless plated film by removing the electroless plated film between the electroplated films.

Figure 2P:
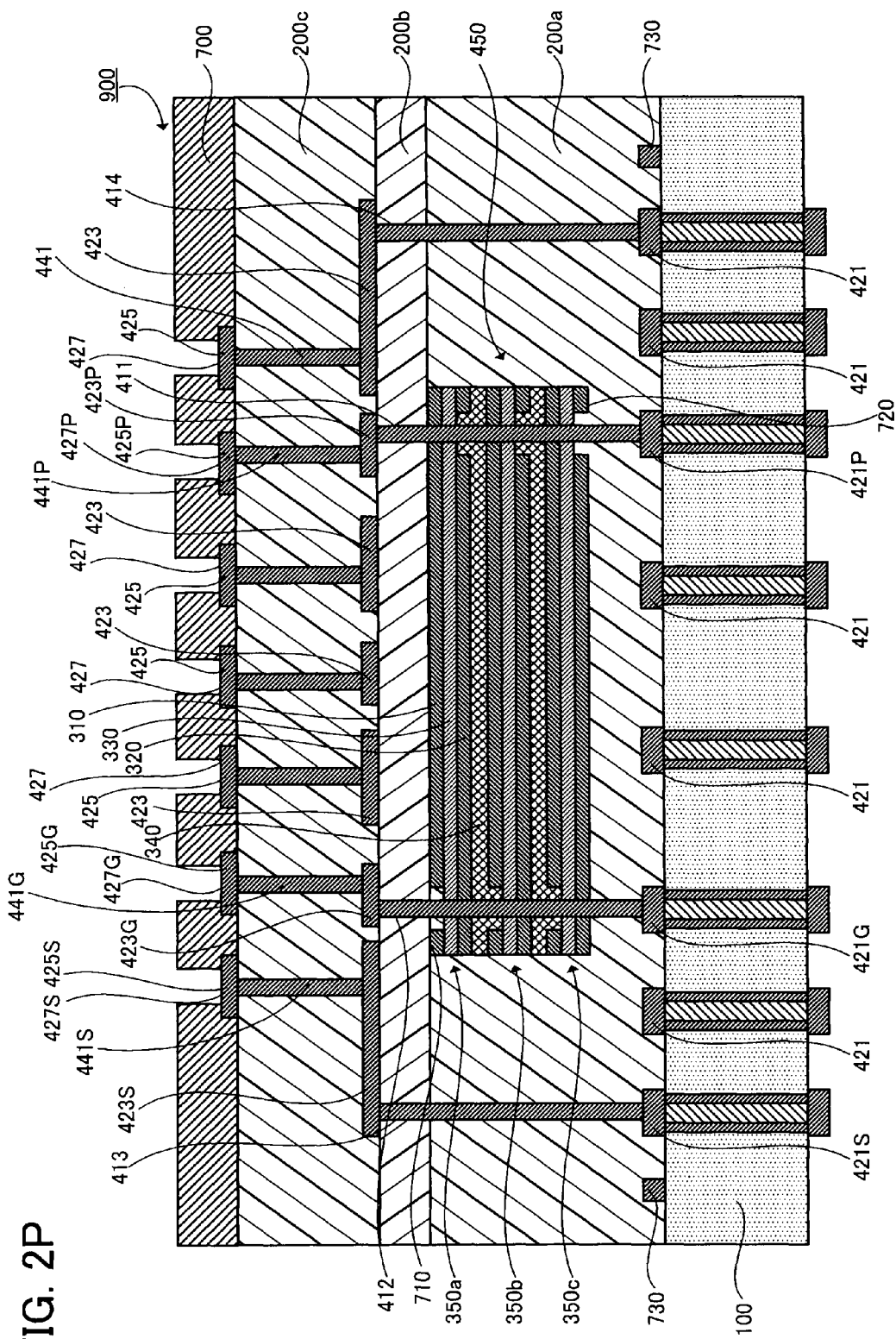
FIG. 2P is a view describing a step of manufacturing a wiring substrate pertaining to the embodiment of FIG. 1, whereby a plurality of opening portions are provided in a solder resist.

Next, on the third resin insulating layer 200c and the outermost conductor patterns 425 (425P, 425G, 425S) there is formed a solder resist. Subsequently, as illustrated in FIG. 2P, opening portions are provided in the solder resist 700 to expose portions of the conductor patterns 425 (425P, 425G, 425S) such that the pads 427, the pads for power supply (the first external terminals) 427P, the pads for ground (the second external terminals) 427G, and the pads for signal 427S) are formed. The portions exposed from the opening portions constitute the pads 427 (427P, 427G, 427S). As also illustrated in FIG. 2P, the first electrodes 310 and the pads for power supply 427P are connected by way of the via conductors 411, the conductor patterns 423P, and the via conductors 441P. And, the second electrodes 320 and the pads for ground 427G are connected by way of the via conductors 412, the conductor patterns 423G, and the via conductors 441G.

Next, on the pads 427 (427P, 427G, 427S), there is formed anti-corrosive metal films (not shown). As metal films, films made of Ni, Au, Pd, Ag, Pt, etc., for example, can be formed. In the present embodiment, Ni film, Pd film, and Au film are formed in that order. In addition, the metal films may be of one layer or of a plurality of metal films. To illustrate, Ni film and Au film can be formed on the pads in that order.

Figure 2Q:
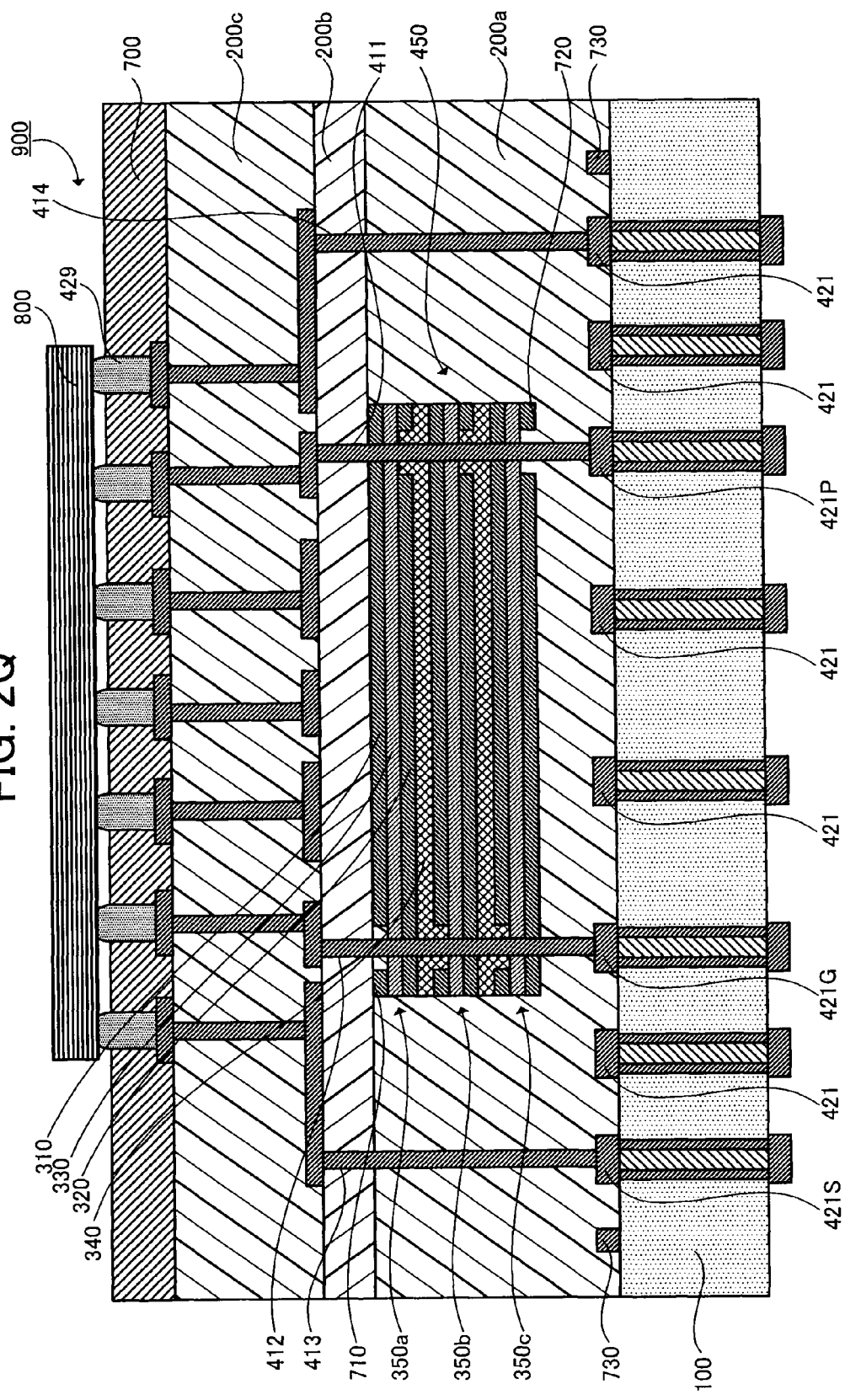
FIG. 2Q is a view describing a step of manufacturing a wiring substrate pertaining to the embodiment of FIG. 1, whereby an integrated circuit (IC) chip is mounted via solder bumps.

Next, on the metal films, solder paste is printed and is subsequently reflowed to provide the solder bumps such that the wiring substrate 900 illustrated in FIG. 1 is obtained. The IC chip 800 is mounted via the solder bumps 429, as illustrated in FIG. 2Q.

Figure 2R:
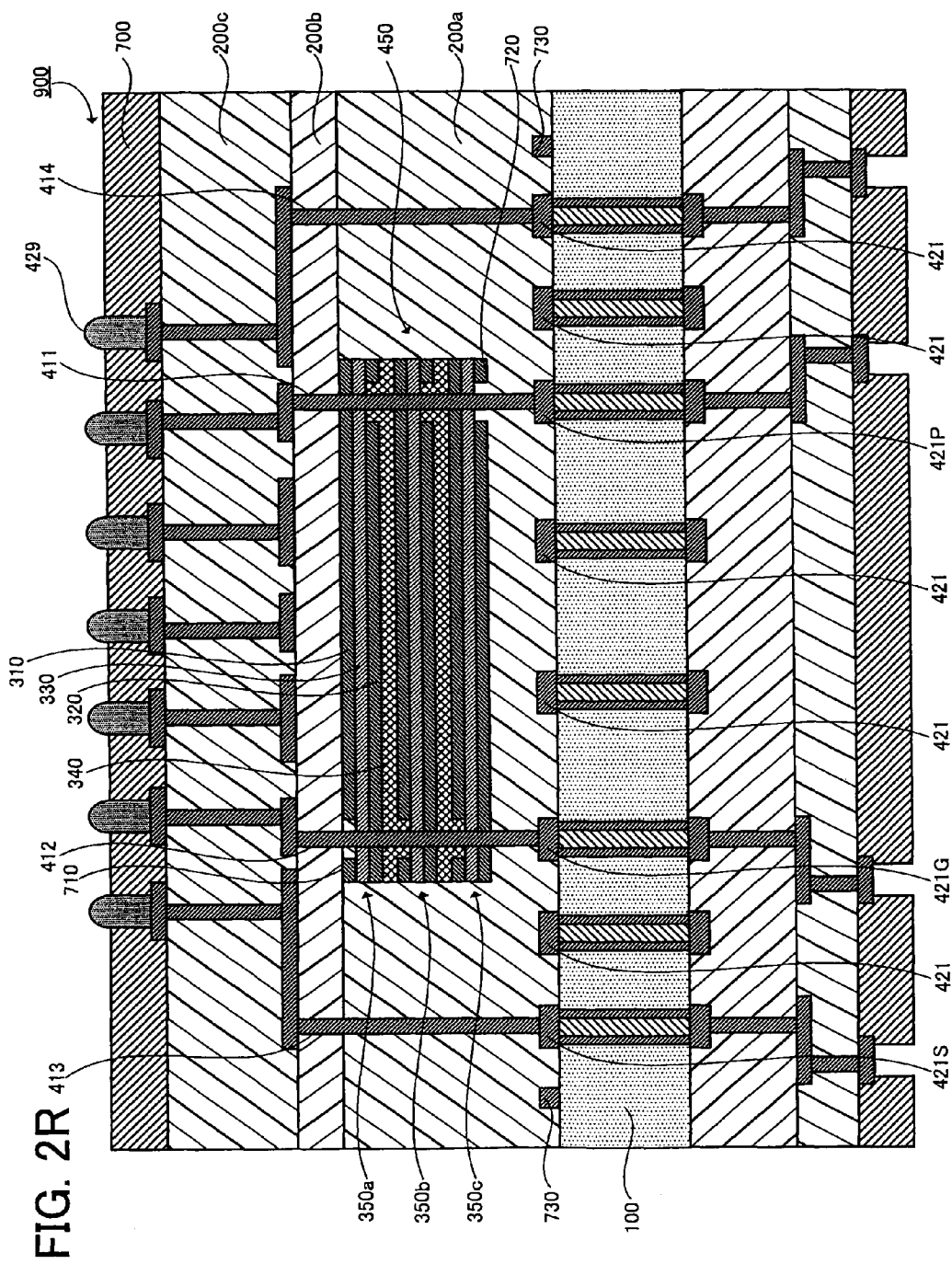
FIG. 2R is a view describing a step of manufacturing a wiring substrate pertaining to the embodiment of FIG. 1, whereby a resin layer is provided also on a lower face of the base substrate.

While in accordance with the above-described embodiment, the resin insulating layers, conductors patterns, and the via conductors are formed on only one face of the base substrate 100, it is possible to form the resin insulating layers, the conductor patterns, and the via conductors on both faces of the base substrate 100, as illustrated in FIG. 2R. Further, it is preferred that the surfaces of the resin insluting layers 200a, 200b, 200c, the surfaces of the conductor patterns, the surfaces of the first electrodes 310, and the surfaces of the second electrodes 320 are roughened. Still further, when the IC chip 800 is mounted on the surface of the wiring substrate 900, it is preferred that the distance between the laminated capacitor 450 and the IC chip 800 is short.

Figure 3:
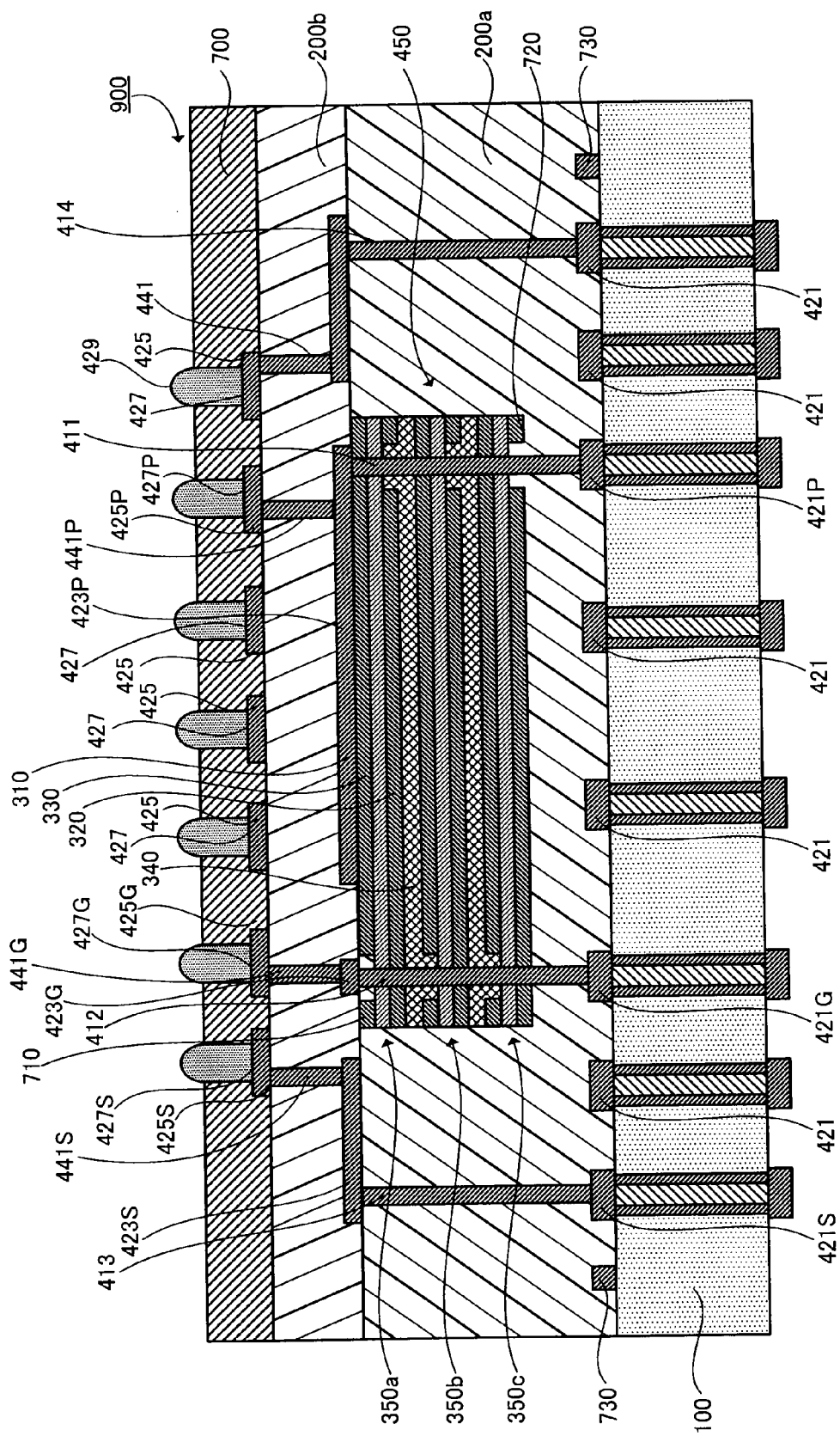
FIG. 3 is a sectional view of a wiring substrate pertaining to another embodiment in accordance with the present invention.

FIG. 3 illustrates a wiring substrate according to another embodiment of the invention. In the embodiment of FIG. 1, the resin insulating layers 200 consisted of the first resin insulating layer 200a, the second resin insulating layer 200b, and the third resin insulating layer 200c. The wiring substrate 900 relating to the embodiment of FIG. 3 differs in that the resin insulating layers 200 consist of the first resin insulating layer 200a and the second resin insulating layer 200b.

Further, the electrode positioned at the uppermost layer of the laminated capacitor 450 is formed such that the first electrode 310 of the capacitor 350a and the conductor patterns for power supply 423P on said first electrode 310 are integrated. Accordingly, in the wiring substrate 900 relating to the embodiment of FIG. 3, the thickness of the electrode present on the surface layer of the laminated capacitor 450 is thicker than the wiring substrate 900 relating to the embodiment of FIG. 1. Accordingly, the rigidity of the laminated capacitor 450 is enhanced in FIG. 3. Thus, the dielectric layer of the laminated capacitor 450 is less susceptible to the occurrence of cracks and manufacturing yield can be improved.

As illustrated in FIG. 3, the pads for power supply (the first external terminals) 427P and the first electrode 310 of each of the capacitors 350a, 350b, and 350c are electrically connected by way of the via conductors 441P, the conductor patterns 423P, and the via conductors 411. The pads for ground (the second external terminals) 427G and the second electrode 320 of each of the capacitors 350a, 350b, and 350c are electrically connected by way of the via conductors 441G, the conductor patterns 423G, and the via conductors 412. On the second resin insulating layer 200b there are provided the outermost conductor patterns for power supply 425P, the outermost conductor patterns for ground 425G, and the outermost conductor patterns for signal 425S. Opening portions are provided in the solder resist 700 to expose portions of the conductor patterns 425 (425P, 425G, 425S) such that the pads 427 (the pads for power supply (the first external terminals) 427P, the pads for ground (the second external terminals) 427G, the pads for signal 427P) are formed.

Figure 4A:
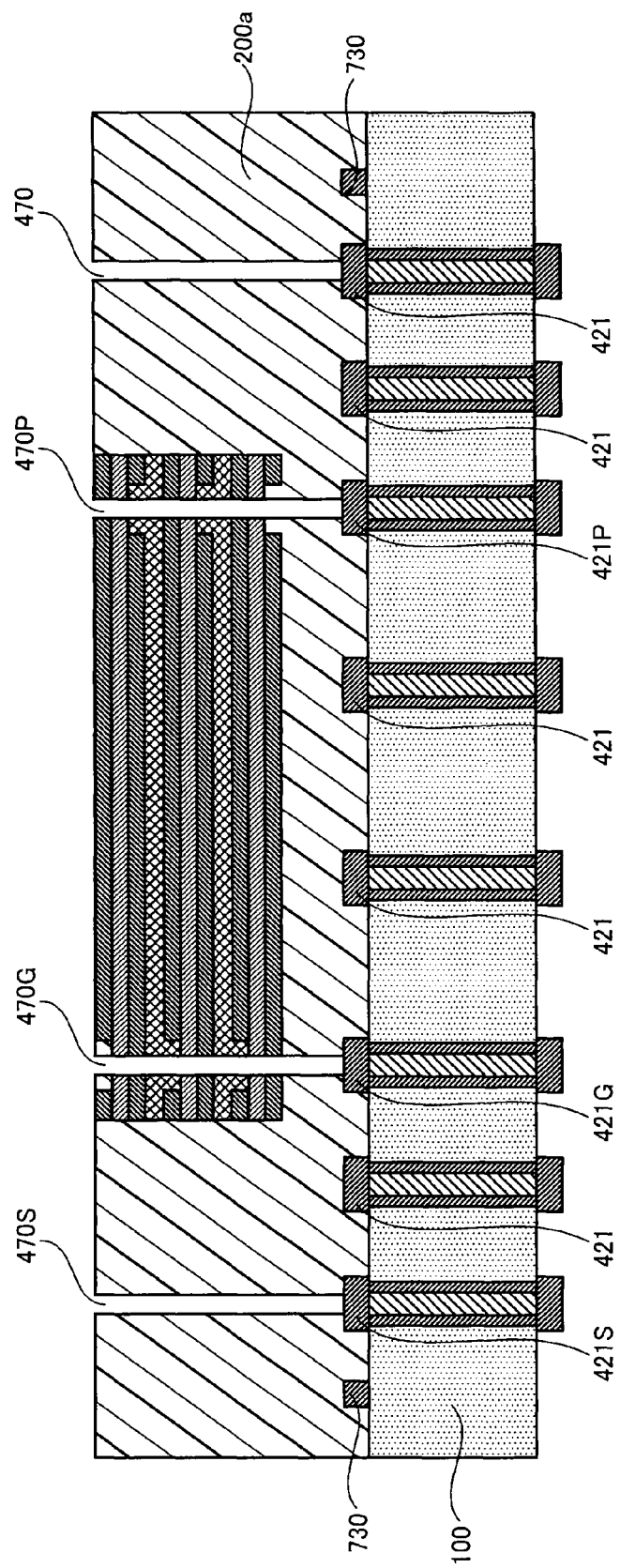
FIG. 4A is a view describing a step of manufacturing a wiring substrate pertaining to the embodiment of FIG. 3, whereby through holes for via conductors are provided in the laminated capacitor.

A method of manufacturing a wiring substrate relating to the embodiment of FIG. 3 will now be illustrated. This method is the same as the above-described method of manufacturing a wiring substrate as to FIG. 2A through FIG. 2G. However, thereafter, as shown in FIG. 4A, in the substrate prepared by the steps up to FIG. 2G, there are formed the through holes 470 (the through holes 470P reaching the conductor patterns for power supply on the core substrate, the through holes 470G reaching the conductor patterns for ground on the core substrate and the through holes 470S reaching the conductor patterns for signal on the core substrate). In the manufacturing method relating to the embodiment of FIG. 1, through holes were concurrently formed in the second resin insulating layer 200b as well. However, since in the manufacturing method relating to the present embodiment, through holes are formed penetrating only the laminated capacitor 450 and the first resin insulating layer 200a, easy hole processing and an improved manufacturing yield can be achieved. A surface treatment is performed by a catalyst on the surface of the first resin insulating layer 200a in which the through holes 470 are formed.

Figure 4B:
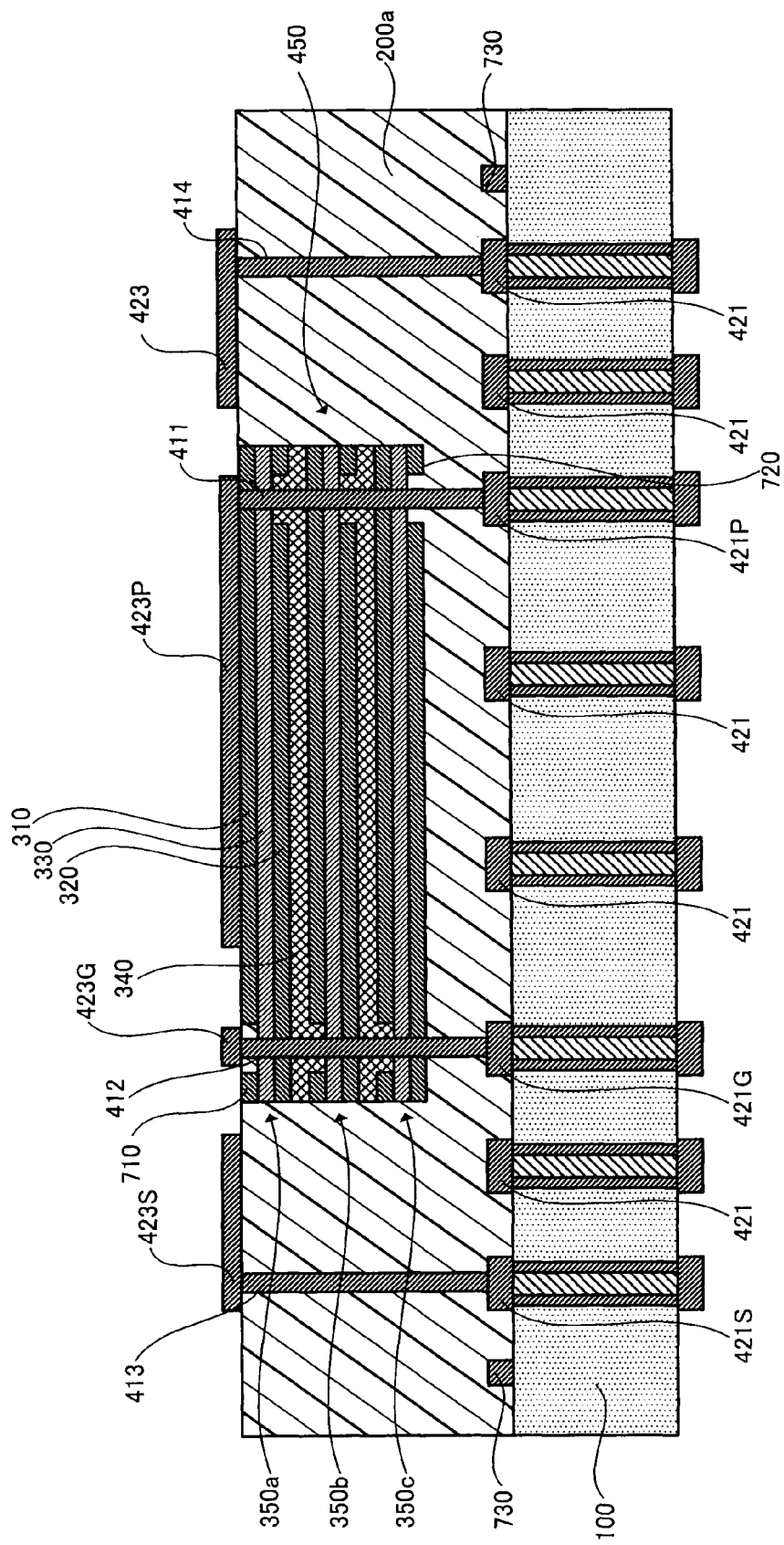
FIG. 4B is a view describing a step of manufacturing a wiring substrate pertaining to the embodiment of FIG. 3, whereby conductor patterns are provided on an upper faces of the laminated capacitor and an upper face of the resin insulating layer.

Next, as illustrated in FIG. 4B, the via conductors for ground 412, the via conductors for power supply 411, the via conductors for signal 413, and the conductor patterns 423 (the conductor patterns for power supply 423P, the conductor patterns for ground 423G, the conductor patterns for signal 423S) are formed with the tenting process. As also illustrated in FIG. 4B, the electrode positioned at the uppermost layer of the laminated capacitor 450 is formed such that the first electrode 310 of the capacitor 350a and the conductor patterns for power supply 423P on said first electrode 310 are integrated. Here, the electrode positioned at the uppermost layer of the laminated capacitor 450 refers to the electrode at the surface layer of the capacitor 450 positioned on the side close to the IC chip 800 to be mounted. And, the conductor patterns for power supply 423P on the first electrode 310 are formed of an electroless plated film and an electroplated film on said electroless plated film.

The via conductors 412 connect the second electrodes 320 of the capacitor 350a, the capacitor 350b, and the capacitor 350c to each other. And, the via conductors 412 connect the conductor patterns for ground 421G on the base substrate 100 and the conductor patterns for ground 423G on the first resin insluting layer 200a. The via conductors 411 connect the first electrodes 310 of the capacitor 350a, the capacitor 350b, and the capacitor 350c to each other. And, the via conductors 411 connect the conductor patterns for power supply 421P on the base substrate 100 and the conductor patterns for power supply 423P on the first resin insluting layer 200a.

Figure 4C:
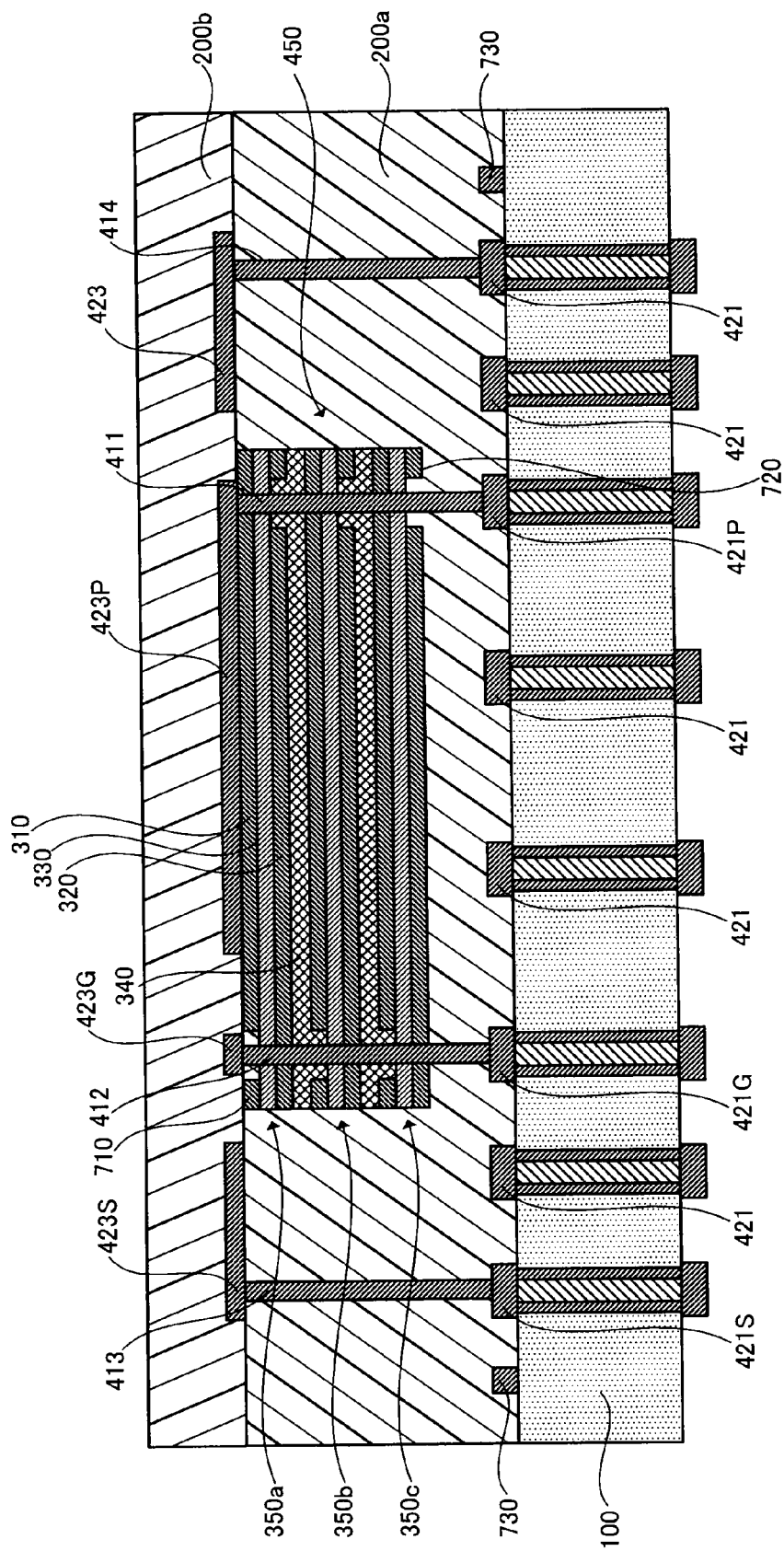
FIG. 4C is a view describing a step of manufacturing a wiring substrate pertaining to the embodiment of FIG. 3, whereby a second resin insulating layer is further provided on the wiring substrate.

Next, as illustrated in FIG. 4C, on the first resin insluting layer 200a, the laminated capacitor 450, and the conductor patterns 423 (423P, 423G, 423S) there is formed the second resin insulating layer 200b. And, in the second resin insulating layer 200b there are formed through holes. A surface treatment is performed with a catalyst on the surface of the substrate in which through holes are formed.

Following the surface treatment with a catalyst, there is formed an electroless plated film on the surface of the substrate, and a plated resist is formed on the electroless plated film. Following that, the plated resist is treated with exposure and development to pattern the plated resist, and, on the areas where the plated resist is not formed there is formed an electroplated film. After the plated resist is stripped, there are provided the conductor patterns 425 (425P, 425G, 425S) made of an electroless plated film and an electroplated film on the electroless plated film by removing the electroless plated film between the electroplated films. Following that, as in the case with the first embodiment, the solder resist 700, the pads 427, and the solder bumps 429 are formed to obtain the wiring substrate 900 illustrated in FIG. 3.

Figure 4D:
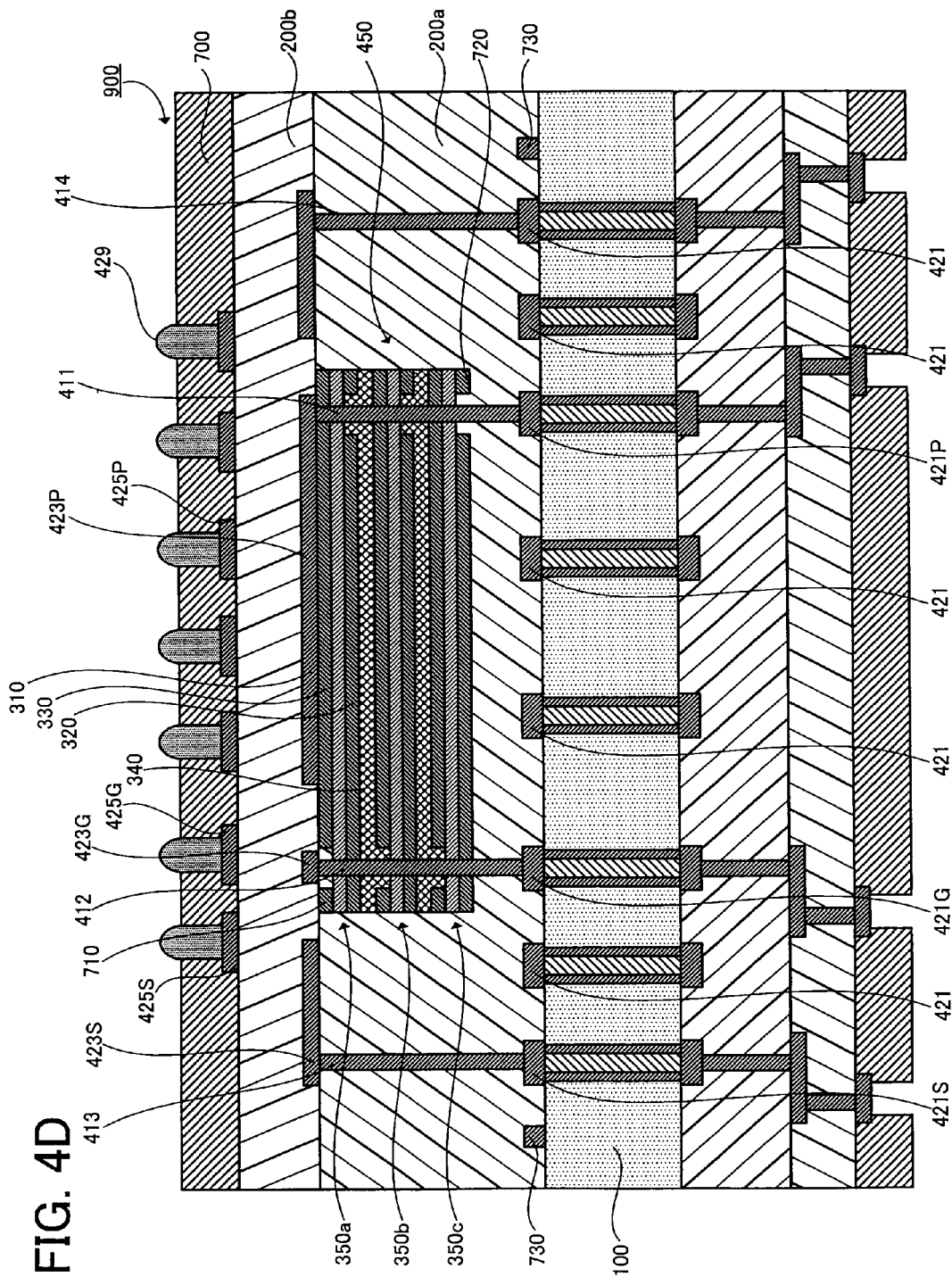
FIG. 4D is a view describing a step of manufacturing a wiring substrate pertaining to the embodiment of FIG. 3, whereby a resin layer is provided on a lower face of the base substrate.

In accordance with the method of manufacturing a wiring substrate relating to the embodiment of FIG. 3, it is possible to manufacture the wiring substrate 900 at a reduced cost since the wiring substrate can be manufactured with one less resin insulating layer as compared to the embodiment of FIG. 1. In addition, while in the above-described embodiment, the resin insulating layers, conductors patterns, and the via conductors are formed on only one face of the base substrate 100, it is possible to form the resin insulating layers, the conductor patterns, and the via conductors on both faces of the base substrate 100, as illustrated in FIG. 4D.

A wiring substrate according to still another embodiment is illustrated in FIG. 5. In this embodiment, the first electrodes and the second electrodes 320 are not offset from each other in the direction of the face (or a direction of a plane of an electrode), unlike the embodiment of FIG. 1. Also in the first electrodes 310 there are provided a plurality of the first opening portions 311, and in the second electrodes 320 there are provided a plurality of the second opening portions 322. A plurality of first via conductors 411 electrically connect the first electrodes 310 while passing through the second opening portions 322 without being in contact with the second electrodes 320. A plurality of the second via conductors 412 electrically connect the second electrodes 320 while passing through the first opening portions 311 without being in contact with the first electrodes 310. As such, a plurality of the first via conductors 411 and a plurality of the second via conductors 412 penetrate the laminated capacitor 450. Accordingly, in the wiring substrate 900 relating to the embodiment of FIG. 5, it is possible for a plurality of the first via conductors 411 and a plurality of the second via conductors 412 to control the deformation of the adhesive 340 such that the anti-crack property of the laminated capacitor 450 is likely to be improved.

Namely, when the dielectric layer 330 of each of the capacitors (350*a*, 350*b*, 350*c*) and the adhesive adhering each of the capacitors (350*a*, 350*b*, 350*c*) differ in thermal expansion coefficient, forces such as warpage, torsion, and flexure are applied to the dielectric layers 330 when a change in temperature occurs in the laminated capacitor 450. When those forces are applied, the dielectric layers 330 made of ceramics are thin and bridle, and cracks are likely to occur thereto. However, in the present embodiment, since a plurality of the first via conductors 411 and a plurality of the second conductors 412 are physically linking each of the capacitors (350*a*, 350*b*, 350*c*) by penetrating the laminated capacitor 450, it is possible to control the deformation of the adhesive 340. Accordingly, forces such as warpage, torsion and flexure being applied to the dielectric layers 330 become small.

Figure 6B:
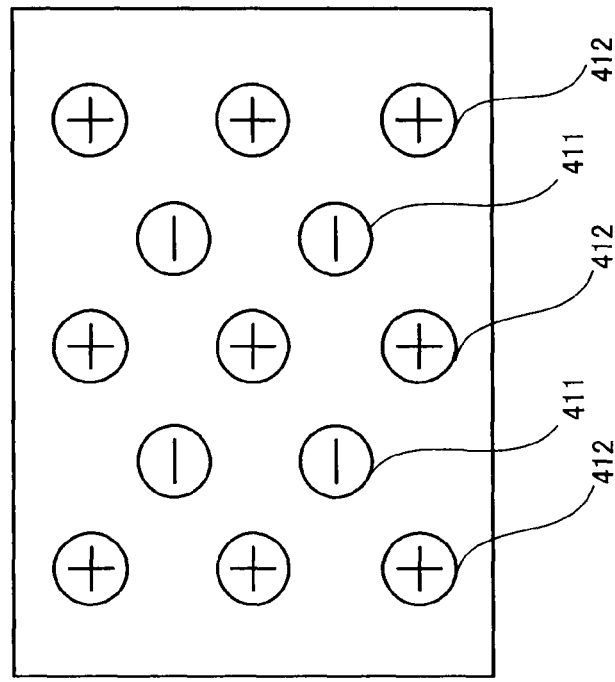
FIG. 6B is a view describing via conductors provided in a lattice pattern through the laminated capacitor of the wiring substrate pertaining to the embodiment of FIG. 5.
Figure 6A:
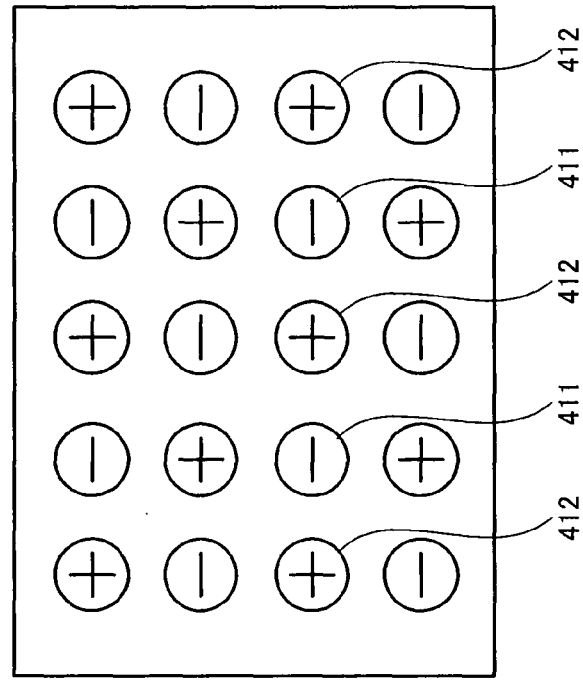
FIG. 6A is a view describing via conductors provided in a grid pattern through the laminated capacitor of the wiring substrate pertaining to the embodiment of FIG. 5.

As illustrated in FIG. 6A and FIG. 6B, it is preferred that the via conductors for power supply 411 and the via conductors for ground 412 are disposed in a grid pattern or lattice pattern. The distances between adjacent via conductors for power supply 411 are roughly the same, and the distances between adjacent via conductors for ground 412 are roughly the same.

A method of manufacturing a wiring substrate relating to the third embodiment of FIG. 5 is now described.

First, as illustrated in FIG. 7A, a capacitor 350 including the first electrode material 309, the second electrode material 319, and the dielectric layer 330 sandwiched between the first electrode material 309 and the second electrode material 319 is formed. The capacitor 350 is formed likewise as with the embodiment of FIG. 1.

Next, as illustrated in FIG. 7B-7D, (FIG. 7C being a plan view viewing the capacitor 350 from the first electrode 310 side, and in FIG. 7D being a plan view viewing the capacitor 350 from the second electrode 320 side), the first electrode material 309 and the second electrode material 319 are patterned. At this time, the alignment marks 710 and 720 are concurrently formed. In the first electrode 310 there are formed the opening portions 311 and inside the opening portions 311 thereof there will be formed via conductors for ground 412. As seen in FIG. 5, the first electrode 310 and the via conductors for ground 412 are not in contact. In the second electrode 320 there are formed the opening portions 322, and portions 322 thereof there will be formed via conductors for power supply 411. The second electrode 320 and the via conductors for power supply 411 are not in contact.

Next, as illustrated in FIG. 7E, three discrete capacitors 350 obtained by the preceding step are prepared, and laminated via the adhesive 340. The capacitors 350*a*, 350*b*, and 350*c* are aligned based on the alignment marks 710, 720 of each of the capacitors 350.

As illustrated in FIG. 7F, the laminated capacitor 450 having the capacitors 350*a*, 350*b*, 350*c* and the adhesive 340 disposed in between the capacitors is formed. The laminated capacitor 450 is formed with a vacuum press. The conditions for the vacuum press are the temperatures being 50 to 170° C. and the pressure being 0.4 to 1.5 MPa. The opening portions 311 of each of the capacitors constituting the laminated capacitor 450 are formed at nearly the same positions in the sectional direction such that the first electrodes 310 and the second electrodes 320 are not short-circuited by the via conductors 412 that will penetrate the laminated capacitor 450. Namely, as illustrated in FIG. 7F, the opening portions 311 formed in the capacitors 350*a*, 350*b*, 350*c* are provided at the positions that overlap each other in the sectional direction. The opening portions 322 of each of the capacitors constituting the laminated capacitor 450 are formed at nearly the same positions in the sectional direction such that the first electrodes 310 and the second electrodes 320 are not short-circuited by the via conductors 411 that will penetrate the laminated capacitor 450. Namely, in FIG. 7F, the opening portions 322 formed in the capacitors 350*a*, 350*b*, 350*c* are provided at the positions that overlap each other in the sectional direction.

Next, as illustrated in FIG. 7G, the laminated capacitor 450 is embedded in the first resin insulating layer 200*a*. As illustrated in FIG. 7H, the through holes 470 (470P, 470G, 470S) are then formed. The through holes 470 (470P, 470G, 470S) pass through the laminated capacitor 450 and the first resin insulating layer 200*a*, and reach the conductor patterns 421 (421P, 421G, 421S) of the base substrate 100. As to the positions for the through holes 470 (470P, 470G, 470S), they are formed by the laser processing with one of the alignment mark 730 of the base substrate 100 and the alignment marks 710, 720 formed on the laminated capacitor 450 as the basis for alignment. The through holes for power supply 470P run through the first electrodes 310 and the dielectric layers 330, and the through holes for power supply 470P are formed inside the opening portions 322 of the second electrodes 320, and not in contact with the inside walls of the opening portions 322. The through holes for ground 470G pass through the second electrodes 320 and the dielectric layers 330, and the through holes for ground 470G are formed inside the opening portions 311 of the first electrodes 310, and not in contact with the inside walls of the opening portions 311.

Next, as illustrated in FIG. 7I, the via conductors for ground 412, the via conductors for power supply 411, the via conductors for signal 413, and the conductor patterns 423 (the conductor patterns for power supply 423P, the conductor patterns for ground 423G, the conductor patterns for signal 423S) are formed with a tenting process. The conductor patterns 423 (the conductor patterns for power supply 423P, the conductor patterns for ground 423G, the conductor patterns for signal 423S) include electroless plated films and electroplated films on said electroless plated films. The uppermost layer electrode of the laminated capacitor 450 is formed such that the first electrode 310 of the capacitor 350*a* and the conductor patterns for power supply 423P (the electroless plated films on the first electrode 310 and the electroplated films on said electroless plated films) are integrated. The uppermost layer electrode of the laminated capacitor 450 refers to the surface layer electrode being of the laminated capacitor 450 being positioned at the close side to the IC chip to be mounted.

Next, following the via conductors and the conductor patterns being formed, the wiring substrate illustrated in FIG. 5 is obtained by the steps illustrated in FIG. 4C and FIG. 4D.

A wiring substrate 900 relating to yet another embodiment in accordance with the present invention is illustrated in FIG. 8. The wiring substrate 900 relating to this embodiment is such, unlike the wiring substrate 900 relating to the embodiment of FIG. 1, that the base substrate (core substrate) 100 having a core material such as glass cloth and fiber glass is not provided. Accordingly, all the insulating layers can be resin insulating layers (resin films). Thus, the capacitor substrate with a built-in capacitor can be made thin in accordance with the wiring substrate 900 relating to the embodiment of FIG. 8. Further, the distance between the external power supply and the laminated capacitor 450 built in the wiring substrate and the distance between a chip capacitor (not shown) mounted on the surface of the wiring substrate 900 and the laminated capacitor 450 can be made short.

A method of manufacturing a wiring substrate according to the embodiment of FIG. 8 will now be described. First, as illustrated in FIG. 9A, a support board 150 is prepared. The support board is a copper board, for example. In addition, it is possible to use, other than copper, a metal board such as a nickel board, an aluminum board, and an iron board for the support board 150 material.

Next, as illustrated in FIG. 9B, the plated resist 160 is formed on the support board 150. As illustrated in FIG. 9C, a plurality of opening portions are then provided in the plated resist 160 by the plated resist 160 being patterned with the exposure and development steps.

Next, as illustrated in FIG. 9D, the opening portions provided in the plated resist 160 are electroplated with gold-plated film 911, nickel-plated film 912, and copper-plated film 913 in that order, and there are formed the first external connection terminals 600, the external terminals for power supply (the first external terminals) 600P, the external terminals for ground (the second external terminals) 600G, the external terminals for signal 600S. Concurrently, on the support board 150 there is formed alignment mark (the first alignment mark) 621. In addition, it is possible to form a palladium film between the gold-plated film 911 and the nickel-plated film 912.

As illustrated in FIG. 9E, the plated resist 160 is stripped and the resin film (the first lower resin insulating layer) 400d is formed. This first lower resin insulating layer (the lowest layer resin insulation) 400d is present, as illustrated in FIG. 8, below the first resin insulating layer 400a having the laminated capacitor 450 built in. As illustrated in FIG. 9E, the first external terminals 600 (600P, 600G, 600S) are embedded in the resin insulating layer (the first lower resin insulating layer) having a first face and a second face which is on an opposite side from the first face. The surfaces of the first external connection terminals 600 are positioned on nearly the same plane as the first face of the lowermost layer resin insulating layer.

Next, as illustrated in FIG. 9F, through holes reaching the first external connection terminals 600 (600P, 600G, 600S) are formed in the first lower resin insulating layer 400d. As illustrated in FIG. 9G, the first conductor patterns 610 (the first conductor patterns for power supply 610P, the first conductor patterns for ground 610G, the first conductor patterns for signal 610S) are then formed with the semi-additive process on the upper face of the first lower resin insulating layer 400d (the opposite face from the face on which the external terminals are formed). Concurrently, the first via conductors 611 (the first via conductors for power supply 611P, the first via conductors for ground 611G, the first via conductors for signal 611S) are formed connecting the first external connection terminals 600 (600P, 600G, 600S) and the first conductor patterns 610 (610P, 610G, 610S). At that time, the second alignment mark 622 is concurrently formed. The first via conductors for power supply 611P connect the external terminals for power supply 600P on the first face side (the first external terminals for power supply) and the first conductor patterns for power supply 610P. The first via conductors for ground 611G (the first external terminals for ground) connect the external terminals for ground 600G on the first face side and the first conductor patterns for ground 610G. The first via conductors for signal 611S (the first external terminals for signal) connect the external terminals for signal 600S on the first face side and the first conductor patterns for signal 610S.

Next, as illustrated in FIG. 9H, on the first conductor patterns 610 (610P, 610G, 610S) and the first lower resin insulating layer 400d there is formed a resin insulating layer having the first face and the second face being on an opposite side from the first face (the first resin insulating layer 400a). For the formation of the first resin insulating layer 400a, two sheets of ABF-45SH made by Ajinomoto Co., Inc., are overlapped and can be laminated.

As illustrated in FIG. 9I, the laminated capacitor 450 is laminated on the first resin insulating layer 400a such that the individual capacitors are aligned. The lamination position of the laminated capacitor 450 can be determined using the second alignment mark 622 formed on the first resin insulating layer 400a and the alignment mark 720 of the laminated capacitor 450, for example. In addition, the laminated capacitor 450 can be formed by the manufacturing method which is the same as that of the embodiment relating to FIG. 1.

Next, as illustrated in FIG. 9J, the laminated capacitor 450 is embedded on the second face side of the first resin insulating layer 400a. The surface of the first electrode of the capacitor 350a and the second face of the first resin insulating layer are disposed on nearly the same plane. The method of embedding the laminated capacitor 450 is the same as the method described with respect to FIG. 2G.

Next, as illustrated in FIG. 9K, through holes are formed. As illustrated in FIG. 9L, via conductors (the second via conductors) 651 (the second via conductors for power supply 651P, the second via conductors for ground 651G, the second via conductors for signal 651S) are then formed. And, the second conductor patterns 650 (the second conductor patterns for power supply 650P, the second conductor patterns for ground 650G, and the second conductor patterns for signal 650S) are formed.

The second via conductors for power supply 651P connect one first electrode to another of the first electrodes 310 of each of the capacitors 350a, 350b, 350c of the laminated capacitor 450. Further, the via conductors 651P connect the second conductor patterns for power supply 650P and the first conductor patterns for ground 610P. The second via conductors for ground 651G connect the second electrodes 320 of each of the capacitors 350a, 350b, 350c of the laminated capacitor 450 to each other. Further, the via conductors 651G connect the second conductor patterns for ground 650G and the first conductor patterns for ground 610G. The via conductors for signal 651S connect the second conductor patterns for signal 650S and the first conductor patterns for signal 610S.

By way of the first conductors for power supply 611P, the conductor patterns 610P, and the via conductors 651P, the first electrodes 310 of each of the capacitors 350a, 350b, 350c and the first external terminals 600P are electrically connected. And, by way of the first via conductors for ground 611G, the conductor patterns 610G, and the via conductors 651G, the second electrodes 320 of each of the capacitors 350a, 350b, 350c and the second external terminals 600G are electrically connected.

Next, as illustrated in FIG. 9M, on the second conductor patterns 650 (650P, 650G, 650S) and the first resin insulating layer 400a there is formed the resin film (the second resin insulating layer) 400b. As illustrated in FIG. 9N, in the second resin insulating layer (the uppermost layer resin insulating layer) 400b there are formed through holes. As illustrated in FIG. 9O, on the second resin insulating layer there are formed the third conductor patterns 660 (the third conductor patterns for power supply 660P, the third conductor patterns for ground 660G, the third conductor patterns for signal 660S). Concurrently, the third via conductors 661 (the third via conductors for power supply 661P, the third via conductors for ground 661G, the third via conductors for signal 661S) connecting the second conductor patterns 650 (650P, 650G, 650S) and the third conductor patterns 660 (660P, 660G, 660S) are formed.

The third via conductors for power supply 661P connect the third conductor patterns for power supply 660P and the second conductor patterns for power supply 650P. The third via conductors for ground 661G connect the third conductor patterns for ground 660G and the second conductor patterns for ground 650G. The third via conductors for signal 661S connect the second conductor patterns for signal 650S and the third conductor patterns for signal 660S. These connections can be formed with the semi-additive process, for example.

Next, as illustrated in FIG. 9P, on the second resin insulating layer 400b and the third conductor patterns 660 (660P, 660G, 660S) there is formed the solder resist 700. As illustrated in FIG. 9Q, there are provided a plurality of opening portions in the solder resist 700. Those opening portions partially open up the third conductor patterns 660 (660P, 660G, 660S). The portions of the third conductor patterns 660 (660P, 660G, 660S) exposed by the opening portions constitute the second external connection terminals 670 (670P, 670G, 670S). The second external connection terminals are formed on the second resin insluting layer (the uppermost layer resin insulating layer) 400b, comprising the second external connection terminals for power supply (the third external terminals) 670P, the second external connection terminals for ground (the fourth external terminals) 670G, and the second external connection terminals for signal 670P.

Next, on the second external connection terminals 670 (670P, 670G, 670S) plating is performed in the order of the nickel-plated film 912, the palladium-plated film 914, and the gold-plated film 911 to form a metal film comprising three layers. The metal film may be of one layer of a gold-plated layer and of two layers of a nickel-plated layer and a gold-plated layer on the nickel-plated layer.

Next, as illustrated in FIG. 9R, the support board 150 is etch-removed with a cupric chloride etching solution. At that time, the support board 150 can be removed without the external connection terminals being etch-removed on account of metal films being formed on the second external connection terminals 670 (670P, 670G, 670S) and the first external connection terminals 600 (600P, 600G, 600S). The removal of the support board 150 exposes the external terminal faces (the exposed portions of the metal films) of the first external connection terminals.

Subsequently, the wiring substrate 900 illustrated in FIG. 8 is obtained by the second solder bumps being formed on the external terminal faces (the exposed portions of the metal films) of the second external connection terminals 670 (670P, 670G, 670S) and by the first solder bumps being formed on the external terminal faces of the first external connection terminals 600 (600P, 600G, 600S).

In addition, an electronic device such as an IC ship may be loaded via the first solder bumps. It may be connected to another substrate (a motherboard) via the second solder bumps. And, while in FIG. 8 solder bumps are formed on the external terminal faces of the first external connection terminals and on the external terminal faces of the second external connection terminals, it may be that the solder bumps on the outer terminal faces of the second external connection terminals and conductive pins are loaded (mounted) on the external terminal faces of the first external connection terminals via soldering. While the IC chip may be loaded on the upper face side or the lower face side of the wiring board, it is preferred that the IC chip be loaded on the surface of the substrate with a built-in capacitor on the side where the distance between the external terminals and the capacitor is short (the distance in the sectional direction of the substrate).

In the present embodiment, while the resin insulating layer (the resin film) is of three layers, it is possible for it to be multi-layered with four layers or more by repeating the steps of FIG. 9M through FIG. 9O. Further, it is possible to form on the lower face of the first resin insulating layer a solder resist having opening portions allowing the first external connection terminals 600 (600P, 600G, 600S) to be exposed.

The wiring substrate 900 illustrated in FIG. 10 is, unlike the wiring substrate 900 illustrated in FIG. 8, an example wherein the first external connection terminals and the laminated capacitor are embedded in the same resin insulating layer. The wiring substrate 900 illustrated in FIG. 10 is of the two-layer structure with the first resin insulating layer having the first face and the second face being on the opposite side from the first face (the lowermost layer resin insulating layer) 400a and the second resin insulating layer having the first face and the second face being on the opposite side from the first face (the uppermost layer resin insulating layer) 400b. In the second face side of the first resin insulating layer 400a there is embedded the laminated capacitor 450. The surface of the first electrode of the capacitor 350a and the second face of the lowermost layer resin insulating layer are disposed on nearly the same plane. Alternately, on the first face side (the first surface of the wiring board 900) of the first resin insulating layer 400a there are embedded the first external connection terminals. The surfaces of the first external terminals and the first face of the lowermost layer resin insulating layer are disposed on nearly the same plane. On the second face of the lowermost layer resin insulating layer there is laminated the first face of the uppermost layer resin insulating layer. On the second face of the second resin insulating layer 400b there are formed the second external connection terminals 670 comprising the second external connection terminals for power supply (the third external terminals) 670P, the second external connection terminals for ground (the fourth external terminals) 670G, and the second external connection terminals for signal 670P. And, in the second resin insulating layer 400b there are formed via conductors.

The method of manufacturing the wiring board 900 illustrated in FIG. 10 first undertakes the steps illustrated in FIG. 9A through FIG. 9E. Subsequently, it undertakes the steps illustrated in FIG. 9I through FIG. 9R, the plating resist 160 being removed and the first solder bumps being formed on the first external connection terminals 600 (600P, 600G, 600S) to obtain the wiring substrate 900 illustrated in FIG. 10.

In addition, the printed wiring board in accordance with the above embodiment may, as with the embodiment of FIG. 8, have a laminated capacitor built in wherein the capacitors wherein the first electrodes and the second electrodes not being offset in the direction of the face are laminated with an adhesive.

The wiring board 900 relating to another embodiment in accordance with the present invention is such, unlike the wiring board 900 relating to the embodiment of FIG. 1, that there are provided the resin insulating layer 200a on and the lower resin insulating layer 270d underneath the base substrate 100. And, in the resin insulating layer 200a there is embedded the laminated capacitor 450a, and in the lower resin insulating layer 270d there is embedded the laminated capacitor 450b. This arrangement allows not only a reduction in noise on the base substrate 100 but also a reduction in noise also underneath the base substrate 100 to be effectively worked out.

As to the method of manufacturing this wiring substrate, it is possible, following FIG. 2Q, for example, for the lower resin insulating layer 270s to be provided on the lower face of the base substrate 100 and that the laminated capacitor 4450b is embedded in that lower resin insulating layer 270a such that it is formed.

In the above-described embodiments the laminated capacitor 450 was formed such that three capacitors 350a, 350b, 350c were laminated. Naturally the invention is not limited to this. The laminated capacitor 450 can be such that two or four to thirty or more capacitors, for example, are laminated with the adhesive 340 interposed therebetween.

In the above-described embodiments, the dielectric layer 330 was formed of barium titanate (BaTiO$_3$). Naturally, the invention is not limited to this. It is possible to use for the dielectric layer 330 any or a mixture of strontium titanate (SrTiO$_3$), tantalum oxide (TaO$_3$, Ta2O$_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT).

In the above-described embodiments, strontium titanate (SrTiO$_3$) was used as a dielectric filler. Naturally, it is not limited to this. For a dielectric filler, it is possible to use, for example, calcium titanate (CaTiO$_3$), magnesium titanate (Mg$_2$TiO$_3$), neodymium titanate (Nd$_2$Ti$_3$O$_7$), etc.

And, in the above-described embodiments, epoxy resins were used for resins constituting resin insulating layers (resin films). Naturally, the invention is not limited to this. For a resin constituting a resin insulating layer, polyimide, polycarbonate, denatured polyphenylene ether, polyphenylene oxide, polybutylene terephthalate, polyacrylate, polysulfone, polyphenylenesulfide, polyetheretherketone, polysalfone, polyethersalfone, polyphenysalfone, polyphthalamide, polyamideimide, polyketone, polyacetal, etc., for example, alone or a combination thereof with an epoxy resin may be used.

And, in the above-described embodiments, copper was used as a metal constituting the first electrode 310 and the second electrode 320. Naturally, the invention is not limited to this. As a metal constituting the first electrode 310 and the second electrode 320, platinum, gold, nickel, tin, silver, etc., for example, alone or a mixture thereof may be used. Further, it is possible to use a different kind of metal for the first electrode 310 and the second electrode 320 each.

And, in the above-described embodiments, a capacitor was formed such that on the first electrode 310 made of copper there was printed a high dielectric material which was baked to form a dielectric layer 330 and subsequently that a metal layer made of copper was formed on the dielectric layer 330 with the use of a vacuum evaporation apparatus such as sputtering, etc. Naturally, this is not limited to this.

Namely, the invention is possible to make a capacitor with the following steps. First, diethoxy barium and titanium bitetraisopropoxide are dissolved in a mixture solvent of dehydrated methanol and 2-methoxy ethanol, which is stirred for three days under nitrogen atmosphere at room temperature to adjust a alkoxide precursor composition solution of barium and titanium. Next, this precursor composition solution being stirred while being maintained at 0° C., water which has in advance been decarboxylated is sprayed under a nitrogen flow at the rate of 0.5 microliter/minute for hydrolysis. The sol gel solution prepared as such is passed through a filter such that a precipitate, etc., are filtered. The filtrate obtained is spin-coated onto the first electrode 310 made of copper being 12 μm in thickness. Subsequently, it is inserted into an electric furnace maintained at 850° C. and baked to obtain the dielectric layer 330. And, a copper layer is formed on the dielectric layer with the use of a vacuum evaporation apparatus such as sputtering, etc., and, further, copper is added onto this copper layer by about 10 μm by electroplating, etc., to obtain the second electrode 320.

To achieve the above-described objectives, a wiring substrate relating to the first viewpoint in accordance with the present invention includes a laminated capacitor formed by laminating capacitors via an adhesive, the capacitor being formed of a dielectric layer and the first electrode and the second electrode sandwiching the above-described dielectric layer and mutually facing each other. Also included is first resin insulating layer with the above-described laminated capacitor built therein, first via conductors electrically connecting the above-described first electrodes mutually, and second via conductors electrically connecting the above-described second electrodes mutually. First external terminals electrically connect with the above-described first via conductors, and second external terminals electrically connect with the above-described second via conductors.

To achieve the above-described objectives, the wiring substrate relating to a second viewpoint in accordance with the present invention includes a plurality of resin insulating layers having at least the lowermost layer resin insulating layer and the uppermost layer resin insulating layer. A plurality of conductor circuits are formed in between the above-described resin insulating layers, and a laminated capacitor is embedded in one of the above-described plurality of resin insulating layers and formed by laminating capacitors via an adhesive. The capacitor is formed of a dielectric layer, with the first electrode and the second electrode sandwiching the above-described dielectric layer and mutually facing each other. First via conductors electrically mutually connect the above-described first electrodes, and second via conductors electrically mutually connect the above-described second electrodes. First external connection terminals are formed in the above-described lowermost layer resin insulating layer and include the first external terminals electrically connecting with the above-described first via conductors and the second external terminals electrically connecting with the above-described second via conductors. Second external connection terminals are formed on the above-described uppermost layer resin insulating layer and include the third external terminals electrically connecting with the above-described first via conductors and the fourth external terminals electrically connecting with the above-described second via conductors. The above-described first external connection terminals are embedded in the above-described lowermost layer resin insulating layer and concurrently the external terminal faces of the above-described first external connection terminals being positioned on nearly the same plane as the first face of the above-described lowermost layer resin insulating layer, and the above-described second external connection terminals are formed on the above-described uppermost layer resin insulating layer.

To achieve the above-described objectives, a method of manufacturing a wiring substrate relating to a third viewpoint in accordance with the present invention includes forming capacitors having a dielectric layer and the first electrode and the second electrode mutually opposing with the above-described dielectric layer being sandwiched therebetween, and forming a laminated capacitor by laminating the above-described capacitors via an adhesive. Also included is laminating the first resin insulating layer on a base substrate, embedding the above-described laminated capacitor in the above-described first resin insulating layer, and forming in the above-described laminated capacitor, through holes penetrating the above-described first electrodes and through holes penetrating the second electrodes. Also included is forming first via conductors electrically mutually connecting the above-described first electrodes and the second via conductors electronically mutually connecting the above-described second electrodes by filling the above-described through holes with metal conductors, and forming the first external terminals electrically connected to the above-described first via conductors and the second external terminals electrically connected to the above-described second via conductors.

To achieve the above-described objectives, a method of manufacturing a wiring substrate relating to a fourth viewpoint in accordance with the present invention includes forming capacitors having a dielectric layer and the first electrode and the second electrode sandwiching the above-described dielectric layer and mutually facing each other. Also included is forming a laminated capacitor by laminating the above-described capacitors via an adhesive, forming on a support board the first external connection terminals having the first external terminals and the second external terminals, and alternately laminating on the above-described first external connection terminals and on the support board a plurality of resin insulating layers and a plurality of conductor circuits. The above-described laminated capacitor is embedded in one resin insulating layer of the above-described plurality of resin insulating layers, through holes penetrating the above-described first electrodes or the above-described second electrodes are formed in the above-described laminated capacitor. First via conductors are formed electrically mutually connecting the above-described first electrodes and second via conductors are formed electronically mutually connecting the above-described second electrodes by filling the above-described through holes with metal conductors. The second external connection terminals are formed having third external terminals and fourth external terminals on the uppermost layer resin insulting layer positioned, of the above-described plurality of resin insulating layers, on the opposite side from the above-described support board. The above-described support board, is removed, the above-described first external terminals and the above-described third external terminals being electrically connected to the above-described first via conductors and the above-described second external terminals and the above-described fourth external terminals being electrically connected to the above-described second via conductors.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate comprising:
a base substrate;
a first resin insulating layer provided on the base substrate;
a laminated capacitor formed within the first resin insulating layer, the laminated capacitor comprising a plurality of capacitors laminated to each other by adhesive, each capacitor including a first electrode, a second electrode opposing the first electrode and a dielectric layer interposed between the first and second electrodes;
a first via conductor electrically connecting the first electrodes of the plurality of capacitors to each other;
a second via conductor electrically connecting the second electrodes of the plurality of capacitors to each other;
a first external terminal electrically connected to the first via conductor;
a second external terminal electrically connected to the second via conductor
a plurality of conductor patterns provided on the base substrate; and
a plurality of conductor patterns provided on the first resin insulating layer, wherein
an end face of the laminated capacitor is substantially coplanar with an end face of the first resin insulating layer,
the first via conductor electrically connects one of the conductor patterns on the base substrate with a respective one of the conductor patterns on the first resin insulating layer,
the second via conductor electrically connects another one of the conductor patterns on the base substrate with another respective one of the conductor patterns on the first resin insulating layer, and
a conductor pattern on the first resin insulating layer and the first electrode of the capacitor at an end face of the laminated capacitor are integrated so as to form an integral electrode.

2. The wiring substrate of claim 1, wherein:
the first electrode and second electrode are offset from each other,
the first via conductor penetrates end portions of the first electrodes such that the first via conductor electrically connects the first electrodes, and
the second via conductor penetrates end portions of the second electrodes such that the second via conductor electrically connects the second electrodes.

3. The wiring substrate of claim 1, further comprising a second resin insulating layer provided on the first resin insulating layer.

4. The wiring substrate of claim 3, further comprising:
a plurality of conductor patterns provided on the base substrate; and
a plurality of conductor patterns provided on the second resin insulating layer, wherein the first via conductor electrically connects one of the conductor patterns on the base substrate with a respective one of the conductor patterns on the second resin insulating layer, and the second via conductor electrically connects another one of the conductor patterns on the base substrate with another respective one of the conductor patterns on the second resin insulating layer.

5. The wiring substrate of claim 3, further comprising a third resin insulating layer provided on the second resin insulating layer.

6. The wiring substrate of claim 5, further comprising:
a plurality of conductor patterns provided on the second resin insulating layer; and a plurality of conductor patterns provided on the third resin insulating layer.

7. The wiring substrate of claim 6, further comprising a third via conductor electrically connecting one of the conductor patterns on the second resin insulating layer with a respective one of the conductor patterns on the third resin insulating layer.

8. The wiring substrate as set forth in claim 1, wherein:
each of the first electrodes comprises a first opening portion,
each of the second electrodes comprises a second opening portion,
the first via conductor electrically connects the first electrodes while passing through the second opening portions without being in contact with the second electrodes; and
the second via conductor electrically connects the second electrodes while passing through the first opening portions without being in contact with the first electrodes.

9. The wiring substrate of claim 1, wherein the adhesive comprises a resin forming the first resin insulating layer.

10. A wiring substrate comprising:
a plurality of resin insulating layers including at least a first end resin insulating layer and a second end resin insulating layer;
a plurality of conductor circuits interposed between the end resin insulating layers;
a laminated capacitor embedded in one of the resin insulating layers, the laminated capacitor comprising a plurality of capacitors laminated to each other by adhesive, each capacitor including a first electrode, a second electrode opposing the first electrode and a dielectric layer interposed between the first and second electrodes;
a first via conductor electrically connecting the first electrodes of the plurality of capacitors to each other;
a second via conductor electrically connecting the second electrodes of the plurality of capacitors to each other;
a plurality of first external connection terminals formed on the first end resin insulating layer and comprising a first external terminal electrically connected to the first via conductor and a second external terminal electrically connected to the second via conductor; and
a plurality of second external connection terminals formed in the second end resin insulating layer and comprising a third external terminal electrically connected to the first via conductor and a fourth external terminal electrically connected to the second via conductor, wherein the first external connection terminals are formed on the first end resin insulating layer and have external terminal faces positioned on nearly the same plane as a face of the first end resin insulating layer, and the second external connection terminals are embedded in the second end resin insulating layer.

11. A method of manufacturing a wiring substrate comprising:
forming a plurality of capacitors each comprising a first electrode, a second electrode opposing the first electrode and a dielectric layer interposed between the first and second electrodes;
forming a laminated capacitor by laminating the plurality of capacitors to each other with adhesive;
laminating a first resin insulating layer on a base substrate;
embedding the laminated capacitor in the first resin insulating layer;
forming a first through hole penetrating the first electrodes of the plurality of capacitors;
forming a second through hole penetrating the second electrodes of the plurality of capacitors;
forming a first via conductor electrically connecting the first electrodes of the plurality of capacitors by filling the first through hole with metal;
forming a second via conductor electronically connecting the second electrodes of the plurality of capacitors by filling the second through hole with metal;
forming a first external terminal electrically connected to the first via conductor;
forming a second external terminal electrically connected to the second via conductor conductor;
forming an integral electrode such that a conductor pattern on the first resin insulating layer and a first electrode of an end face capacitor of the laminated capacitor are integrated with each other, wherein
the embedding the laminated capacitor comprises embedding the laminated capacitor in the first resin insulating layer such that a first end face of the laminated capacitor and a first end face of the first resin insulating layer sit at a same level,
the forming a first via-conductor comprises providing the first via conductor electrically connecting a conductor pattern on the base substrate to a conductor pattern on the first resin insulating layer, and
the forming a second via-conductor comprises providing the second via conductor electrically connecting another conductor pattern on the base substrate to another conductor pattern on the first resin insulating layer.

12. The method of claim 11, wherein:
the forming a laminated capacitor comprises, for each of the plurality of capacitors, positioning the first electrode and second electrode offset from each other;
the forming a first through hole comprises providing the first through hole penetrating end portions of the first electrodes of the plurality of capacitors; and
said forming a second through hole comprises providing the second through hole penetrating end portions of the second electrodes of the plurality of capacitors.

13. The method of claim 11 further comprising, following the step of embedding, laminating the second resin insulating layer on the first resin insulating layer.

14. The method of claim 13, wherein:
the forming a first through hole comprises forming the first through hole penetrating the second insulating layer;
the forming a second through hole comprises forming the second through hole penetrating the second insulating layer;
the forming a first via-conductor comprises providing the first via conductor electrically connecting a conductor pattern on the base substrate to a respective conductor pattern on the second resin insulating layer; and
the forming a second via-conductor comprises providing the second via conductor electrically connecting another conductor pattern on the base substrate to another respective conductor pattern on the second resin insulating layer.

15. The method of claim 13, further comprising:
following the forming of the first and second via-conductors, forming a third resin insulating layer on the second resin insulating layer; and
forming a third via conductor electrically connecting a conductor pattern on the second resin insulating layer with a respective conductor pattern on the third resin insulating layer.

16. The method of claim 11, wherein:
- the forming a laminated-capacitor comprises providing a first opening portion in each of the plurality of first electrodes and providing a second opening portion in each of the plurality of second electrodes; and
- the forming a through hole comprises providing the first through hole penetrating the first electrodes while penetrating the second openings without being in contact with the second electrodes, and providing the second through hole penetrating the second electrodes while penetrating the first openings without being in contact with the first electrodes.

17. The method of claim 11, wherein the adhesive comprises a resin forming the first resin insulating layer.

18. A method of manufacturing a wiring substrate comprising:
- forming a plurality of capacitors each having a first electrode, a second electrode opposing the first electrode and a dielectric layer interposed between the first and second electrodes;
- forming a laminated capacitor by laminating the plurality of the capacitors with adhesive;
- forming a plurality of first external connection terminals on a support board, the first external connection terminals including a first external terminal and a second external terminal;
- alternately laminating on the first external connection terminals and on the support board a plurality of resin insulating layers and a plurality of conductor circuits;
- embedding the laminated capacitor in one of the plurality of resin insulating layers;
- forming a first through hole penetrating the first electrodes of the plurality of capacitors;
- forming a second through hole penetrating the second electrodes of the plurality of capacitors;
- forming a first via conductor electrically connecting the first electrodes by filling the first through hole with metal;
- forming a second via conductor electrically connecting the second electrodes by filling the second through hole with metal;
- forming a plurality of second external connection terminals including a third external terminal and a fourth external terminal on a first end resin insulting layer of the plurality of resin insulating layers and positioned on an opposite side from the support board; and
- removing the support board, wherein the first external terminal and the third external terminal are electrically connected to the first via conductor, and the second external terminal and the fourth external terminal are electrically connected to the second via conductor.

* * * * *